United States Patent
Obonai et al.

(10) Patent No.: US 10,205,008 B2
(45) Date of Patent: Feb. 12, 2019

(54) MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventors: Toshimitsu Obonai, Shimotsuke (JP); Hironobu Takahashi, Oyama (JP); Yasuharu Hosaka, Tochigi (JP); Masahiro Watanabe, Atsugi (JP); Takuya Handa, Moka (JP); Yukinori Shima, Tatebayashi (JP); Takashi Hamochi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/664,353

(22) Filed: Jul. 31, 2017

(65) Prior Publication Data

US 2018/0040722 A1    Feb. 8, 2018

(30) Foreign Application Priority Data

Aug. 3, 2016 (JP) .................... 2016-152814
Aug. 19, 2016 (JP) .................... 2016-161213
Nov. 30, 2016 (JP) .................... 2016-233419

(51) Int. Cl.
*H01L 29/786*    (2006.01)
*H01L 21/336*    (2006.01)
(Continued)

(52) U.S. Cl.
CPC .. *H01L 29/66969* (2013.01); *H01L 21/02359* (2013.01); *H01L 21/02554* (2013.01);
(Continued)

(58) Field of Classification Search
CPC ................. H01L 29/24; H01L 29/4908; H01L 29/66969; H01L 29/7869; H01L 29/78606;
(Continued)

(56) References Cited

U.S. PATENT DOCUMENTS 7,297,977 B2 * 11/2007 Hoffman ............. H01L 29/7869
                                                                257/43
7,674,650 B2    3/2010 Akimoto et al.
(Continued)

FOREIGN PATENT DOCUMENTS

JP    2006-165528 A    6/2006
JP    2007-096055 A    4/2007
WO    WO-2009/084537    7/2009

*Primary Examiner* — Eric Ward
(74) *Attorney, Agent, or Firm* — Robinson Intellectual Property Law Office; Eric J. Robinson

(57) ABSTRACT

Provided is a semiconductor device with favorable electrical characteristics. Provided is a semiconductor device with stable electrical characteristics. Provided is a manufacturing method of a semiconductor device with a high yield. The manufacturing method includes a first step of forming an insulating film over a substrate, a second step of transferring the substrate in an atmospheric atmosphere, a third step of heating the insulating film, and a fourth step of forming a metal oxide film. The third step and the fourth step are successively performed in an atmosphere where water vapor partial pressure is lower than water vapor partial pressure in the atmospheric air.

20 Claims, 41 Drawing Sheets

(51) Int. Cl.
  *H01L 29/66* (2006.01)
  *H01L 21/02* (2006.01)
  *H01L 21/67* (2006.01)

(52) U.S. Cl.
  CPC .... *H01L 21/02631* (2013.01); *H01L 29/7869* (2013.01); *H01L 29/78648* (2013.01); *H01L 21/6719* (2013.01)

(58) Field of Classification Search
  CPC .......... H01L 29/78696; H01L 27/1225; H01L 21/02554; H01L 21/02565; H01L 21/02631
  See application file for complete search history.

(56) References Cited

U.S. PATENT DOCUMENTS

| | | | |
|---|---|---|---|
| 8,148,245 B2 | 4/2012 | Ikisawa et al. | |
| 8,445,903 B2 | 5/2013 | Inoue et al. | |
| 8,748,879 B2 | 6/2014 | Yano et al. | |
| 8,785,240 B2 | 7/2014 | Watanabe | |
| 8,993,386 B2 | 3/2015 | Ohara et al. | |
| 9,171,938 B2 | 10/2015 | Yamazaki et al. | |
| 9,530,872 B2 | 12/2016 | Yamazaki et al. | |
| 2006/0035452 A1 | 2/2006 | Carcia et al. | |
| 2009/0189153 A1* | 7/2009 | Iwasaki | H01L 29/7869 257/43 |
| 2010/0051940 A1 | 3/2010 | Yamazaki et al. | |
| 2010/0051949 A1 | 3/2010 | Yamazaki et al. | |
| 2011/0003430 A1* | 1/2011 | Yamazaki | H01L 21/67109 438/104 |
| 2011/0227060 A1 | 9/2011 | Miyanaga et al. | |
| 2012/0001167 A1* | 1/2012 | Morosawa | H01L 29/7869 257/43 |
| 2012/0298998 A1* | 11/2012 | Yamazaki | H01L 21/02554 257/57 |
| 2012/0300151 A1* | 11/2012 | Yamazaki | H01L 27/1225 349/43 |
| 2013/0137255 A1* | 5/2013 | Yamade | H01L 21/265 438/530 |
| 2013/0196468 A1* | 8/2013 | Yamazaki | H01L 29/66742 438/104 |
| 2014/0367682 A1 | 12/2014 | Yamazaki et al. | |
| 2015/0064840 A1* | 3/2015 | Shimomura | H01L 21/02565 438/104 |

\* cited by examiner

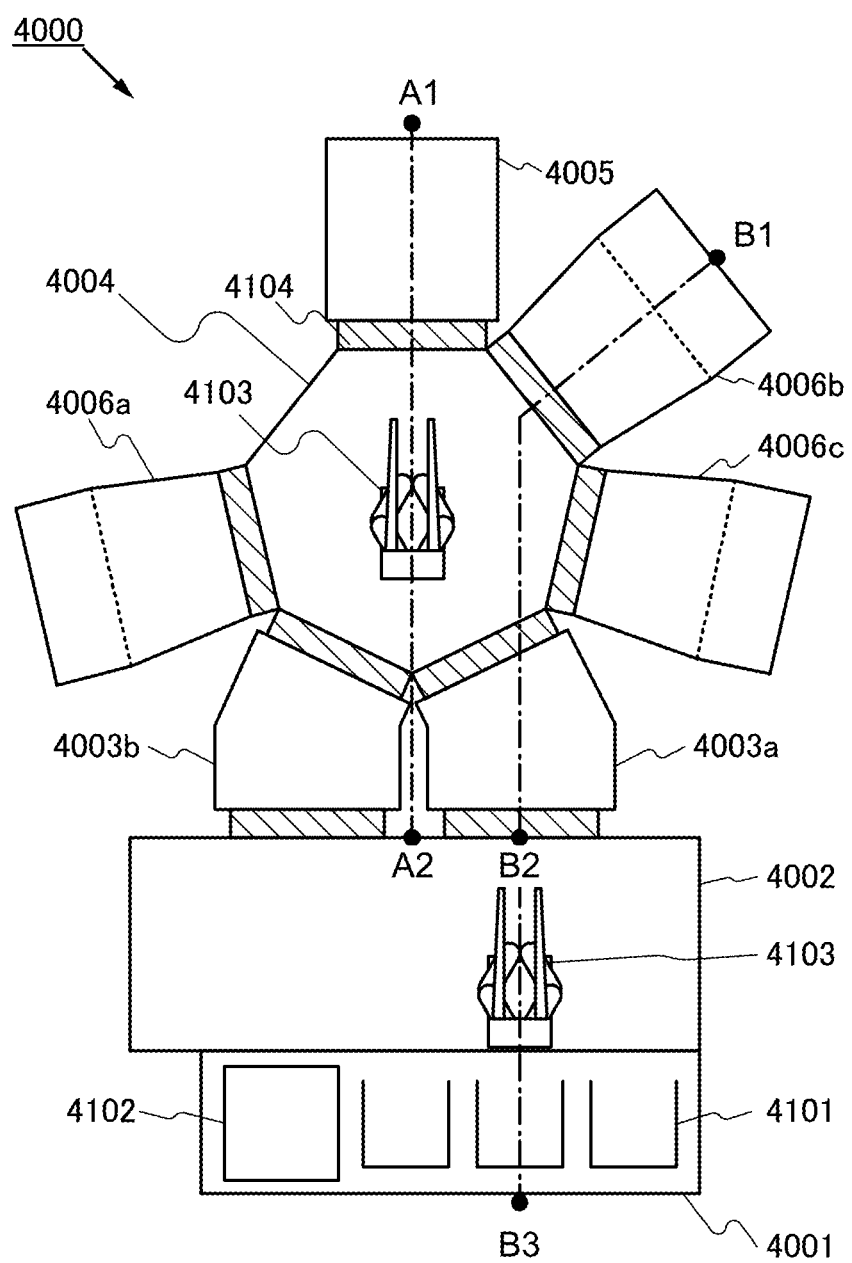

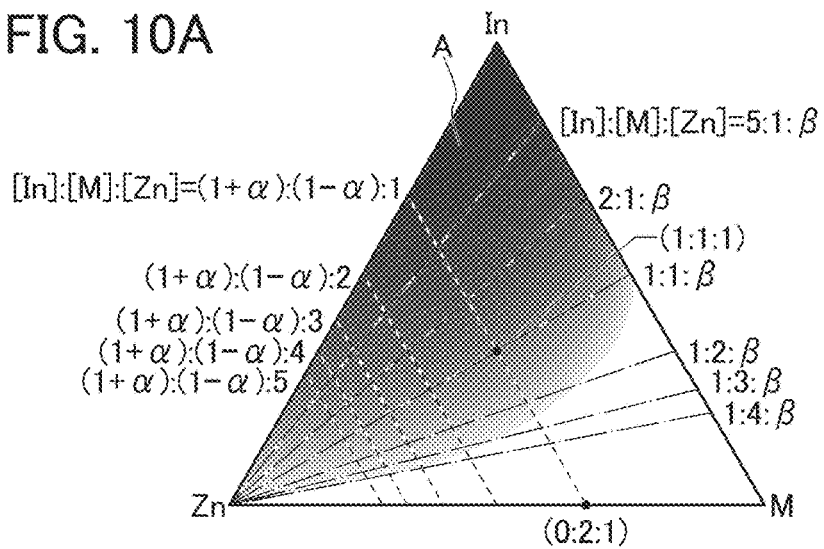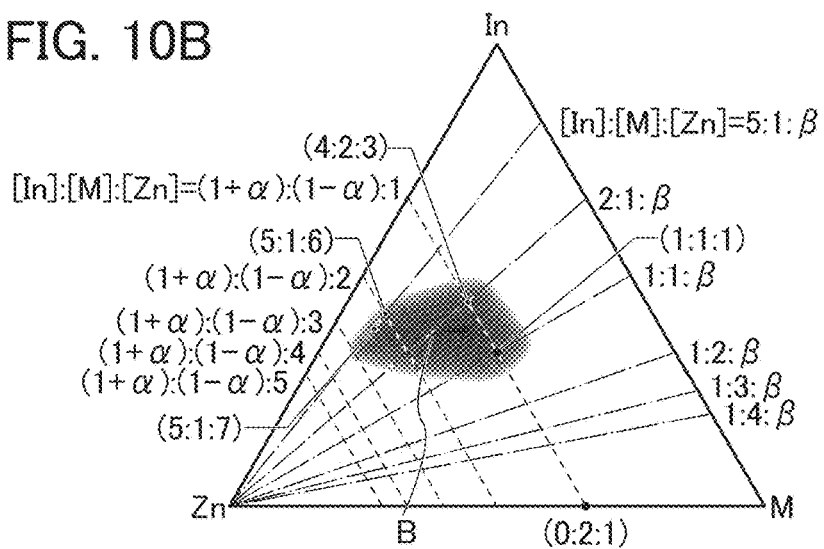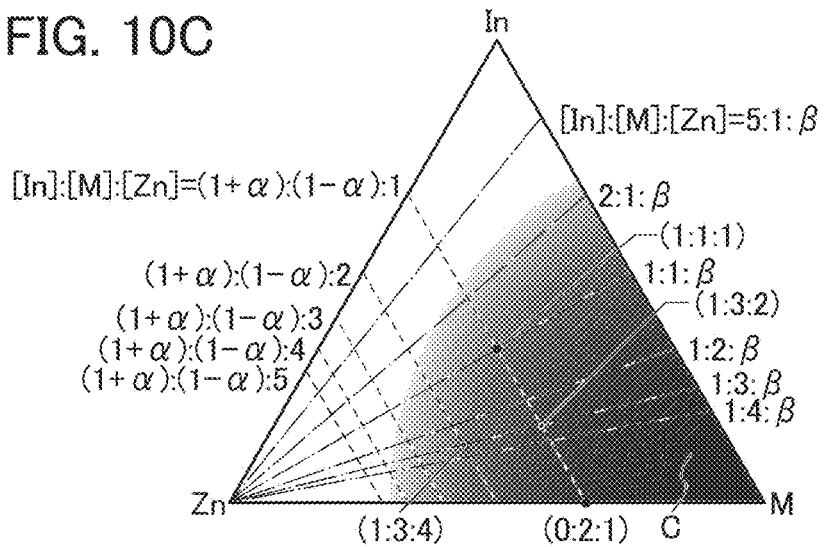

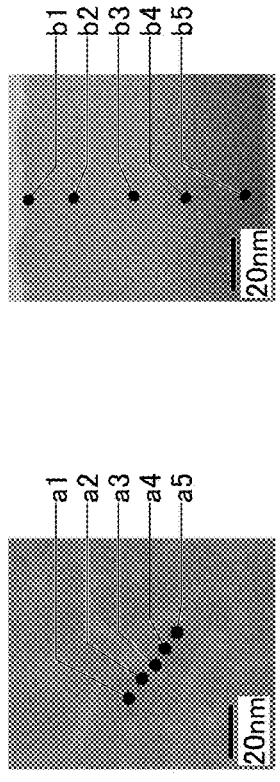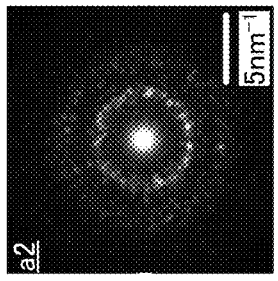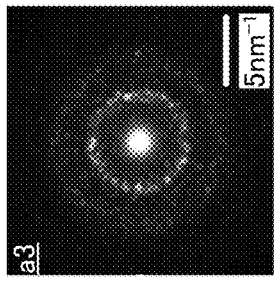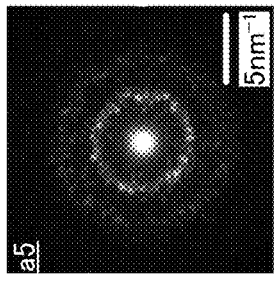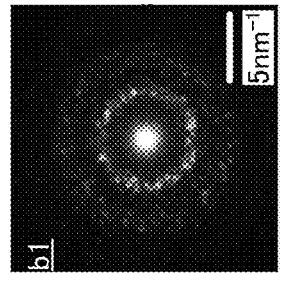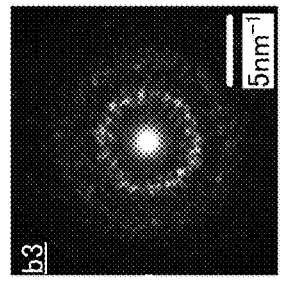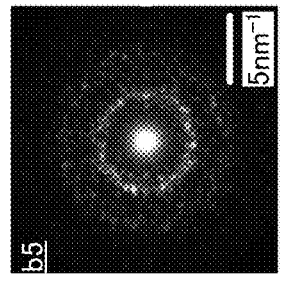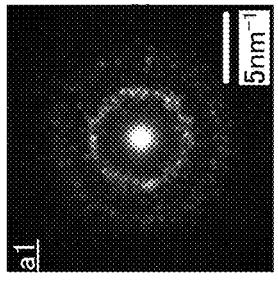

FIG. 27

|  | without baking before deposition | baking before deposition 350°C 5min | baking before deposition 350°C 60min | baking before deposition 450°C 5min |
|---|---|---|---|---|
| standby time | about 2weeks ||||
| L/W =2/50 μm | | | | |
| L/W =3/50 μm | | | | |
| L/W =6/50 μm | | | | |

(a) Gate line fall time (> 75%)

(b) Source line rise time (> 95%)

(c) Pixel write time

MANUFACTURING METHOD OF SEMICONDUCTOR DEVICE

BACKGROUND OF THE INVENTION

1. Field of the Invention

One embodiment of the present invention relates to a semiconductor device including an oxide semiconductor film. Another embodiment of the present invention relates to a display device including the semiconductor device.

Note that one embodiment of the present invention is not limited to the above technical field. The technical field of one embodiment of the invention disclosed in this specification and the like relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

A metal oxide has attracted attention recently as a material used for a semiconductor layer of a transistor. For example, a transistor using an amorphous oxide semiconductor containing indium, gallium, and zinc is known (see Patent Document 1).

A metal oxide that can be used for a semiconductor layer can be formed by a sputtering method or the like, and thus can be used for a semiconductor layer of a transistor in a large display device. In addition, capital investment can be reduced because part of production equipment for a transistor including amorphous silicon can be retrofitted and utilized. A transistor including an oxide semiconductor has high field-effect mobility; therefore, a high-performance display device where a display device and a driver circuit are formed over the same substrate can be obtained.

REFERENCE

Patent Document

[Patent Document 1] Japanese Published Patent Application No. 2006-165528

SUMMARY OF THE INVENTION

An object of an embodiment of the present invention is to provide a semiconductor device which has favorable electric characteristics. Another object is to provide a semiconductor device with stable electrical characteristics. Another object is to provide a semiconductor device with low power consumption. Another object is to provide a highly reliable semiconductor device. Another object is to provide a manufacturing method of a semiconductor device with high productivity. Another object is to provide a manufacturing method of a semiconductor device with a high yield.

Note that the descriptions of these objects do not disturb the existence of other objects. In one embodiment of the present invention, there is no need to achieve all of these objects. Objects other than these objects can be derived from the description of the specification and like.

One embodiment of the present invention is a manufacturing method of a semiconductor device comprising a first step of forming an insulating film over a substrate, a second step of transferring the substrate in an atmospheric atmosphere, a third step of heating the insulating film, and a fourth step of forming a metal oxide film over the insulating film. The third step and the fourth step are successively performed in an atmosphere where water vapor partial pressure is lower than water vapor partial pressure in the atmospheric air.

In the manufacturing method of a semiconductor device, the third step is preferably performed at a temperature higher than or equal to 100° C. and lower than or equal to 500° C. and for a process time longer than or equal to 1 minute and shorter than or equal to 120 minutes.

In the manufacturing method of a semiconductor device, the third step is preferably performed with a pressure greater than or equal to $1\times10^{-7}$ Pa and less than or equal to $1\times10^{-3}$ Pa.

In the manufacturing method of a semiconductor device, the metal oxide film is preferably formed by a sputtering method.

In the manufacturing method of a semiconductor device, a formation temperature of the metal oxide film is preferably higher than or equal to room temperature and lower than or equal to 200° C.

In the manufacturing method of a semiconductor device, the formation temperature of the metal oxide film is preferably higher than or equal to room temperature and lower than or equal to 130° C.

In the manufacturing method of a semiconductor device, the formation temperature of the metal oxide film is preferably a temperature that is not increased by intentional heating.

In the manufacturing method of a semiconductor device, the metal oxide film is preferably formed using an In—M—Zn oxide target (the M is any one of Ga, Al, Y, and Sn). The atomic ratio of the In, the M, and the Zn is preferably 4:2:4.1 or a neighborhood of 4:2:4.1. Alternatively the atomic ratio of the In, the M, and the Zn is preferably 5:1:7 or a neighborhood of 5:1:7.

According to one embodiment of the present invention, a semiconductor device with favorable electrical characteristics can be provided. A semiconductor device with stable electrical characteristics can be provided. A semiconductor device which consumes low power can be provided. A highly reliable semiconductor device can be provided. A semiconductor device with high productivity can be provided. A manufacturing method of a semiconductor device with a high yield can be provided.

Note that one embodiment of the present invention does not necessarily achieve all the effects listed above. Other effects can be derived from the description of the specification, the drawings, the claims, and the like.

BRIEF DESCRIPTION OF THE DRAWINGS

FIG. 2 is a top view of a deposition apparatus.

FIGS. 10A to 10C each illustrate an atomic ratio range of a metal oxide of the present invention.

FIGS. 12A and 12B are TEM images of samples and FIGS. 12C to 12L are electron diffraction patterns thereof.

FIG. 27 shows Id-Vg characteristics of transistors.

DETAILED DESCRIPTION OF THE INVENTION

Figure 1:
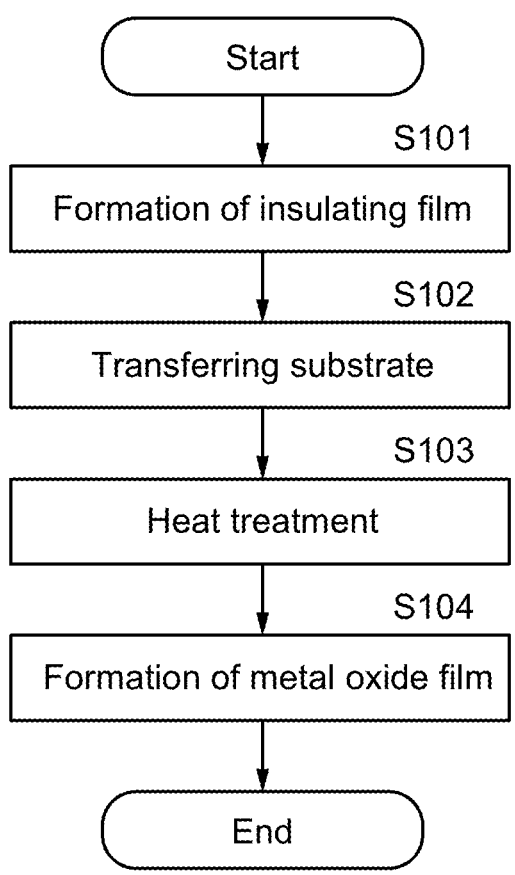
FIG. 1 is a flowchart illustrating a manufacturing method of a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 5°. The term "perpendicular" means that the angle formed between two straight lines is greater than or equal to 80° and less than or equal to 100°, and accordingly also covers the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 µm). In the latter case, the off-state current may be expressed in the unit with the dimension of current per length (e.g., A/µm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of ($I_d$=0 A) and an extrapolated straight line that is tangent with the highest inclination to a plotted curve ($V_g$-$\sqrt{I_d}$ characteristics). Alternatively, the threshold voltage of a transistor may refer to a gate voltage ($V_g$) at which the value of $I_d$ [A]×L [µm]/W [µm] is $1\times10^{-9}$ [A] where L is channel length and W is channel width.

In this specification and the like, a "semiconductor" can have characteristics of an "insulator" when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases.

In this specification and the like, a "semiconductor" can have characteristics of a "conductor" when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases.

Note that in this specification and the like, "In:Ga:Zn=4:2:3 or a neighborhood of In:Ga:Zn=4:2:3" refers to an atomic ratio where, when In is 4 with respect to the total number of atoms, Ga is greater than or equal to 1 and less than or equal to 3 (1≤Ga≤3) and Zn is greater than or equal to 2 and less than or equal to 4 (2≤Zn≤4). In addition, "In:Ga:Zn=5:1:6 or a neighborhood of In:Ga:Zn=5:1:6" refers to an atomic ratio where, when In is 5 with respect to the total number of atoms, Ga is greater than 0.1 and less than or equal to 2 (0.1<Ga≤2) and Zn is greater than or equal to 5 and less than or equal to 7 (5≤Zn≤7). In addition, "In:Ga:Zn=1:1:1 or a neighborhood of In:Ga:Zn=1:1:1" refers to an atomic ratio where, when In is 1 with respect to the total number of atoms, Ga is greater than 0.1 and less than or equal to 2 (0.1<Ga≤2) and Zn is greater than 0.1 and less than or equal to 2 (0.1<Zn≤2).

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, CAC-OS or CAC-metal oxide can be called a matrix composite or a metal matrix composite.

An example of a crystal structure of a metal oxide is described. Note that a metal oxide deposited by a sputtering method using an In—Ga—Zn oxide target (In:Ga:Zn=4:2:4.1 in an atomic ratio) is described below as an example. A metal oxide formed by a sputtering method using the above-mentioned target at a substrate temperature of higher than or equal to 100° C. and lower than or equal to 130° C. is referred to as sIGZO. A metal oxide formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally.

Embodiment 1

In this embodiment, a manufacturing method of a semiconductor device according to one embodiment of the present invention is described.

One embodiment of the present invention is a manufacturing method of a semiconductor device including a first step of forming an insulating film over a substrate, a second step of transferring the substrate in an atmospheric atmosphere, a third step of heating the insulating film, and a fourth step of forming a metal oxide film. The third step and the fourth step are successively performed in an atmosphere where water vapor partial pressure is lower than water vapor partial pressure in the atmospheric air.

When the metal oxide film serving as an active layer of a transistor is formed over the insulating film, impurities at the interface between the insulating film and the metal oxide film become a problem.

Attachment or entry of impurities to or into the interface between the insulating film and the metal oxide film will reduce the reliability of the semiconductor device in some cases. Therefore, the amount of impurities such as hydrogen or moisture at the interface between the insulating film and the metal oxide film is preferably as small as possible.

In view of the above, in one embodiment of the present invention, the first step of forming the insulating film over the substrate and the second step of transferring the substrate to an apparatus are performed; and then, the third step of heating the insulating film and the fourth step of forming the metal oxide film are performed in the atmosphere where water vapor partial pressure is lower than that in the atmospheric air. In addition, the third step and the fourth step are successively performed. For example, the third step and the fourth step are successively performed without exposure to the atmospheric air between these steps.

The second step can be performed in an atmospheric atmosphere, for example. In this case, hydrogen or moisture which is a component of the atmospheric air might be attached to the surface of the insulating film when the substrate is transferred. However, in one embodiment of the present invention, hydrogen or moisture attached to the surface of the insulating film can be detached in the third step of heating the insulating film in an apparatus. In addition, the metal oxide film can be formed successively after the heat treatment in the atmosphere where water vapor partial pressure is lower than that in the atmospheric air. This can prevent attachment or entry of impurities to or into the interface between the insulating film and the metal oxide film to make the interface clean. Moreover, hydrogen, moisture, and the like which might be contained in the insulating film can be removed. In addition, entry of hydrogen, moisture, and the like in the metal oxide film can be prevented.

Note that the atmosphere where water vapor partial pressure is lower than that in the atmospheric air means an atmosphere where pressure is lower than pressure at least in the atmospheric air. Specifically, the pressure in the atmosphere is set to a low vacuum or a medium vacuum (several hundreds of pascals to 0.1 pascals) or a high vacuum or an ultra-high vacuum (0.1 Pa to $1\times10^{-7}$ Pa).

The pressure in the heat treatment is preferably set to higher than or equal to $1\times10^{-7}$ Pa and lower than or equal to $1\times10^{-3}$ Pa.

In the above embodiment, the metal oxide film can be an oxide semiconductor film in which the impurity concentration is low and the density of defect states is low.

When such a metal oxide film in which the impurity concentration is low and the density of defect states is low is used for a transistor, the transistor can have excellent electrical characteristics, which is preferable. The state in which the impurity concentration is low and the density of defect states is low (including a state in which the number of oxygen vacancies is small) is referred to here as highly purified intrinsic or substantially highly purified intrinsic. Note that impurities in the metal oxide film are typically water, hydrogen, and the like. In this specification and the like, reducing or removing water and hydrogen from the metal oxide film is referred to as dehydration or dehydrogenation in some cases. Adding oxygen to the metal oxide film is referred to as oxygen addition in some cases. A state in which oxygen in excess of the stoichiometric composition is contained by the oxygen addition is referred to as an oxygen-excess state in some cases.

A highly purified intrinsic or substantially highly purified intrinsic metal oxide film has few carrier generation sources and a low carrier density. Thus, a transistor in which a channel region is formed in the metal oxide film rarely has a negative threshold voltage (is rarely normally on). The highly purified intrinsic or substantially highly purified intrinsic metal oxide film has a low density of defect states and accordingly has a low density of trap states in some cases. Furthermore, the highly purified intrinsic or substantially highly purified intrinsic metal oxide film has an extremely low off-state current; even when an element has a channel width of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

<1-1. Manufacturing Method of Semiconductor Device>

Next, a manufacturing method of the semiconductor device of one embodiment of the present invention will be described with reference to FIG. 1. Note that FIG. 1 is a flow chart showing the manufacturing method of the semiconductor device of one embodiment of the present invention.

[First Step: Formation of Insulating Film]

The first step is a step of forming the insulating film over a substrate (see Step S101 in FIG. 1).

The insulating film can be formed by a sputtering method, a CVD method, an evaporation method, a pulsed laser deposition (PLD) method, a printing method, a coating method, or the like as appropriate. The insulating film can be formed with a single layer or a stacked layer using an oxide insulating film or a nitride insulating film, for example. To improve the properties of the interface with the metal oxide film, at least a region of the insulating film in contact with the metal oxide film is preferably formed of an oxide insulating film. When the insulating film is formed using an oxide insulating film from which oxygen is released by heating, oxygen contained in the insulating film can be moved to the metal oxide film by heat treatment after the metal oxide film is formed.

The insulating film can be formed with a single layer or a stacked layer using, for example, silicon oxide, silicon oxynitride, silicon nitride oxide, silicon nitride, aluminum oxide, hafnium oxide, gallium oxide, and a Ga—Zn oxide.

[Second Step: Transferring Substrate]

The second step is a step of transferring the substrate over which the insulating film is formed into an apparatus for forming the metal oxide film (Step S102 in FIG. 1).

The substrate can be transferred in an atmospheric atmosphere or the atmosphere where water vapor partial pressure is lower than that in the atmospheric air. When the substrate is transferred in the atmospheric atmosphere, placement flexibility (layout) of the apparatus can be increased.

The step of transferring the substrate includes a standby status until the next step. In the standby status, the substrate can be stored in the atmospheric atmosphere or the atmosphere where water vapor partial pressure is lower than that in the atmospheric air. When the substrate is stored in the atmospheric atmosphere, the equipment can be simple. Particularly when the substrate is large, the substrate is stored preferably in the atmospheric atmosphere.

In the second step, moisture, hydrogen, or the like might be attached to the surface of the insulating film.

[Third Step: Heat Treatment]

The third step is a step of heating the insulating film (Step S103 in FIG. 1).

When the substrate is transferred, moisture, hydrogen, or the like might be attached to the surface of the insulating film. Thus, if the metal oxide film is formed on the insulating film in this state, a large amount of water, hydrogen, or the like is contained at the interface between the metal oxide film and the insulating film. In view of this, in the third step, heat treatment is performed in the atmosphere where water vapor partial pressure is lower than that in the atmospheric air before the metal oxide film is formed in order to remove the water and hydrogen attached to the surface of the insulating film.

The insulating film is heated at higher than a temperature at which water and hydrogen are released from the surface of the insulating film. If the heating temperature is too high, oxygen contained in the insulating film might be released and the amount of oxygen that can be supplied to the metal oxide film might be reduced.

The temperature for heating the insulating film is higher than or equal to 100° C. and lower than or equal to 500° C., preferably higher than or equal to 100° C. and lower than or equal to 450° C., further preferably higher than or equal to 200° C. and lower than or equal to 400° C. The treatment time of the step of heating the insulating film can be longer than or equal to 1 minute and shorter than or equal to 120 minutes, preferably longer than or equal to 2 minutes and shorter than or equal to 60 minutes, further preferably longer than or equal to 3 minutes and shorter than or equal to 10 minutes. Since the treatment time in the heating step affects throughput of the deposition apparatus, the practitioner can select suitable time as appropriate. When the heating temperature is high, the treatment time is preferably shorter than or equal to 10 minutes in order to suppress release of oxygen in the insulating film.

The heating of the insulating film is performed preferably in the atmosphere where water vapor partial pressure is lower than that in the atmospheric air because water and hydrogen attached to the surface of the insulating film can be effectively released. For example, the heating is preferably performed in the pressure lower than an atmospheric pressure (in a reduced pressure atmosphere). The higher the degree of vacuum is, the more efficiently water and hydrogen attached to the surface of the insulating film can be released. For example, the pressure when the substrate is inserted into a chamber for the heating treatment (i.e., the pressure immediately before or immediately after the substrate is inserted) is higher than or equal to $1 \times 10^{-7}$ Pa and lower than or equal to $1 \times 10^{-3}$ Pa, preferably higher than or equal to $1 \times 10^{-6}$ Pa and lower than or equal to $1 \times 10^{-4}$ Pa. During the heat treatment, evacuation may be performed but is not necessarily performed.

[Fourth Step: Formation of Metal Oxide Film]

The fourth step is a step of forming the metal oxide film over the insulating film (Step S104 in FIG. 1).

For example, the metal oxide film preferably contains In, M (M is Ga, Al, Y, or Sn), and Zn. The metal oxide film preferably includes a region in which the atomic proportion of In is larger than the atomic proportion of M. For example, the atomic ratio of In to M and Zn in the metal oxide film is preferably In:M:Zn=4:2:3 or a neighborhood of In:M:Zn=4:2:3, or In:M:Zn=5:1:7 or a neighborhood of In:M:Zn=5:1:7.

As a gas used to form the metal oxide film, at least one of an inert gas (typically, argon) and an oxygen gas is used.

For example, one of an argon gas and an oxygen gas is used to form the metal oxide film. Note that the proportion of the flow rate of the oxygen gas to the flow rate of a whole gas (the proportion is also referred to as an oxygen flow rate percentage) at the time of forming the metal oxide film is higher than or equal to 0% and lower than or equal to 30%, preferably higher than or equal to 5% and lower than or equal to 15%. With the oxygen flow rate percentage in the above range, the metal oxide film can have low crystallinity. Furthermore, the oxygen flow rate percentage in the above range enables the material composition of the metal oxide film to be a CAC-OS described later.

The oxygen flow rate percentage at the time of forming the metal oxide film may be higher than 30% and lower than or equal to 100%, preferably higher than or equal to 50% and lower than or equal to 100%, further preferably higher than or equal to 70% and lower than or equal to 100%. With the oxygen flow rate percentage in the above range, the metal oxide film can have high crystallinity.

The substrate temperature at the time of forming the metal oxide film is set higher than or equal to room temperature (25° C.) and lower than or equal to 200° C., preferably higher than or equal to room temperature and lower than or equal to 130° C. The substrate temperature in the above range can prevent bending or warpage of the substrate in the case where the substrate is a large glass substrate.

The metal oxide film may have a stacked-layer structure. When the compositions of a first metal oxide film and a second metal oxide film are substantially the same, they can be formed using the same sputtering target and the manufacturing cost can thus be reduced. Since the same sputtering target is used, the first metal oxide film and the second metal oxide film can be formed successively in the same deposition apparatus in vacuum. This can suppress entry of impurities into the interface between the first metal oxide film and the second metal oxide film.

Note that the third and fourth steps are successively performed in an atmosphere where the water vapor partial pressure is lower than the water vapor partial pressure in atmospheric air. The first step, the second step, the third step, and the fourth step are performed in this order.

<1-2. Structure Example of Deposition Apparatus>

A structure example of a deposition apparatus that can be used in the manufacturing method of a semiconductor device of one embodiment of the present invention is described with reference to FIG. 2 and FIGS. 3A to 3C.

With the deposition apparatus shown in FIG. 2 and FIGS. 3A to 3C, impurities (specifically, hydrogen and water) which can enter the metal oxide film and the interface between the insulating film and the metal oxide film can be reduced.

FIG. 2 is a top view schematically illustrating a single wafer multi-chamber deposition apparatus 4000. The deposition apparatus 4000 includes an atmosphere-side substrate supply chamber 4001 including a cassette port 4101 for storing substrates and an alignment port 4102 for performing alignment of substrates, an atmosphere-side substrate transfer chamber 4002 through which a substrate is transferred from the atmosphere-side substrate supply chamber 4001, a load lock chamber 4003a where a substrate is carried in and the pressure is switched from atmospheric pressure to reduced pressure or from reduced pressure to atmospheric pressure, an unload lock chamber 4003b where a substrate is carried out and the pressure is switched from reduced pressure to atmospheric pressure or from atmospheric pressure to reduced pressure, a transfer chamber 4004 where a substrate is transferred in a vacuum, a substrate heating chamber 4005 where a substrate is heated, and deposition chambers 4006a, 4006b, and 4006c in each of which a sputtering target is placed for deposition.

Note that a plurality of the cassette ports 4101 may be provided as illustrated in FIG. 2 (three cassette ports 4101 are provided in FIG. 2).

The atmosphere-side substrate transfer chamber 4002 is connected to the load lock chamber 4003a and the unload lock chamber 4003b, the load lock chamber 4003a and the unload lock chamber 4003b are connected to the transfer chamber 4004, and the transfer chamber 4004 is connected to the substrate heating chamber 4005 and the deposition chambers 4006a, 4006b, and 4006c.

Note that gate valves 4104 are provided in connecting portions between the chambers so that each chamber excluding the atmosphere-side substrate supply chamber 4001 and the atmosphere-side substrate transfer chamber 4002 can be independently kept in a vacuum state. Moreover, the atmosphere-side substrate transfer chamber 4002 and the transfer chamber 4004 each include a transfer robot 4103, with which a glass substrate can be transferred.

Further, it is preferable that the substrate heating chamber 4005 also serve as a plasma treatment chamber. In the deposition apparatus 4000, substrates can be transferred without being exposed to the air between treatments, and adsorption of impurities to substrates can be suppressed. In addition, the order of film formation, heat treatment, or the like can be freely determined. Note that the number of transfer chambers, the number of deposition chambers, the number of load lock chambers, the number of unload lock chambers, and the number of substrate heating chambers are not limited to the above, and the numbers thereof can be set as appropriate depending on the space for installation or the process conditions.

Figure 3A:
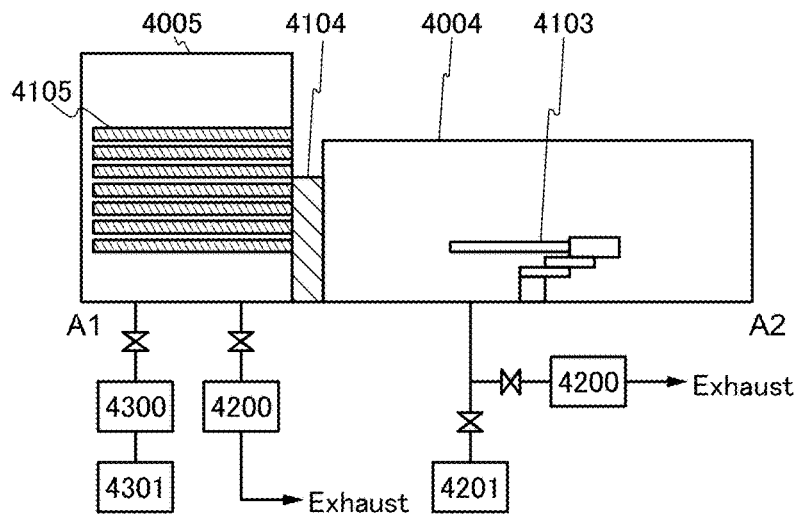
FIGS. 3A to 3C are cross-sectional views of the deposition apparatus.
Figure 3B:
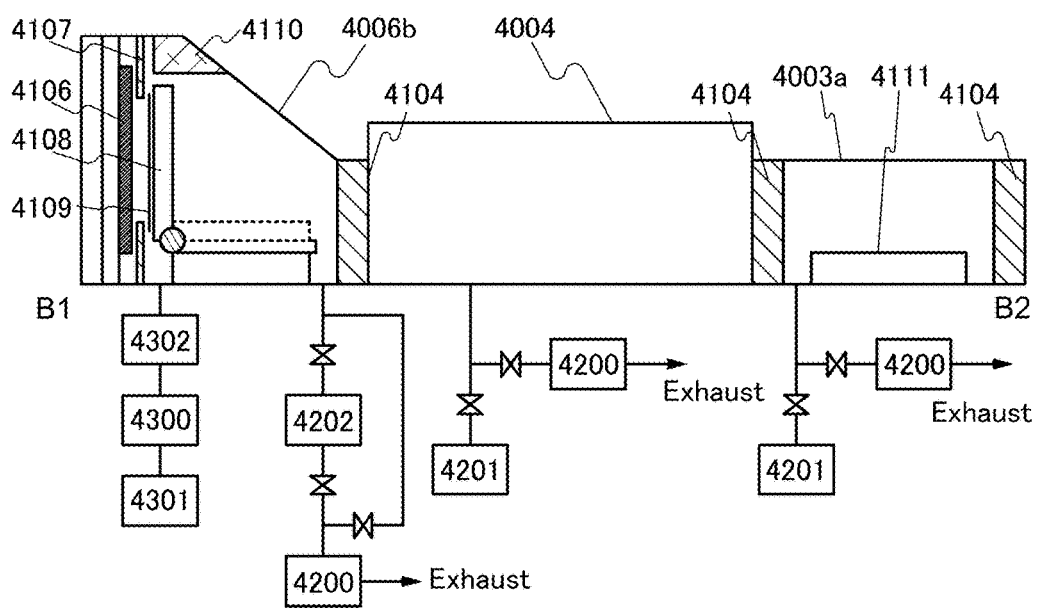
Figure 3C:
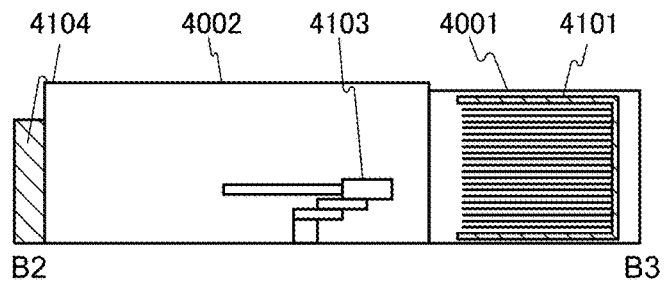

FIG. 3A, FIG. 3B, and FIG. 3C are a cross-sectional view taken along dashed-dotted line A1-A2, a cross-sectional view taken along dashed-dotted line B1-B2, and a cross-sectional view taken along dashed-dotted line B2-B3, respectively, in the deposition apparatus 4000 illustrated in FIG. 2.

FIG. 3A is a cross-sectional view of the substrate heating chamber 4005 and the transfer chamber 4004. The substrate heating chamber 4005 shown in FIG. 3A includes a plurality of heating stages 4105 which can hold a substrate.

Note that although the substrate heating chamber 4005 including the seven heating stages 4105 is illustrated in FIG. 3A, one embodiment of the present invention is not limited to such a structure. The number of heating stages 4105 may be greater than or equal to one and less than seven. Alternatively, the number of heating stages 4105 may be greater than or equal to eight. It is preferable to increase the number of the heating stages 4105 because a plurality of substrates can be subjected to heat treatment at the same time, which leads to an increase in productivity. Further, the substrate heating chamber 4005 is connected to a vacuum pump 4200 through a valve. As the vacuum pump 4200, a dry pump and a mechanical booster pump can be used, for example.

As a heating mechanism which can be used for the substrate heating chamber 4005, a resistance heater or the like may be used for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas.

Moreover, the substrate heating chamber 4005 is connected to a refiner 4301 through a mass flow controller 4300. Note that although the mass flow controller 4300 and the refiner 4301 can be provided for each of a plurality of kinds of gases, only one mass flow controller 4300 and one refiner 4301 are provided for simplicity. As the gas introduced to the substrate heating chamber 4005, a gas whose dew point is −80° C. or lower, preferably −100° C. or lower can be used; for example, an oxygen gas, a nitrogen gas, and a rare gas (e.g., an argon gas) are used.

The transfer chamber 4004 includes the transfer robot 4103. The transfer robot 4103 includes a plurality of movable portions and an arm for holding a substrate and can transfer a substrate to each chamber. Further, the transfer chamber 4004 is connected to a vacuum pump 4200 and a cryopump 4201 through valves. With such a structure, evacuation is performed inside the transfer chamber 4004 using the vacuum pump 4200 from the atmospheric pressure to a low or medium vacuum (approximately several hundred pascals to 0.1 pascals) and then the valves are switched and evacuation is performed using the cryopump 4201 from the medium vacuum to a high or ultrahigh vacuum (approximately 0.1 Pa to 1×10⁻⁷ Pa).

Alternatively, two or more cryopumps 4201 may be connected in parallel to the transfer chamber 4004. With such a structure, even when one of the cryopumps is in regeneration, exhaust can be performed using any of the other cryopumps. Note that the above regeneration refers to treatment for discharging molecules (or atoms) entrapped in a cryopump. When molecules (or atoms) are entrapped too much in a cryopump, the exhaust capability of the cryopump is lowered; therefore, regeneration is performed regularly.

FIG. 3B illustrates a cross section of the deposition chamber 4006b, the transfer chamber 4004, and the load lock chamber 4003a. Here, the details of the deposition chamber (sputtering chamber) are described with reference to FIG. 3B.

The deposition chamber 4006b illustrated in FIG. 3B includes a target 4106, an attachment protection plate 4107, and a substrate stage 4108. Note that the substrate stage 4108 here is provided with a substrate 4109. Although not illustrated, the substrate stage 4108 may be provided with a substrate holding mechanism for holding the substrate 4109, a back side heater for heating the substrate 4109 from the back side, or the like.

Note that the substrate stage 4108 is held substantially vertically to a floor during deposition and is held substantially parallel to the floor when the substrate is delivered. In FIG. 3B, the position where the substrate stage 4108 is held when the substrate is delivered is denoted by a dashed line. With such a structure, the probability that dust or a particle which might be entered at the time of the film formation is attached to the substrate 4109 can be suppressed as compared with the case where the substrate stage 4108 is held parallel to the floor. However, there is a possibility that the substrate 4109 falls when the substrate stage 4108 is held vertically (90°) to the floor; therefore, the angle of the substrate stage 4108 to the floor is preferably wider than or equal to 80° and narrower than 90°.

The deposition plate 4107 can prevent sputtered particles separated from the target 4106 from being deposited on a region where deposition is not necessary. Moreover, the deposition plate 4107 is preferably processed to prevent accumulated sputtered particles from being separated. For example, blasting treatment which increases surface roughness may be performed, or roughness may be formed on the surface of the attachment protection plate 4107.

The deposition chamber 4006b is connected to a mass flow controller 4300 via a gas heating mechanism 4302, and the gas heating mechanism 4302 is connected to a refiner 4301 via the mass flow controller 4300. With the gas heating system 4302, a gas which is introduced to the deposition chamber 4006b can be heated to a temperature higher than or equal to 40° C. and lower than or equal to 400° C. Note that although the gas heating mechanism 4302, the mass flow controller 4300, and the refiner 4301 can be provided for each of a plurality of kinds of gases, only one gas heating mechanism 4302, one mass flow controller 4300, and one refiner 4301 are provided for simplicity. As the gas introduced to the deposition chamber 4006b, a gas whose dew point is −80° C. or lower, preferably −100° C. or lower can be used; for example, an oxygen gas, a nitrogen gas, and a rare gas (e.g., an argon gas) are used.

The deposition chamber 4006b is connected to a turbo molecular pump 4202 and the vacuum pump 4200 through valves.

In addition, the deposition chamber 4006b is provided with a cryotrap 4110.

The cryotrap 4110 is a mechanism that can adsorb a molecule (or an atom) having a relatively high melting point, such as water. The turbo molecular pump 4202 is capable of stably removing a large-sized molecule (or atom), needs low frequency of maintenance, and thus enables high productivity; on the other hand, it has a low capability in removing hydrogen and water. Hence, the cryotrap 4110 is connected to the deposition chamber 4006b so as to have a high capability in removing water or the like. The temperature of a refrigerator of the cryotrap 4110 is set to be lower than or equal to 100 K, preferably lower than or equal to 80 K. In the case where the cryotrap 4110 includes a plurality of refrigerators, it is preferable to set the temperatures of the refrigerators at different temperatures because efficient exhaust is possible. For example, the temperature of a first-stage refrigerator may be set to be lower than or equal to 100 K and the temperature of a second-stage refrigerator may be set to be lower than or equal to 20 K.

Note that the exhaust method of the deposition chamber 4006b is not limited to the above, and a structure similar to that in the exhaust method described above for the transfer chamber 4004 (the exhaust method using the cryopump and the vacuum pump) may be employed. Needless to say, the exhaust method of the transfer chamber 4004 may have a structure similar to that of the deposition chamber 4006b (the exhaust method using the turbo molecular pump and the vacuum pump).

Note that in each of the above transfer chamber 4004, the substrate heating chamber 4005, and the deposition chamber 4006b, the back pressure (total pressure) and the partial pressure of each gas molecule (atom) are preferably set as follows. In particular, the back pressure and the partial pressure of each gas molecule (atom) in the deposition chamber 4006b need to be noted because impurities might enter a film to be formed.

In each of the above chambers, the back pressure (total pressure) is less than or equal to $1\times10^{-4}$ Pa, preferably less than or equal to $3\times10^{-5}$ Pa, and further preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, and further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, and further preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, and further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. can be used.

Next, the details of the transfer chamber 4004 and the load lock chamber 4003a illustrated in FIG. 3B and the atmosphere-side substrate transfer chamber 4002 and the atmosphere-side substrate supply chamber 4001 illustrated in FIG. 3C are described. Note that FIG. 3C is a cross-sectional view of the atmosphere-side substrate transfer chamber 4002 and the atmosphere-side substrate supply chamber 4001.

For the transfer chamber 4004 illustrated in FIG. 3B, the description of the transfer chamber 4004 illustrated in FIG. 3A can be referred to.

The load lock chamber 4003a includes a substrate delivery stage 4111. When a pressure in the load lock chamber 4003a becomes atmospheric pressure by being increased from reduced pressure, the substrate delivery stage 4111 receives a substrate from the transfer robot 4103 provided in the atmosphere-side substrate transfer chamber 4002. After that, the load lock chamber 4003a is evacuated into vacuum so that the pressure therein becomes reduced pressure and then the transfer robot 4103 provided in the transfer chamber 4004 receives the substrate from the substrate delivery stage 4111.

Further, the load lock chamber 4003a is connected to a vacuum pump 4200 and a cryopump 4201 through valves. For a method for connecting evacuation systems such as the vacuum pump 4200 and the cryopump 4201, the description of the method for connecting the transfer chamber 4004 can be referred to, and the description thereof is omitted here.

Note that the unload lock chamber 4003b illustrated in FIG. 2 can have a structure similar to that in the load lock chamber 4003a.

The atmosphere-side substrate transfer chamber 4002 includes the transfer robot 4103. The transfer robot 4103 can deliver a substrate from the cassette port 4101 to the load lock chamber 4003a or deliver a substrate from the load lock chamber 4003a to the cassette port 4101. Furthermore, a mechanism for suppressing entry of dust or a particle, such as a high-efficiency particulate air (HEPA) filter, may be provided above the atmosphere-side substrate transfer chamber 4002 and the atmosphere-side substrate supply chamber 4001.

The atmosphere-side substrate supply chamber 4001 includes a plurality of cassette ports 4101. The cassette port 4101 can hold a plurality of substrates.

The metal oxide film is formed with the use of the above deposition apparatus, so that the entry of impurities into the metal oxide film can be suppressed. Further, when a film in contact with the metal oxide film is formed with the use of the above deposition apparatus, the entry of impurities into the metal oxide film from the film in contact therewith can be suppressed.

For example, with the deposition apparatus shown in FIG. 2 and FIGS. 3A to 3C, the semiconductor device of one embodiment of the present invention can be manufactured in the following order.

First, the substrate including the insulating film is transferred into the deposition apparatus, and the insulating film is heated in the substrate heating chamber 4005. Then, the metal oxide film is formed in the deposition chamber 4006a.

As another example, the substrate including the insulating film was transferred into the deposition apparatus, and the insulating film is heated in the substrate heating chamber 4005. Then, the first metal oxide film is formed in the deposition chamber 4006a. Then, the second metal oxide film is formed in the deposition chamber 4006b. Here, by using different oxygen gas flow rates for forming the first metal oxide film and the second metal oxide film as described above, the crystallinity or the material composition of the first metal oxide film can be made different from the crystallinity or the material composition of the second metal oxide film.

Note that one embodiment of the present invention is not limited to the above described method for forming the first metal oxide film and the second metal oxide film in different deposition chambers. For example, the first metal oxide film and the second metal oxide film may be formed in the same deposition chamber. In the case where a substrate heating mechanism is mounted on the deposition chamber, the heating treatment of the insulating film and the deposition of the metal oxide film may be performed in the same deposition chamber, or the heating treatment, the deposition of the first metal oxide film, and the deposition of the second metal oxide film may be performed in the same chamber.

<1-3. Effects of Heat Treatment>

Samples were fabricated by the above method and analyzed by thermal desorption spectroscopy (TDS). The results are described below.

[Fabrication of Sample]

First, four insulating films were formed over a glass substrate. The insulating films were formed successively in the vacuum by a plasma enhanced chemical vapor deposition (PECVD) method. As the insulating films, a 50-nm-thick silicon nitride film, a 300-nm-thick silicon nitride film, a 50-nm-thick silicon nitride film, and a 50-nm-thick silicon oxynitride film were stacked in this order.

Then, the substrate was transferred into a deposition apparatus in an atmospheric atmosphere.

Next, the substrate was inserted into a heating process chamber where the pressure was set to about $1 \times 10^{-5}$ Pa and was subjected to heating treatment.

Then, the substrate was transferred into the deposition chamber, and the metal oxide film was deposited by a sputtering method. The metal oxide film having a thickness of about 100 nm was deposited using a metal oxide target containing indium, gallium, and zinc (atomic ratio of In:Ga:Zn=4:2:4.1) without heating the substrate (at about 25° C.).

A plurality of samples was fabricated under different conditions of heating treatment.

[TDS Analysis]

Figure 24A:
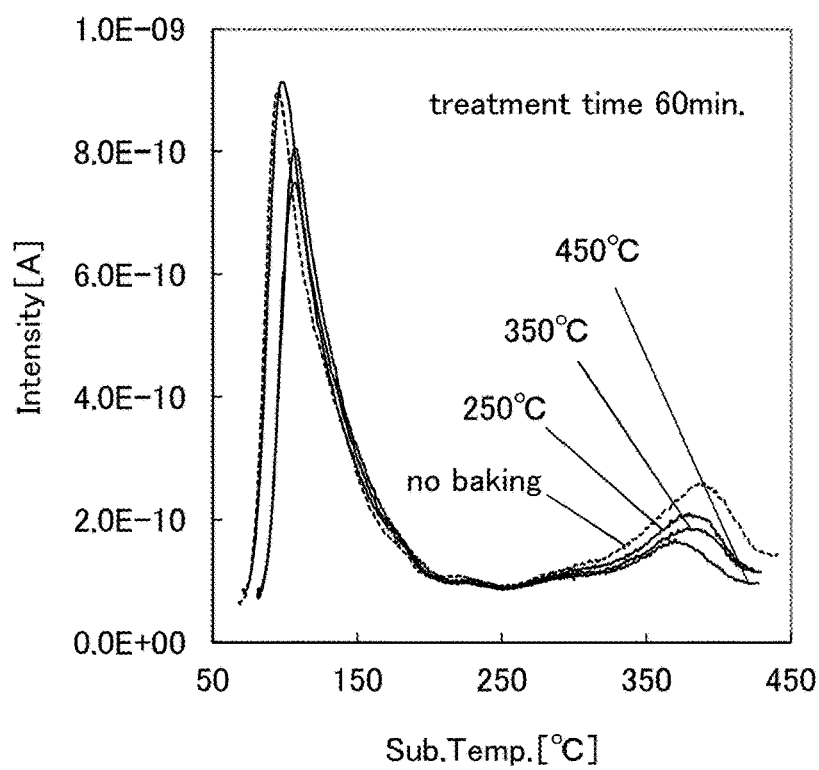
FIGS. 24A and 24B show TDS analysis results.

FIG. 24A shows TDS measurement results. FIG. 24A shows measurement results of the released amount of gas with a mass-to-charge ratio m/z of 18, which corresponds to a hydrogen molecule. The horizontal axis and vertical axis in FIG. 24A represent temperature and detection intensity, respectively.

FIG. 24A shows the results of a sample which was not subjected to heat treatment ("no baking") and three samples which were each subjected to heat treatment for one hour at 250° C., 350° C., or 450° C.

Each sample has the first peak at a temperature of about 100° C. These peaks are probably derived from a release phenomenon of hydrogen molecules which have been attached on the surface of the metal oxide film.

Each sample has the second peak at a temperature from 350° C. to 450° C. These peaks are probably derived from the influence of water and hydrogen existing at the interface between the insulating film and the metal oxide film. When diffused into the metal oxide film, hydrogen might be bonded with oxygen in the metal oxide film and released from the surface of the metal oxide film. Thus, the second peaks in FIG. 24A are probably derived from water and hydrogen contained in the insulating film and at the interface between the insulating film and the metal oxide film.

Figure 24B:
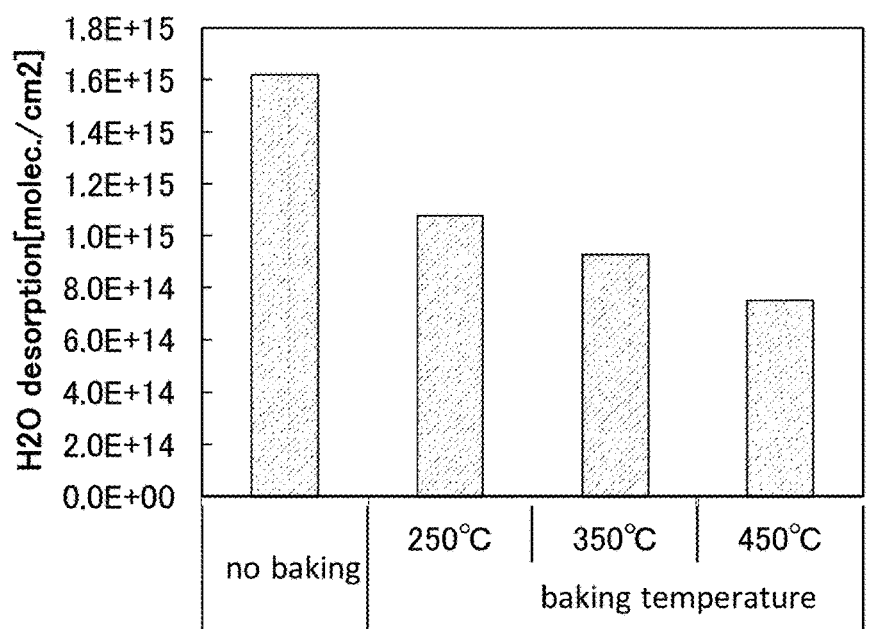

FIG. 24B shows results of the quantified amount of released water molecules per unit area. Note that quantification was performed except the peaks around 100° C. shown in FIG. 24A.

As shown in FIGS. 24A and 24B, the higher the heat treatment temperature is, the smaller the peak intensity is. This shows that water and hydrogen contained at the interface between the insulating film and the metal oxide film were reduced by the heat treatment.

Figure 25A:
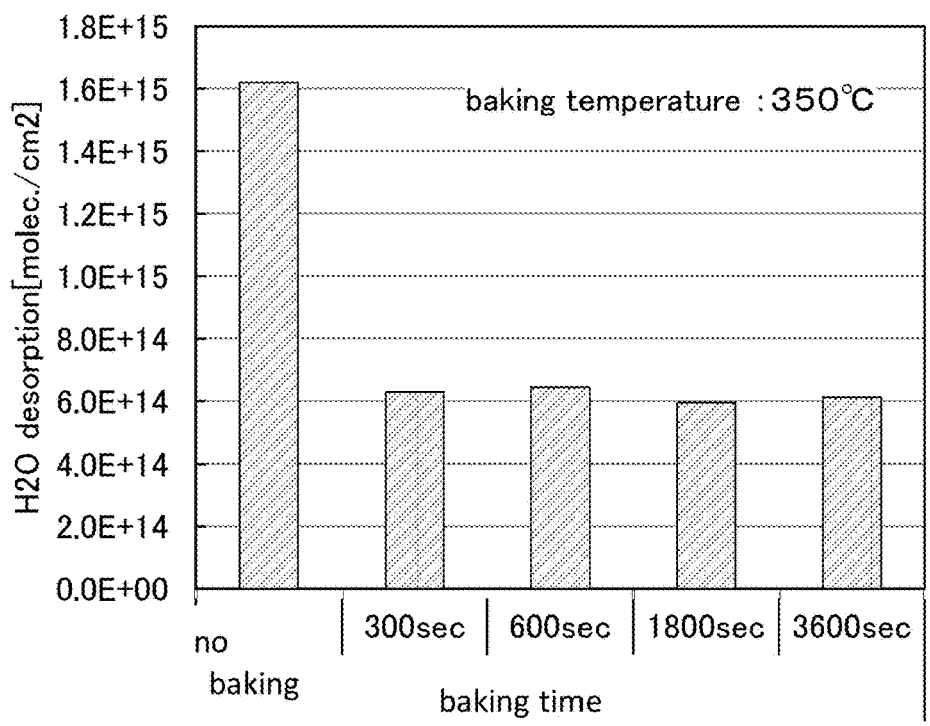
FIGS. 25A and 25B show TDS analysis results.

FIG. 25A shows results at a temperature of 350° C. in different conditions of process time: 300 seconds, 600 seconds, 1800 seconds, and 3600 seconds.

Figure 25B:
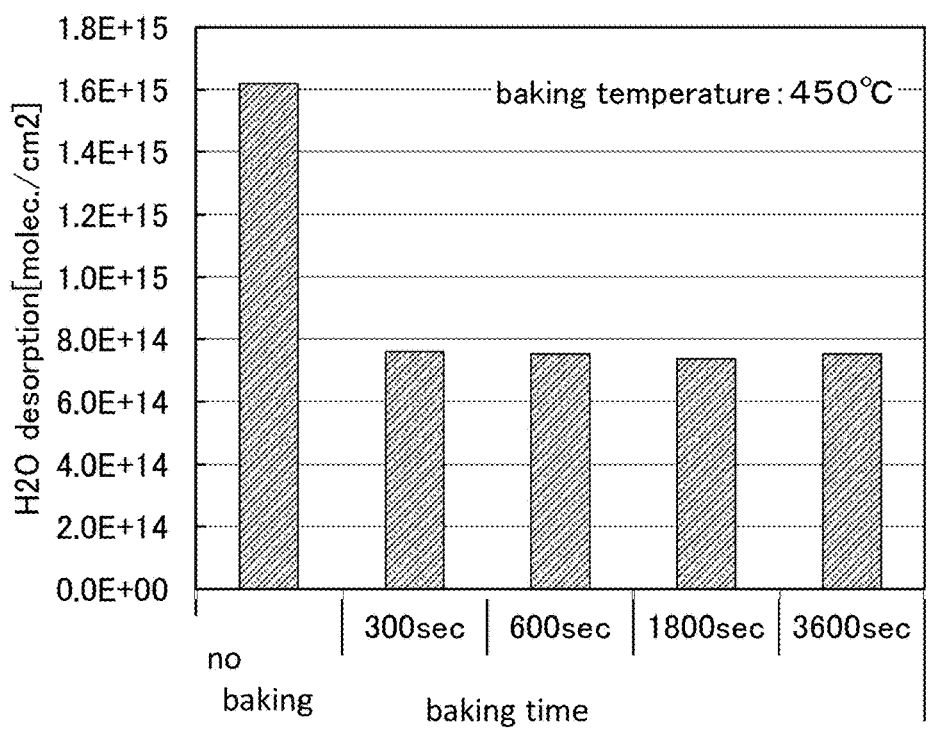

FIG. 25B shows results at a temperature of 450° C. in different conditions of process time: 300 seconds, 600 seconds, 1800 seconds, and 3600 seconds.

As shown in FIGS. 25A and 25B, the amount of released hydrogen molecules in the process time of 300 seconds is equivalent to that in the other process times regardless of the process temperature. Thus, water and hydrogen adsorbed on the surface of the insulating film can be sufficiently reduced in the process time of 300 seconds. The results also show that a sufficient effect would be obtained even in a process time shorter than 300 seconds. Furthermore, a sufficient effect would be obtained even at a process temperature lower than 350° C.

The above is the description of heat treatment effects.

At least part of this embodiment can be implemented in combination with any of the other embodiments and the other examples described in this specification as appropriate.

Embodiment 2

In this embodiment, a semiconductor device that is one embodiment of the present invention and a method of manufacturing the semiconductor device are described with reference to FIGS. 4A to 4C to FIGS. 10A to 10C.

<2-1. Structure Example 1 of Semiconductor Device>

Figure 4A:
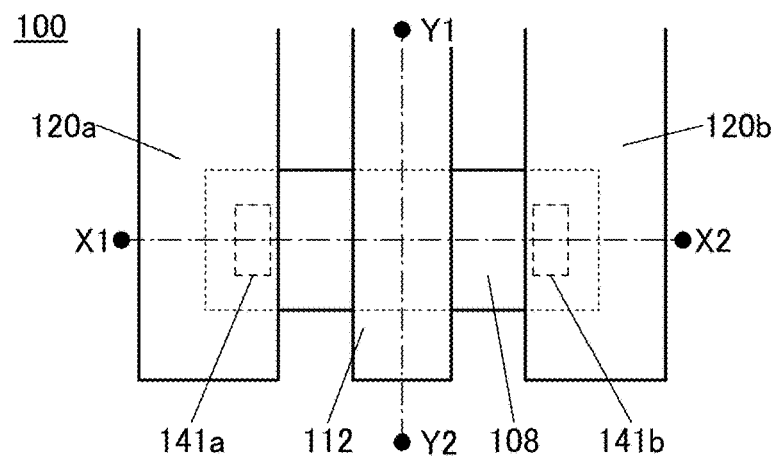
FIGS. 4A to 4C are a top view and cross-sectional views illustrating a semiconductor device.
Figure 4B:
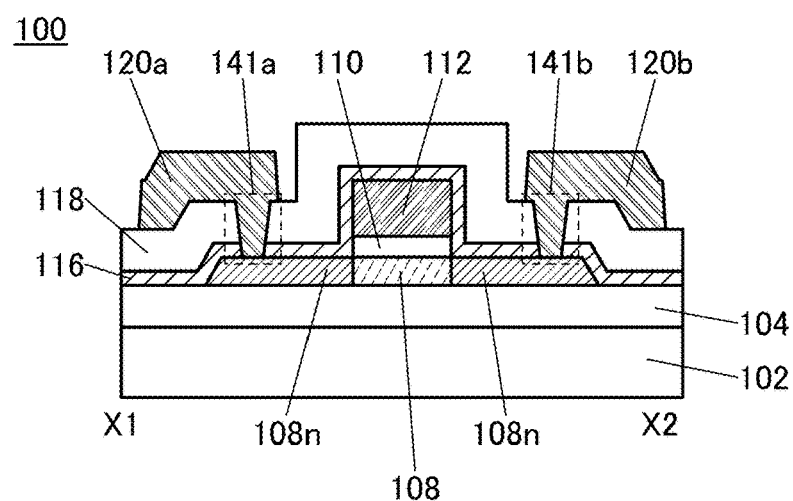
Figure 4C:
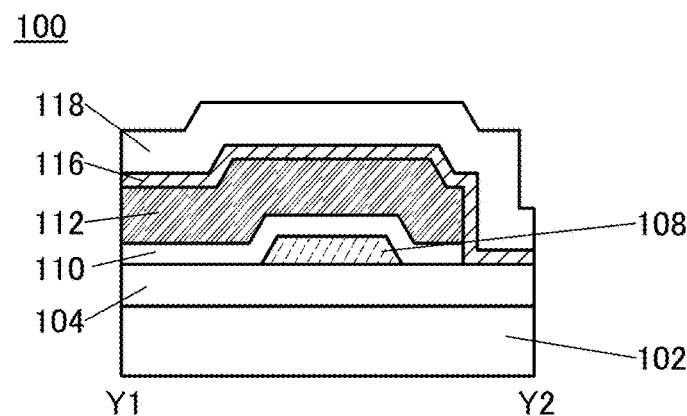

FIG. 4A is a top view of a transistor 100 that is a semiconductor device of one embodiment of the present invention. FIG. 4B is a cross-sectional view taken along the dashed-dotted line X1-X2 in FIG. 4A. FIG. 4C is a cross-sectional view taken along the dashed-dotted line Y1-Y2 in FIG. 4A. Note that in FIG. 4A, some components of the transistor 100 (e.g., an insulating film serving as a gate insulating film) are not illustrated to avoid complexity. The directions of the dashed-dotted lines X1-X2 and Y1-Y2 may be referred to as a channel length direction and a channel width direction, respectively. Note that some components in other top views of transistors shown below might not be illustrated as in FIG. 4A.

The transistor 100 illustrated in FIGS. 4A to 4C is a top-gate transistor.

The transistor 100 includes an insulating film 104 over a substrate 102; a metal oxide film 108 over the insulating film 104; the insulating film 110 over the metal oxide film 108; a conductive film 112 over the insulating film 110; and an insulating film 116 over the insulating film 104, the metal oxide film 108, and the conductive film 112.

For example, the metal oxide film 108 preferably contains In, M (M is Al, Ga, Y, or Sn), and Zn.

The metal oxide film 108 includes regions 108n which do not overlap with the conductive film 112 and are in contact with the insulating film 116. The regions 108n are n-type regions in the metal oxide film 108 described above. Note that the regions 108 are in contact with the insulating film 116 containing nitrogen or hydrogen. The nitrogen or hydrogen in the insulating film 116 is added to the regions 108n to increase the carrier density, thereby making the regions 108n n-type.

The metal oxide film 108 preferably includes a region in which the atomic proportion of In is larger than the atomic proportion of M. For example, the atomic ratio of In to M and Zn in the metal oxide film 108 is preferably In:M:Zn=4:2:3 or in the neighborhood thereof.

Note that the composition of the metal oxide film 108 is not limited to the above. For example, the atomic ratio of In to M and Zn in the metal oxide film 108 is preferably In:M:Zn=5:1:6 or in the neighborhood thereof. The term "neighborhood" includes the following: when In is 5, M is greater than or equal to 0.5 and less than or equal to 1.5, and Zn is greater than or equal to 5 and less than or equal to 7.

When the metal oxide film 108 has a region in which the atomic proportion of In is larger than the atomic proportion of M, the transistor 100 can have high field-effect mobility. Specifically, the field-effect mobility of the transistor 100 can exceed 10 cm$^2$/Vs, preferably exceed 30 cm$^2$/Vs.

For example, the use of the transistor with high field-effect mobility in a gate driver that generates a gate signal allows a display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

Even when the metal oxide film 108 includes a region in which the atomic proportion of In is higher than the atomic proportion of M, the field-effect mobility might be low if the metal oxide film 108 has high crystallinity.

Note that the crystallinity of the metal oxide film 108 can be determined by analysis by X-ray diffraction (XRD) or with a transmission electron microscope (TEM), for example.

Next, oxygen vacancies that might be formed in the metal oxide film 108 will be described.

Oxygen vacancies formed in the metal oxide film 108 adversely affect the transistor characteristics and therefore cause a problem. For example, hydrogen is trapped in oxygen vacancies formed in the metal oxide film 108 to serve as a carrier supply source. The carrier supply source generated in the metal oxide film 108 causes a change in the electrical characteristics, typically, shift in the threshold voltage, of the transistor 100 including the metal oxide film 108. Therefore, it is preferable that the amount of oxygen vacancies in the metal oxide film 108 be as small as possible.

In one embodiment of the present invention, the insulating film in the vicinity of the metal oxide film 108 contains excess oxygen. Specifically, one or both of the insulating film 110 which is formed over the metal oxide film 108 and the insulating film 104 which is formed below the metal oxide film 108 contain excess oxygen. Oxygen or excess oxygen is transferred from the insulating film 104 and/or the insulating film 110 to the metal oxide film 108, whereby oxygen vacancies in the metal oxide film 108 can be reduced.

Impurities such as hydrogen and moisture entering the metal oxide film 108 adversely affect the transistor characteristics and therefore cause a problem. Thus, it is preferable that the amount of impurities such as hydrogen and moisture in the metal oxide film 108 be as small as possible.

Note that it is preferable to use, as the metal oxide film 108, a metal oxide in which the impurity concentration is low and the density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic metal oxide film has few carrier generation sources, and thus has a low carrier density. Thus, a transistor in which a channel region is formed in the metal oxide film rarely has a negative threshold voltage (is rarely normally on). The highly purified intrinsic or substantially highly purified intrinsic metal oxide film has a low density of defect states and accordingly has a low density of trap states in some cases. Furthermore, the highly purified intrinsic or substantially highly purified intrinsic metal oxide film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

As shown in FIGS. 4A to 4C, the transistor 100 may include an insulating film 118 over the insulating film 116 and conductive films 120a and 120b electrically connected to a region 108n through openings 141a and 141b provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode, the conductive film 120a functions as a source electrode, and the conductive film 120b functions as a drain electrode.

The insulating film 110 functions as a gate insulating film. The insulating film 110 includes an excess oxygen region. Since the insulating film 110 includes the excess oxygen region, excess oxygen can be supplied to the metal oxide film 108. As a result, oxygen vacancies that might be formed in the metal oxide film 108 can be filled with excess oxygen, and the semiconductor device can have high reliability.

To supply excess oxygen to the metal oxide film 108, excess oxygen may be supplied to the insulating film 104 that is formed under the metal oxide film 108. In that case, excess oxygen contained in the insulating film 104 might also be supplied to the regions 108n, which is not desirable because the resistance of the regions 108n might be increased. In contrast, in the structure in which the insulating film 110 formed over the metal oxide film 108 contains excess oxygen, excess oxygen can be selectively supplied only to a region overlapping with the conductive film 112.

<2-2. Components of Semiconductor Device>

Next, components of the semiconductor device of this embodiment are described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium or the like, an SOI substrate, or the like can be used, or any of these substrates provided with a semiconductor element may be used as the substrate 102. In the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure including an oxide insulating film and/or a nitride insulating film. To improve the properties of the interface with the metal oxide film 108, at least a region of the insulating film 104 which is in contact with the metal oxide film 108 is preferably formed using an oxide insulating film. When the insulating film 104 is formed using an oxide insulating film from which oxygen is released by heating, oxygen contained in the insulating film 104 can be moved to the metal oxide film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased. In addition, interface states at the interface between the insulating film 104 and the metal oxide film 108 and oxygen vacancies included in the metal oxide film 108 can be reduced.

For example, the insulating film 104 can be formed to have a single-layer structure or stacked-layer structure including silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure including a silicon nitride film and a silicon oxynitride film. With the insulating film 104 having such a stack-layer structure including a silicon nitride film as a lower layer and a silicon oxynitride film as an upper layer, oxygen can be efficiently introduced into the metal oxide film 108.

[Conductive Film]

The conductive film 112 functioning as a gate electrode, the conductive film 120a functioning as a source electrode, and the conductive film 120b functioning as a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 112, 120a, and 120b can be formed using an oxide conductor or a metal oxide film, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, the oxide conductor is obtained in the following manner. Oxygen vacancies are formed in a metal oxide, and then hydrogen is added to the oxygen vacancies, so that a donor level is formed in the vicinity of the conduction band. This increases the conductivity of the metal oxide; accordingly, the metal oxide becomes a conductor. The metal oxide having become a conductor can be referred to as an oxide conductor. Metal oxides generally transmit visible light because of their large energy gap. Since an oxide conductor is a metal oxide having a donor level in the vicinity of the conduction band, the influence of absorption due to the donor level is small in an oxide conductor, and an oxide conductor has a visible light transmitting property comparable to that of a metal oxide having semiconductor characteristics.

It is particularly preferred to use the oxide conductor described above for the conductive film 112, in which case excess oxygen can be added to the insulating film 110.

A Cu—X alloy film (X is Mn, Ni, Cr, Fe, Co, Mo, Ta, or Ti) may be used for the conductive films 112, 120a, and 120b. The use of a Cu—X alloy film results in lower manufacturing costs because the film can be processed by wet etching.

Among the above-mentioned metal elements, any one or more elements selected from titanium, tungsten, tantalum, and molybdenum are preferably included in the conductive films 112, 120a, and 120b. In particular, a tantalum nitride film is preferably used for the conductive films 112, 120a, and 120b. A tantalum nitride film has conductivity and a high barrier property against copper or hydrogen. Because a tantalum nitride film releases little hydrogen from itself, it can be most favorably used as a conductive layer in contact with the metal oxide film 108 or a conductive layer in the vicinity of the metal oxide film 108. It is favorable to use a copper film for the conductive films 112, 120a, and 120b because the resistance of the conductive films 112, 120a, and 120b can be reduced.

The conductive films 112, 120a, and 120b can also be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive films can be reduced.

[Second Insulating Film]

As the insulating film 110 of the transistor 100 which functions as a gate insulating layer, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 110 may have a stacked-layer structure or a stacked-layer structure of three or more layers.

The insulating film 110 that is in contact with the metal oxide film 108 functioning as a channel region of the transistor is preferably an oxide insulating film and preferably includes a region including oxygen in excess of the stoichiometric composition (oxygen-excess region). In other words, the insulating film 110 is an insulating film capable of releasing oxygen. In order to provide the oxygen-excess region in the insulating film 110, the insulating film 110 is formed in an oxygen atmosphere, or the deposited insulating film 110 is subjected to heat treatment in an oxygen atmosphere, for example.

In the case where hafnium oxide is used for the insulating film 110, the following effect is attained. Hafnium oxide has higher dielectric constant than silicon oxide and silicon oxynitride. Therefore, the insulating film 110 using hafnium oxide can have a larger thickness than the insulating film 110 using silicon oxide, so that leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to provide a transistor with a low off-state current. Examples of the crystal structure include a monoclinic crystal structure and a cubic crystal structure. Note that one embodiment of the present invention is not limited to the above examples.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

[Metal Oxide Film]

The metal oxide film 108 can be formed of the metal oxide described above.

<Atomic Ratio>

Preferred ranges of the atomic ratio of indium, the element M, and zinc contained in the metal oxide according to the present invention are described with reference to FIGS. 10A to 10C. Note that the proportion of oxygen atoms is not illustrated in FIGS. 10A to 10C. The terms of the atomic ratio of indium, the element M, and zinc contained in the metal oxide are denoted by [In], [M], and [Zn], respectively.

In FIGS. 10A to 10C, dashed lines indicate a line where the atomic ratio [In]:[M]:[Zn] is $(1+\alpha):(1-\alpha):1$ where $\alpha$ is a real number greater than or equal to $-1$ and less than or equal to 1, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines correspond to a line representing the atomic ratio of [In]:[M]:[Zn]=$5:1:\beta$ where $\beta$ is a real number greater than or equal to 0, a line representing the atomic ratio of [In]:[M]:[Zn]=$2:1\beta$, a line representing the atomic ratio of [In]:[M]:[Zn]=$1:1:\beta$, a line representing the atomic ratio of [In]:[M]:[Zn]=$1:2:\beta$, a line representing the atomic ratio of [In]:[M]:[Zn]=$1:3:\beta$, and a line representing the atomic ratio of [In]:[M]:[Zn]=$1:4:\beta$.

A metal oxide having the atomic ratio of [In]:[M]:[Zn]=0:2:1 or in the neighborhood thereof in FIGS. 10A to 10C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 10A shows an example of the preferred ranges of the atomic ratio of indium to the element M and zinc contained in a metal oxide.

In addition, the metal oxide containing indium in a higher proportion can have high carrier mobility (electron mobility). Thus, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the neighborhood thereof (e.g., a region C in FIG. 10C), insulation performance becomes better.

Accordingly, the metal oxide of one embodiment of the present invention preferably has an atomic ratio represented by the region A in FIG. 10A. With the atomic ratio, high carrier mobility is obtained.

A metal oxide having an atomic ratio in the region A, particularly in a region B in FIG. 10B, has high carrier mobility and high reliability and is excellent.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

In the case where the metal oxide film 108 is formed of In—M—Zn oxide, it is preferable to use a target including polycrystalline In—M—Zn oxide as the sputtering target. Note that the atomic ratio of metal elements in the formed metal oxide film 108 varies from the above atomic ratios of metal elements of the sputtering targets in a range of ±40%. For example, when a sputtering target used for the metal oxide film 108 has an atomic ratio of In:Ga:Zn=4:2:4.1, the atomic ratio of the metal oxide film 108 may be 4:2:3 or in the neighborhood thereof. When a sputtering target used for the metal oxide film 108 has an atomic ratio of In:Ga:Zn=5:1:7, the atomic ratio of the metal oxide film 108 may be 5:1:6 or in the neighborhood thereof.

The energy gap of the metal oxide film 108 is 2 eV or more, preferably 2.5 eV or more. With the use of a metal oxide having such a wide energy gap, the off-state current of the transistor 100 can be reduced.

Furthermore, the metal oxide film 108 may have a non-single-crystal structure. Examples of the non-single-crystal structure include a CAAC-OS which will be described later, a polycrystalline structure, a microcrystalline structure, and an amorphous structure. Among the non-single-crystal structures, an amorphous structure has the highest density of defect states.

[Third Insulating Film]

The insulating film 116 contains nitrogen or hydrogen. A nitride insulating film can be used as the insulating film 116, for example. The nitride insulating film can be formed using silicon nitride, silicon nitride oxide, silicon oxynitride, or the like. The hydrogen concentration in the insulating film 116 is preferably higher than or equal to $1 \times 10^{22}$ atoms/cm$^3$. The insulating film 116 is in contact with the region 108n of the metal oxide film 108. Thus, the concentration of an impurity (e.g., nitrogen or hydrogen) in the region 108n in contact with the insulating film 116 is increased, leading to an increase in the carrier density of the region 108n.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

<2-3. Structure Example 2 of Transistor>

Next, a structure of a transistor different from that in FIGS. 4A to 4C will be described with reference to FIGS. 5A to 5C.

Figure 5A:
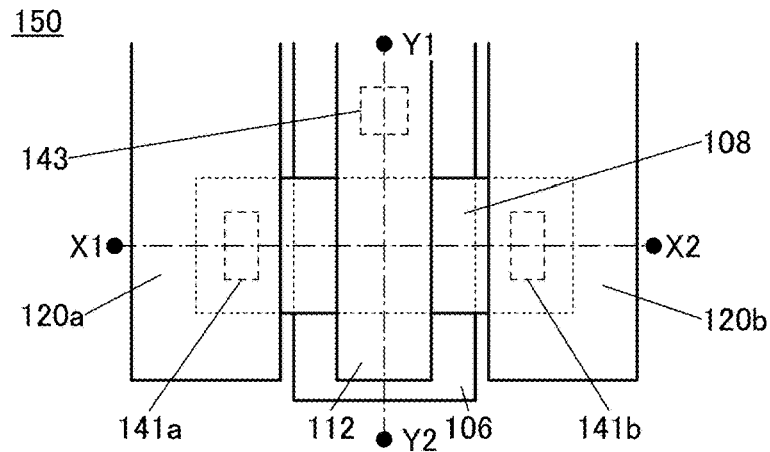
FIGS. 5A to 5C are a top view and cross-sectional views illustrating a semiconductor device.

FIG. 5A is a top view of the transistor 150. FIG. 5B is a cross-sectional view taken along dashed-dotted line X1-X2 in FIG. 5A. FIG. 5C is a cross-sectional view taken along dashed-dotted line Y1-Y2 in FIG. 5A.

Figure 5B:
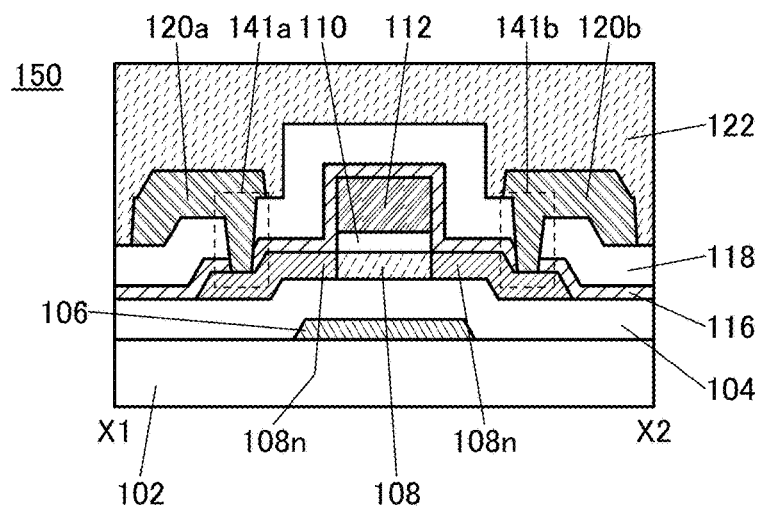
Figure 5C:
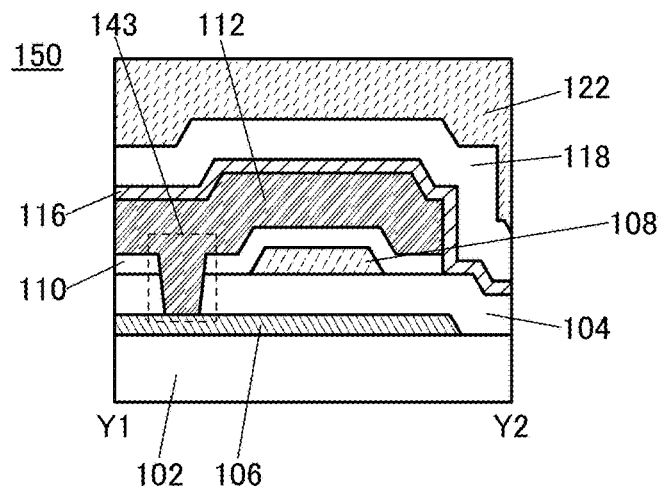

The transistor 150 illustrated in FIGS. 5A to 5C includes the conductive film 106 over the substrate 102; the insulating film 104 over the conductive film 106; the metal oxide film 108 over the insulating film 104; the insulating film 110 over the metal oxide film 108; the conductive film 112 over the insulating film 110; and the insulating film 116 over the insulating film 104, the metal oxide film 108, and the conductive film 112.

Note that the metal oxide film 108 has a structure similar that in the transistor 100 shown in FIGS. 4A to 4C. The transistor 150 shown in FIGS. 5A to 5C includes the conductive film 106 and an opening 143 in addition to the components of the transistor 100 described above.

The opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light from the bottom that irradiates a channel formation region can be reduced.

In the case of the structure of the transistor 150, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper as the conductive film 106 because the resistance can be reduced. It is favorable that, for example, each of the conductive films 106, 120a, and 120b has a stacked-layer structure in which a copper film is over a titanium nitride film, a tantalum nitride film, or a tungsten film. In that case, by using the transistor 150 as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 150, but also as power supply wirings, signal supply wirings, connection wirings, or the like of the display device.

In this manner, unlike the transistor 100 described above, the transistor 150 in FIGS. 5A to 5C has a structure in which a conductive film functioning as a gate electrode is provided over and under the metal oxide film 108. As in the transistor 150, a semiconductor device of one embodiment of the present invention may have a plurality of gate electrodes.

As illustrated in FIGS. 5B and 5C, the metal oxide film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the metal oxide film 108 in the channel width direction. In the channel width direction, the whole metal oxide film 108 is covered with the conductive film 112 with the insulating film 110 placed therebetween. Since the conductive film 112 is connected to the conductive film 106 through the opening 143 provided in the insulating films 104 and 110, a side surface of the metal oxide film 108 in the channel width direction faces the conductive film 112 with the insulating film 110 placed therebetween.

In other words, the conductive film 106 and the conductive film 112 are connected through the opening 143 provided in the insulating films 104 and 110, and each include a region positioned outside an edge portion of the metal oxide film 108.

Such a structure enables the metal oxide film 108 included in the transistor 150 to be electrically surrounded by electric fields of the conductive film 106 functioning as a first gate electrode and the conductive film 112 functioning as a second gate electrode. A device structure of a transistor, like that of the transistor 150, in which electric fields of the first gate electrode and the second gate electrode electrically surround the metal oxide film 108 in which a channel region is formed can be referred to as a surrounded channel (S-channel) structure.

Since the transistor 150 has the S-channel structure, an electric field for inducing a channel can be effectively applied to the metal oxide film 108 by the conductive film 106 or the conductive film 112; thus, the current drive capability of the transistor 150 can be improved and high on-state current characteristics can be obtained. As a result of the high on-state current, it is possible to reduce the size of the transistor 150. Furthermore, since the transistor 150 has a structure in which the metal oxide film 108 is surrounded by the conductive film 106 and the conductive film 112, the mechanical strength of the transistor 150 can be increased.

When seen in the channel width direction of the transistor 150, an opening different from the opening 143 may be formed on the side of the metal oxide film 108 on which the opening 143 is not formed.

When a transistor has a pair of gate electrodes between which a semiconductor film is positioned as in the transistor 150, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In that case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3–V4) may be larger than the potential amplitude of the signal A (V1–V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 150 are similar to those of the transistor 100 described above and have similar effects.

An insulating film may further be formed over the transistor 150. The transistor 150 illustrated in FIGS. 5A to 5C includes an insulating film 122 over the conductive films 120a and 120b and the insulating film 118.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

<2-4. Structure Example 3 of Transistor>

Next, a structure of a transistor different from that of the transistor 150 in FIGS. 5A to 5C will be described with reference to FIGS. 6A and 6B.

Figure 6A:
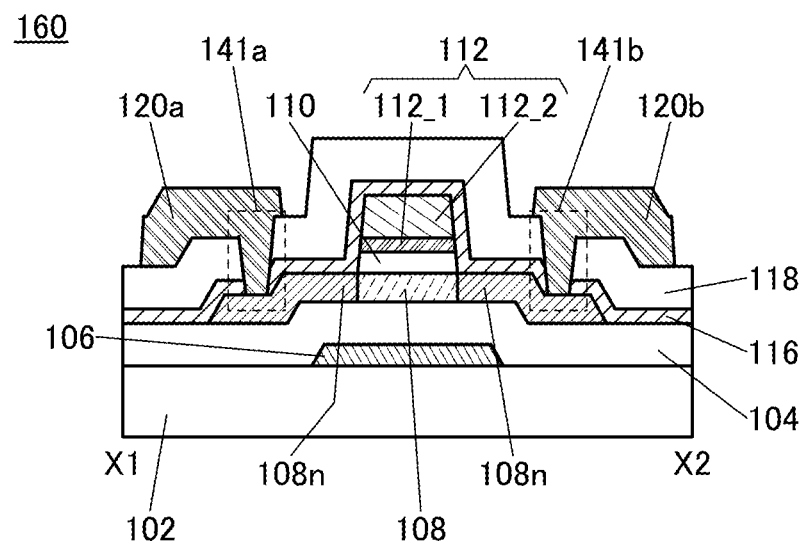
FIGS. 6A and 6B are cross-sectional views illustrating a semiconductor device.
Figure 6B:
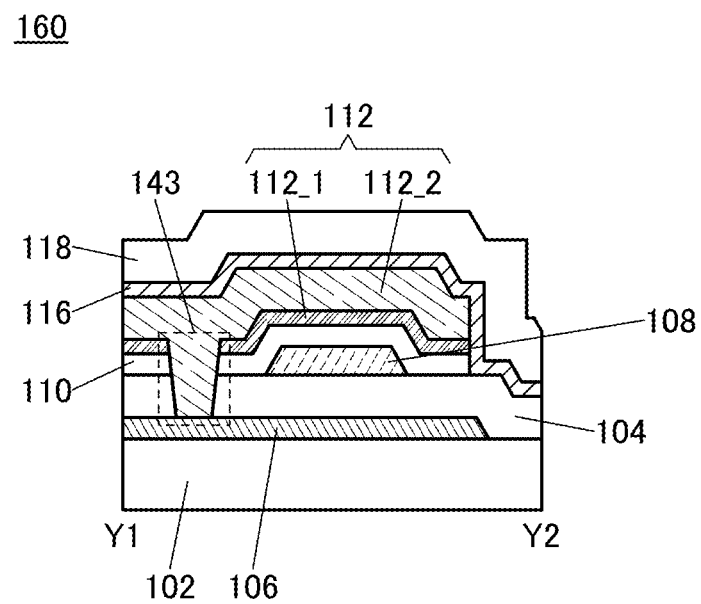

FIGS. 6A and 6B are cross-sectional views of a transistor 160. The top view of the transistor 160 is not illustrated because it is similar to that of the transistor 150 in FIG. 5A.

The transistor 160 illustrated in FIGS. 6A and 6B is different from the transistor 150 in the stacked-layer structure of the conductive film 112, the shape of the conductive film 112, and the shape of the insulating film 110.

The conductive film 112 in the transistor 160 includes a conductive film 112_1 over the insulating film 110 and a conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc, or the like can be used, for example.

As illustrated in FIG. 6B, the conductive film 1122 is connected to the conductive film 106 through the opening 143. By forming the opening 143 after a conductive film to be the conductive film 112_1 is formed, the shape illustrated in FIG. 6B can be obtained. In the case where an oxide conductive film is used as the conductive film 112_1, the structure in which the conductive film 1122 is connected to the conductive film 106 can decrease the contact resistance between the conductive film 112 and the conductive film 106.

The conductive film 112 and the insulating film 110 in the transistor 160 have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

As compared with the transistor 160 in which the conductive film 112 and the insulating film 110 have a rectangular shape, the transistor 160 in which the conductive film 112 and the insulating film 110 have a tapered shape is favorable because of better coverage with the insulating film 116.

The other components of the transistor 160 are similar to those of the transistor 150 described above and have similar effects.

<2-5. Method for Manufacturing Semiconductor Device>

Next, a method for manufacturing the transistor 150 illustrated in FIGS. 5A to 5C will be described with reference to FIGS. 7A to 7D to FIGS. 9A to 9C. Note that FIGS. 7A to 7D to FIGS. 9A to 9C are cross-sectional views in the channel length direction and the channel width direction illustrating the method for manufacturing the transistor 150.

First, the conductive film 106 is formed over the substrate 102. Next, the insulating film 104 is formed over the substrate 102 and the conductive film 106, and a metal oxide film is formed over the insulating film 104. Then, the metal oxide film is processed into an island shape, whereby a metal oxide film 108 is formed (see FIG. 7A).

The insulating film 104 and the metal oxide film 108 can be formed by a method described in Embodiment 1. In other words, the method includes the first step of forming the insulating film 104 over the substrate 102 and the conductive film 106, the second step of transferring the substrate 102 to the apparatus, the third step of heating the insulating film 104, and the fourth step of forming the metal oxide film 108. The third step and the fourth step are successively performed in an atmosphere where the water vapor partial pressure is lower than that in atmospheric air. In this manner, the insulating film 104 and the metal oxide film 108 can be formed.

The conductive film 106 can be formed using a material selected from the above-mentioned materials. In this embodiment, for the conductive film 106, a stack including a 50-nm-thick tungsten film and a 400-nm-thick copper film is formed with a sputtering apparatus.

To process a conductive film to be the conductive film 106, a wet etching method and/or a dry etching method can be used. In this embodiment, in the processing of the conductive film into the conductive film 106, the copper film is etched by a wet etching method, and then the tungsten film is etched by a dry etching method.

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used.

Oxygen can be added by an ion doping method, an ion implantation method, a plasma treatment method, or the like. Alternatively, a film that suppresses oxygen release may be formed over the insulating film 104, and then oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

In forming the metal oxide film 108, an inert gas (such as a helium gas, an argon gas, or a xenon gas) may be mixed into the oxygen gas. Note that the proportion of the oxygen gas in the whole deposition gas (hereinafter also referred to as an oxygen flow rate ratio) in forming the metal oxide film 108 is higher than or equal to 0% and lower than or equal to 100%, preferably higher than or equal to 5% and lower than or equal to 20%.

The metal oxide film 108 is formed at a substrate temperature higher than or equal to room temperature and lower than or equal to 180° C., preferably higher than or equal to room temperature and lower than or equal to 140° C. The substrate temperature when the metal oxide film 108 is formed is preferably, for example, higher than or equal to room temperature and lower than 140° C. because the productivity is increased.

The thickness of the metal oxide film 108 is greater than or equal to 3 nm and less than or equal to 200 nm, preferably greater than or equal to 3 nm and less than or equal to 100 nm, further preferably greater than or equal to 3 nm and less than or equal to 60 nm.

In the case where a large-sized glass substrate (e.g., the 6th generation to the 10th generation) is used as the substrate 102 and the metal oxide film 108 is formed at a substrate temperature higher than or equal to 200° C. and lower than or equal to 300° C., the substrate 102 might be changed in shape (distorted or warped). Therefore, in the case where a large-sized glass substrate is used, the change in the shape of the glass substrate can be suppressed by forming the metal oxide film 108 at a substrate temperature higher than or equal to room temperature and lower than 200° C.

In addition, increasing the purity of the sputtering gas is necessary. For example, when a gas which is highly purified to have a dew point of −40° C. or lower, preferably −80° C. or lower, further preferably −100° C. or lower, still further preferably −120° C. or lower, is used as the sputtering gas, i.e., the oxygen gas or the argon gas, entry of moisture or the like into the metal oxide can be minimized.

In the case where the metal oxide is deposited by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the metal oxide, as much as possible. In particular, the partial pressure of gas molecules corresponding to $H_2O$ (gas molecules corresponding to m/z=18) in the chamber in the standby mode of the sputtering apparatus is preferably lower than or equal to $1-10^{-4}$ Pa, further preferably lower than or equal to $5 \times 10^{-5}$ Pa.

In this embodiment, the metal oxide film 108 is formed in the following conditions.

The metal oxide film 108 is formed by a sputtering method using an In—Ga—Zn metal oxide target. The substrate temperature and the oxygen flow rate at the time of formation of the metal oxide film 108 can be set as appropriate. The pressure in a chamber is 0.6 Pa, and an AC power of 2500 W is supplied to the metal oxide target provided in the sputtering apparatus.

To process the metal oxide into the metal oxide film 108, a wet etching method and/or a dry etching method can be used.

After the metal oxide film 108 is formed, the metal oxide film 108 may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere not contain hydrogen, water, or the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the metal oxide while it is heated or by performing heat treatment after the deposition of the metal oxide, the hydrogen concentration in the metal oxide, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 7A:
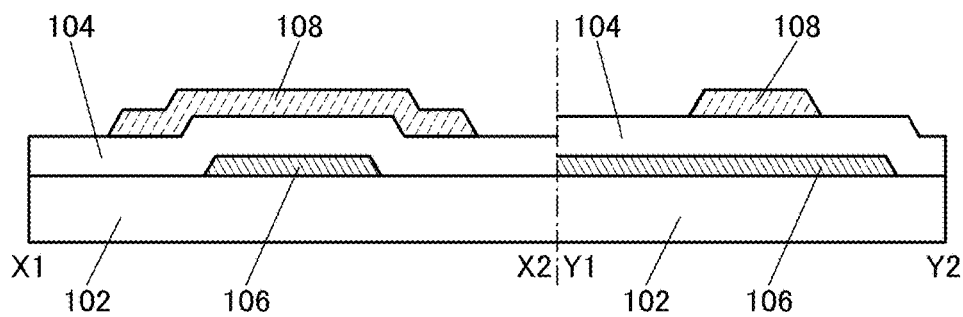
FIGS. 7A to 7D are cross-sectional views illustrating a manufacturing method of a semiconductor device.
Figure 7B:
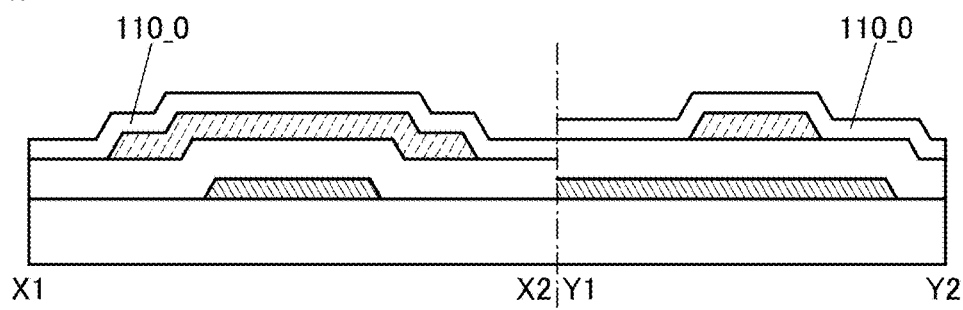

Next, an insulating film 110_0 is formed over the insulating film 104 and the metal oxide film 108 (see FIG. 7B).

For the insulating film 110_0, a silicon oxide film or a silicon oxynitride film can be formed with a plasma-enhanced chemical vapor deposition apparatus (also referred to as a PECVD apparatus or simply a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating film 110_0 with the PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 110_0, a dense silicon oxide film or a dense silicon oxynitride film can be formed under the following conditions: the substrate placed in a vacuum-evacuated treatment chamber of the PECVD apparatus is held at a temperature higher than or equal to 280° C. and lower than or equal to 400° C.; the pressure in the treatment chamber into which a source gas is introduced is set to be higher than or equal to 20 Pa and lower than or equal to 250 Pa, preferably higher than or equal to 100 Pa and lower than or equal to 250 Pa; and a high-frequency power is supplied to an electrode provided in the treatment chamber.

The insulating film 110_0 may be formed by a PECVD method using a microwave. A microwave refers to a wave in the frequency range of 300 MHz to 300 GHz. In the case of using a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like. The insulating film 110_0 having high coverage can be formed by a CVD method using an organosilane gas.

In this embodiment, as the insulating film 110_0, a 100-nm-thick silicon oxynitride film is formed with the PECVD apparatus.

Figure 7C:
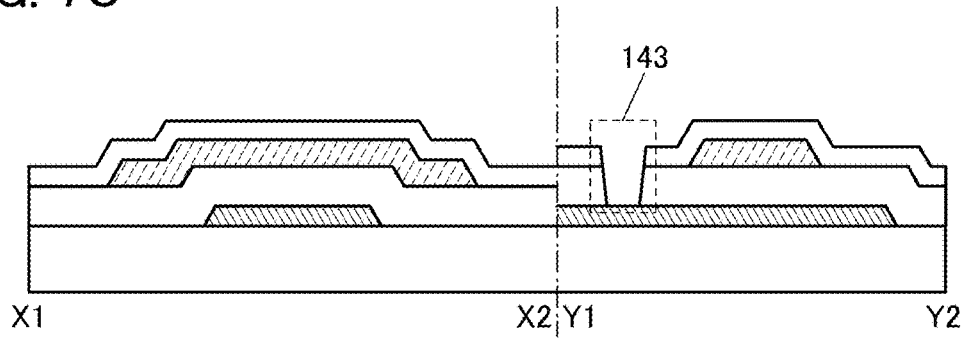

Subsequently, a mask is formed by lithography in a desired position over the insulating film 110_0, and then the insulating film 110_0 and the insulating film 104 are partly etched, so that the opening 143 reaching the conductive film 106 is formed (see FIG. 7C).

To form the opening 143, a wet etching method and/or a dry etching method can be used. In this embodiment, the opening 143 is formed by a dry etching method.

Next, a conductive film 1120 is formed over the conductive film 106 and the insulating film 110_0 so as to cover the opening 143. In the case where a metal oxide film is used as the conductive film 112_0, for example, oxygen might be added to the insulating film 110_0 during the formation of the conductive film 112_0 (see FIG. 7D).

Figure 7D:
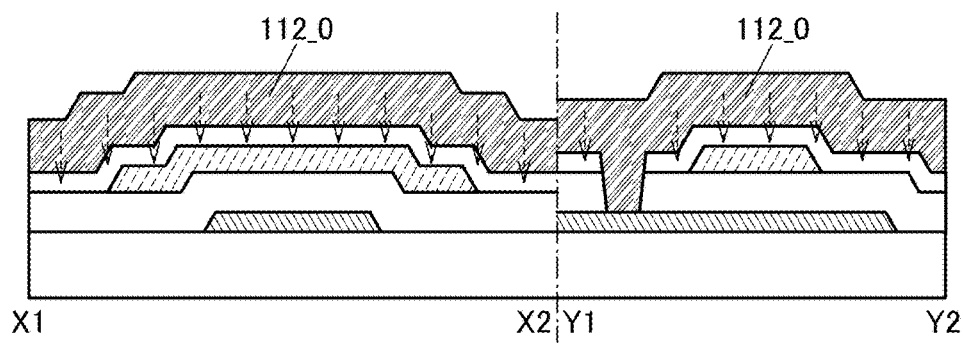

In FIG. 7D, oxygen added to the insulating film 110_0 is schematically shown by arrows. Furthermore, the conductive film 112_0 formed to cover the opening 143 is electrically connected to the conductive film 106.

In the case where a metal oxide film is used as the conductive film 1120, the conductive film 112_0 is preferably formed by a sputtering method in an atmosphere containing an oxygen gas. Formation of the conductive film 112_0 in an atmosphere containing an oxygen gas allows suitable addition of oxygen to the insulating film 110_0. Note that a method for forming the conductive film 112_0 is not limited to a sputtering method, and another method such as an ALD method may be used.

In this embodiment, a 100-nm-thick IGZO film containing an In—Ga—Zn oxide (In:Ga:Zn=4:2:4.1 (atomic ratio)) is formed as the conductive film 112_0 by a sputtering method. Oxygen addition treatment may be performed on the insulating film 110_0 before or after the formation of the conductive film 112_0. The oxygen addition treatment can be performed in a manner similar to that of the oxygen addition treatment that can be performed after the formation of the insulating film 104.

Figure 8A:
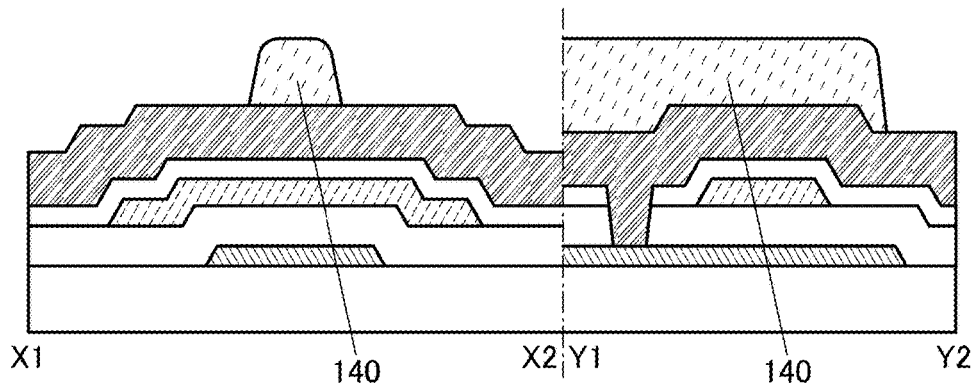
FIGS. 8A to 8C are cross-sectional views illustrating a manufacturing method of a semiconductor device.

Subsequently, a mask 140 is formed by a lithography process in a desired position over the conductive film 112_0 (see FIG. 8A).

Figure 8B:
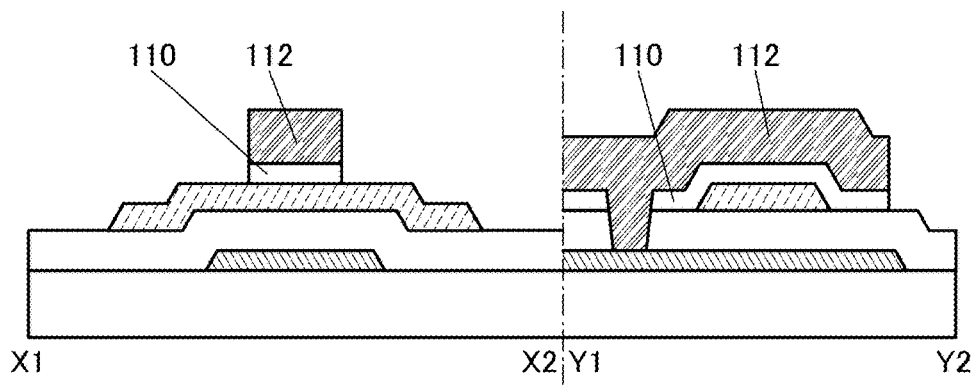

Next, etching is performed from above the mask 140 to process the conductive film 112_0 and the insulating film 110_0. After the processing of the conductive film 112_0 and the insulating film 110_0, the mask 140 is removed. As a result of the processing of the conductive film 112_0 and the insulating film 110_0, the island-shaped conductive film 112 and the island-shaped insulating film 110 are formed (see FIG. 8B).

In this embodiment, the conductive film 112_0 and the insulating film 110_0 are processed by a dry etching method.

In the processing of the conductive film 112 and the insulating film 110, the thickness of the metal oxide film 108 in a region not overlapping with the conductive film 112 is decreased in some cases. In other cases, in the processing of the conductive film 112_0 and the insulating film 110_0, the thickness of the insulating film 104 in a region not overlapping with the metal oxide film 108 is decreased. In the processing of the conductive film 112_0 and the insulating film 110_0, an etchant or an etching gas (e.g., chlorine) might be added to the metal oxide film 108 or the constituent element of the conductive film 112_0 or the insulating film 110_0 might be added to the metal oxide film 108.

Figure 8C:
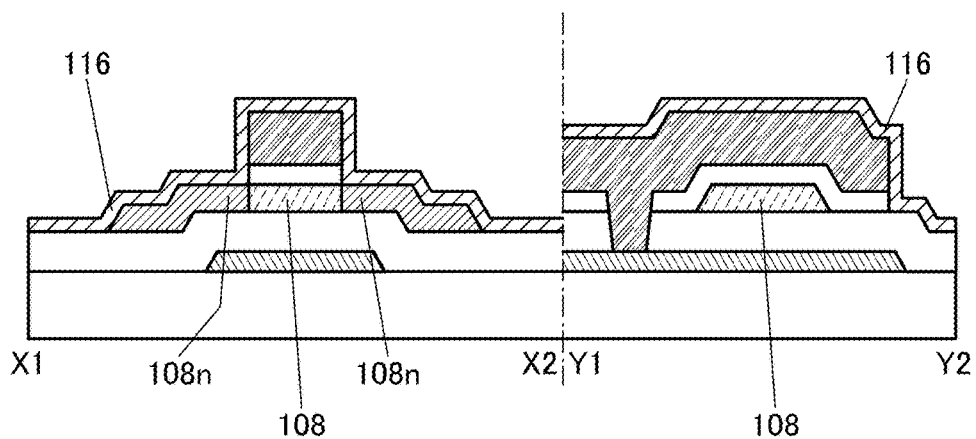

Next, the insulating film 116 is formed over the insulating film 104, the metal oxide film 108, and the conductive film 112. By the formation of the insulating film 116, part of the metal oxide film 108 that is in contact with the insulating film 116 becomes the regions 108$n$ (see FIG. 8C).

The insulating film 116 can be formed using a material selected from the above-mentioned materials. In this embodiment, as the insulating film 116, a 100-nm-thick silicon nitride oxide film is formed with a PECVD apparatus. In the formation of the silicon nitride oxide film, two steps, i.e., plasma treatment and deposition treatment, are performed at a temperature of 220° C. The plasma treatment is performed under the following conditions: an argon gas at a flow rate of 100 sccm and a nitrogen gas at a flow rate of 1000 sccm are introduced into a chamber before deposition; the pressure in the chamber is set to 40 Pa; and a power of 1000 W is supplied to an RF power source (27.12 MHz). The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and a power of 1000 W is supplied to the RF power source (27.12 MHz).

When a silicon nitride oxide film is used as the insulating film 116, nitrogen or hydrogen in the silicon nitride oxide film can be supplied to the regions 108$n$ in contact with the insulating film 116. In addition, when the formation temperature of the insulating film 116 is the above temperature, release of excess oxygen contained in the insulating film 110 to the outside can be suppressed.

Figure 9A:
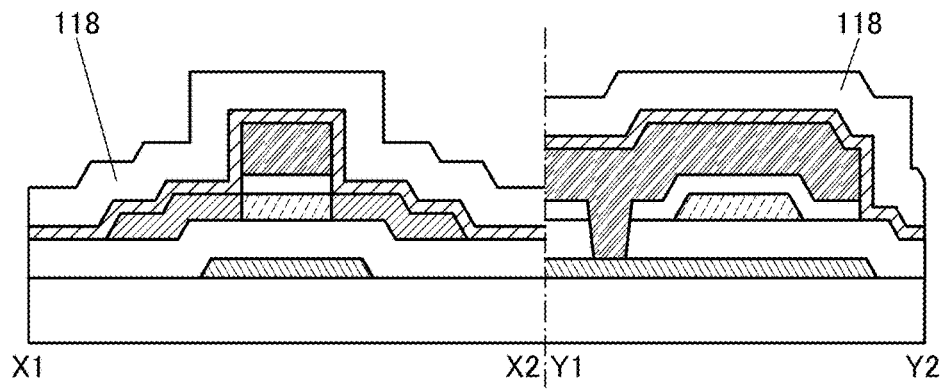
FIGS. 9A to 9C are cross-sectional views illustrating a manufacturing method of a semiconductor device.

Next, the insulating film 118 is formed over the insulating film 116 (see FIG. 9A).

The insulating film 118 can be formed using a material selected from the above-mentioned materials. In this embodiment, as the insulating film 118, a 300-nm-thick silicon oxynitride film is formed with a PECVD apparatus.

Figure 9B:
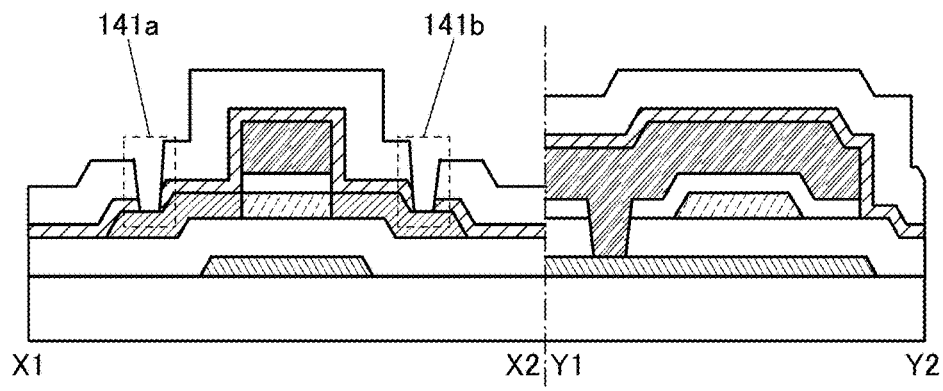

Subsequently, a mask is formed by lithography in a desired position over the insulating film 118, and then the insulating film 118 and the insulating film 116 are partly etched, so that the opening 141$a$ and the opening 141$b$ reaching the regions 108$n$ are formed (see FIG. 9B).

To etch the insulating film 118 and the insulating film 116, a wet etching method and/or a dry etching method can be used. In this embodiment, the insulating film 118 and the insulating film 116 are processed by a dry etching method.

Figure 9C:
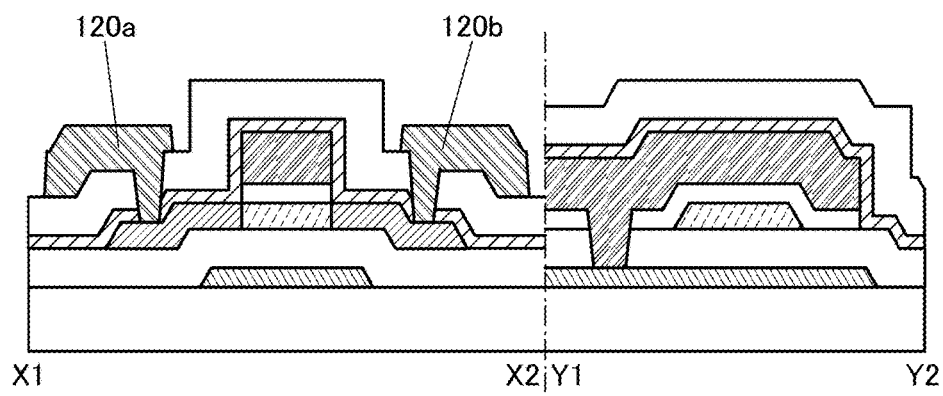

Next, a conductive film is formed over the regions 108$n$ and the insulating film 118 so as to cover the openings 141$a$ and 141$b$, and the conductive film is processed into a desired shape, whereby the conductive films 120$a$ and 120$b$ are formed (see FIG. 9C).

The conductive films 120$a$ and 120$b$ can be formed using a material selected from the above-mentioned materials. In this embodiment, for the conductive films 120$a$ and 120$b$, a stack including a 50-nm-thick tungsten film and a 400-nm-thick copper film is formed with a sputtering apparatus.

To process the conductive film to be the conductive films 120$a$ and 120$b$, a wet etching method and/or a dry etching method can be used. In this embodiment, in the processing of the conductive film into the conductive films 120$a$ and 120$b$, the copper film is etched by a wet etching method, and then the tungsten film is etched by a dry etching method.

Then, the insulating film 122 is formed to cover the conductive films 120$a$ and 120$b$ and the insulating film 118.

Through the above steps, the transistor 150 in FIGS. 5A to 5C can be manufactured.

Note that the films included in the transistor 150 (the insulating film, the metal oxide film, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although a sputtering method and a PECVD method are typical examples of the deposition method, a thermal CVD method may be used. As an example of a thermal CVD method, a metal organic chemical vapor deposition (MOCVD) method can be given.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

The films such as the conductive films, the insulating films, and the metal oxide films that are described above can be formed by a thermal CVD method such as an MOCVD method.

For example, in the case where a hafnium oxide film is formed with a deposition apparatus employing an ALD method, two kinds of gases are used, namely, ozone ($O_3$) as an oxidizer and a source gas that is obtained by vaporizing liquid containing a solvent and a hafnium precursor (hafnium alkoxide or hafnium amide such as tetrakis(dimethylamide)hafnium (TDMAH, $Hf[N(CH_3)_2]_4$) or tetrakis(ethylmethylamide)hafnium).

In the case where an aluminum oxide film is formed with a deposition apparatus employing an ALD method, two kinds of gases are used, namely, $H_2O$ as an oxidizer and a source gas that is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be formed, and radicals of an oxidizing gas ($O_2$ or dinitrogen monoxide) are supplied to react with the adsorbate.

In the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

In the case where a metal oxide such as an In—Ga—Zn—O film is formed with a deposition apparatus employing an ALD method, an $In(CH_3)_3$ gas and an $O_3$ gas are used to form an In—O layer, a $Ga(CH_3)_3$ gas and an $O_3$ gas are used to form a Ga—O layer, and then, a $Zn(CH_3)_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed by using these gases. Note that although an $H_2O$ gas that is obtained by bubbling water with an inert gas such as Ar may be used instead of an $O_3$ gas, it is preferable to use an $O_3$ gas, which does not contain H.

The above is the description of the manufacturing method of a semiconductor device.

At least part of this embodiment can be implemented in combination with any of the other embodiments and the other examples described in this specification as appropriate.

Embodiment 3

In this embodiment, the composition of a cloud-aligned composite oxide semiconductor (CAC-OS) included in the oxide semiconductor film of one embodiment of the present invention is described.
<3-1. Composition of CAC>

The CAC has, for example, a composition in which elements included in an oxide semiconductor film are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor film, a state in which one or more metal elements are mixed is referred to as a mosaic pattern or a patch-like pattern. Regions of the metal element each have a size of greater than or equal to 0.5 nm and less than or equal to 10 nm, preferably greater than or equal to 1 nm and less than or equal to 2 nm, or a similar size.

For example, of In—Ga—Zn oxide (hereinafter also referred to as IGZO), CAC-IGZO has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is distributed in the oxide semiconductor film. This composition is also referred to as a cloud-like composition.

That is, CAC-IGZO is a composite oxide semiconductor film having a composition in which a region including $In_{X2}Zn_{Y2}O_{Z2}$ or $InO_{X1}$ as a main component and a region including $GaO_{X3}$ as a main component are distributed unevenly and mixed. Surrounding portions of the region including $In_{X2}Zn_{Y2}O_{Z2}$ or $InO_{X1}$ as a main component and the region including $GaO_{X3}$ as a main component are unclear (blurred), so that a boundary is not clearly observed in some cases.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

In contrast, the CAC relates to the material composition. In a material composition of a CAC-OS including In, Ga, Zn, and O, nanoparticle regions including Ga as a main component are observed in part of the CAC-OS and nanoparticle regions including In as a main component are observed in part thereof. Therefore, the crystal structure is a secondary element for the CAC composition. Note that the region including Ga as a main component and the region including In as a main component can be examined by EDX mapping. Note that the region including Ga as a main component and the region including In as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that a boundary is not clearly observed in some cases.

Note that in the CAC composition, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases. For example, the density of an element which is a main component is gradually lowered from the central portion of the region toward the surrounding portion. For example, the number (abundance) of atoms of an element countable in an EDX mapping image of a cross-sectional photograph has a gradual change, and thus, the surrounding portion of the region is unclear (blurred) in the EDX mapping image. Specifically, from the central portion toward the surrounding portion in the region including $GaO_{X3}$ as a main component, the number of Ga atoms gradually reduces and the number of Zn atoms gradually increases, so that a region including $Ga_xZn_yO_z$ as a main component gradually appears. Accordingly, the surrounding portion of the region including $GaO_{X3}$ as a main component is unclear (blurred) in the EDX mapping image.
<3-2. Analysis of CAC-IGZO>

Next, measurement results of an oxide semiconductor film over a substrate by a variety of methods are described.
[Structure of Samples and Formation Method Thereof]

Nine samples of one embodiment of the present invention are described below. The samples are formed at different substrate temperatures and with different ratios of an oxygen gas flow rate in formation of the oxide semiconductor film. Note that each sample includes a substrate and an oxide semiconductor film over the substrate.

A method for forming the samples is described.

A glass substrate is used as the substrate. Over the glass substrate, a 100-nm-thick In—Ga—Zn oxide is formed as an oxide semiconductor film with a sputtering apparatus. The formation conditions are as follows: the pressure in a chamber is 0.6 Pa, and a metal oxide target (with an atomic ratio of In:Ga:Zn=4:2:4.1) is used as a target. The metal oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

[Analysis by X-Ray Diffraction]

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 11:
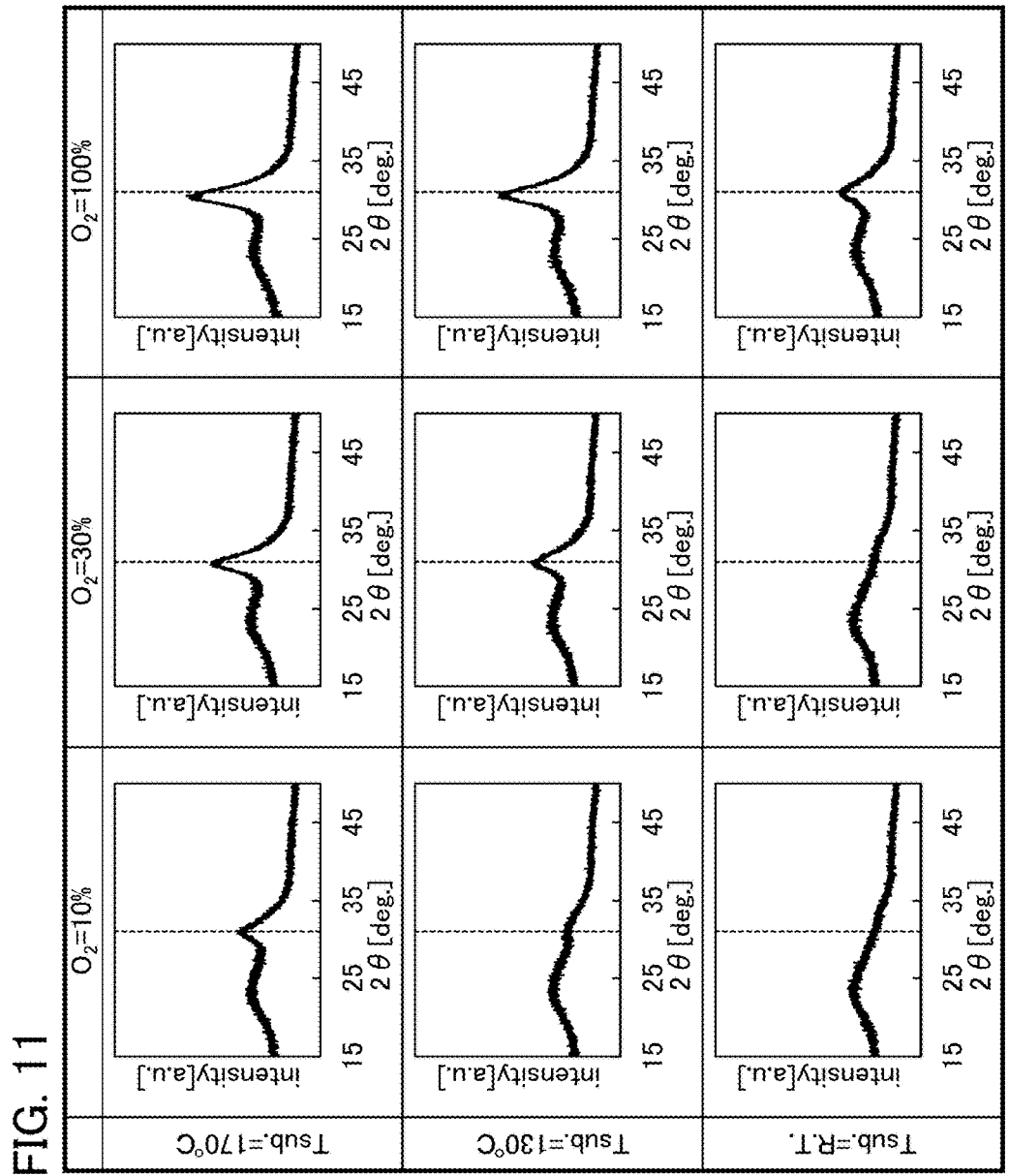
FIG. 11 shows measured XRD spectra.

FIG. 11 shows an XRD spectrum of the samples measured by an Out-of-plane method. In FIG. 11, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 11, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 11, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

[Analysis With Electron Microscope]

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 12A is a plan-view TEM image of the sample formed at a substrate temperature of R.T. and an oxygen gas flow rate ratio of 10%. FIG. 12B is a cross-sectional TEM image of the sample formed at a substrate temperature of R.T. and with an oxygen gas flow rate ratio of 10%.

[Analysis of Electron Diffraction Patterns]

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 12A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 12C, 12D, 12E, 12F, and 12G show the results of the points indicated by the black dots a1, a2, a3, a4, and a5, respectively.

In FIGS. 12C, 12D, 12E, 12F, and 12G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 12B of the sample formed at a substrate temperature of R.T. and an oxygen gas flow rate ratio of 10% are observed. FIGS. 12H, 12I, 12J, 12K, and 12L show the results of the points indicated by the black dots b1, b2, b3, b4, and b5, respectively.

In FIGS. 12H, 12I, 12J, 12K, and 12L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor film including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor film formed at a low substrate temperature or with a low oxygen gas flow rate ratio is likely to have characteristics distinctly different from those of an oxide semiconductor film having an amorphous structure and an oxide semiconductor film having a single crystal structure.

[Elementary Analysis]

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this example, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 13A:
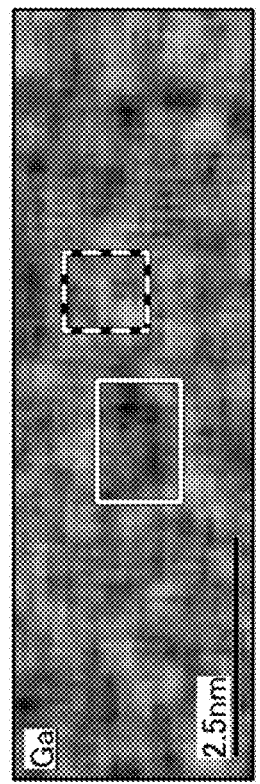
FIGS. 13A to 13C show EDX mapping images of a sample.
Figure 13B:
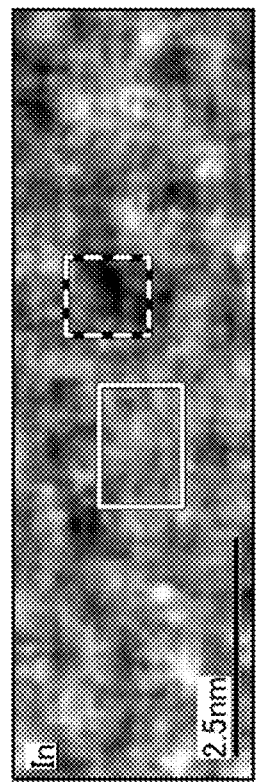
Figure 13C:
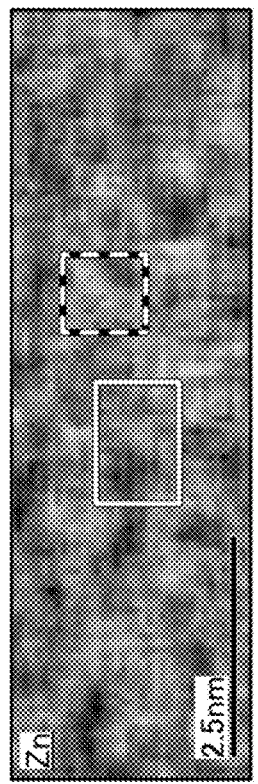

FIGS. 13A to 13C show EDX mapping images in a cross section of the sample formed at a substrate temperature of R.T. and with an oxygen gas flow rate ratio of 10%. FIG. 13A shows an EDX mapping image of Ga atoms. The proportion of the Ga atoms in all the atoms is 1.18 atomic % to 18.64 atomic %. FIG. 13B shows an EDX mapping image of In atoms. The proportion of the In atoms in all the atoms is 9.28 atomic % to 33.74 atomic %. FIG. 13C shows an EDX mapping image of Zn atoms. The proportion of the Zn atoms in all the atoms is 6.69 atomic % to 24.99 atomic %. FIGS. 13A to 13C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 13A to 13C is 7200000 times.

The EDX mapping images in FIGS. 13A to 13C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 13A to 13C are examined.

In FIG. 13A, a relatively dark region occupies a large area in the area surrounded by the solid line, while a relatively bright region occupies a large area in the area surrounded by the dashed line. In FIG. 13B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 13C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 13C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 13A to 13C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a structure in which the regions including GaO as a main component and the regions including $In_{X2}Zn_{Y2}O_{Z2}$ or $InO_{X1}$ as main components are unevenly distributed and mixed can be referred to as CAC-IGZO.

As shown in FIGS. 13A to 13C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 0.3 nm and less than or equal to 3 nm. Note that it is preferable that a diameter of a region including each metal element as a main component be greater than or equal to 1 nm and less than or equal to 2 nm in the EDX mapping images.

As described above, CAC-IGZO has a structure different from that of an IGZO compound in which metal elements are evenly distributed, and has characteristics different from those of the IGZO compound. That is, CAC-IGZO includes regions including $GaO_{X3}$ or the like as a main component and regions including $In_{X2}Zn_{Y2}O_{Z2}$ or $InO_{X1}$ as a main component. Accordingly, when CAC-IGZO is used for a semiconductor element, the property derived from $GaO_{X3}$ or the like and the property derived from $In_{X2}Zn_{Y2}O_{Z2}$ or $InO_{X1}$ complement each other, whereby high on-state current (Ion) and high field-effect mobility (μ) can be achieved.

Note that the conduction mechanism of a semiconductor element including CAC-IGZO that achieves high on-state current (Ion) and high field-effect mobility (μ) can be presumed by a random-resistance-network model in percolation theory.

A semiconductor element including CAC-IGZO has high reliability. Thus, CAC-IGZO is suitably used in a variety of semiconductor devices typified by a display.

At least part of this embodiment can be implemented in combination with any of the other embodiments described in this specification as appropriate.

Embodiment 4

In this embodiment, examples of a display device that includes the semiconductor device described in the above embodiments are described below with reference to FIG. 14 to FIG. 19.

<4-1. Structure Example of Display Device>

Figure 14:
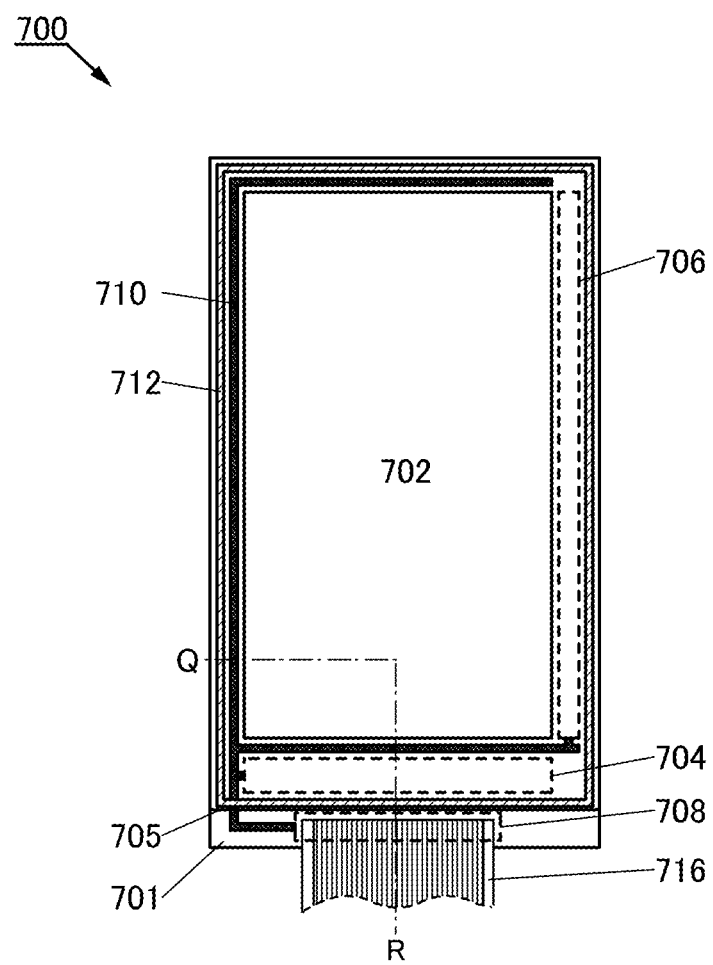
FIG. 14 is a top view of one embodiment of a display device.

FIG. 14 is a top view illustrating an example of a display device. A display device 700 in FIG. 14 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 14, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include a variety of elements. As examples of the elements, an electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink element, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), a piezoelectric ceramic display, and the like can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink element or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and power consumption can be reduced by approximately 20% to 30% in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 15:
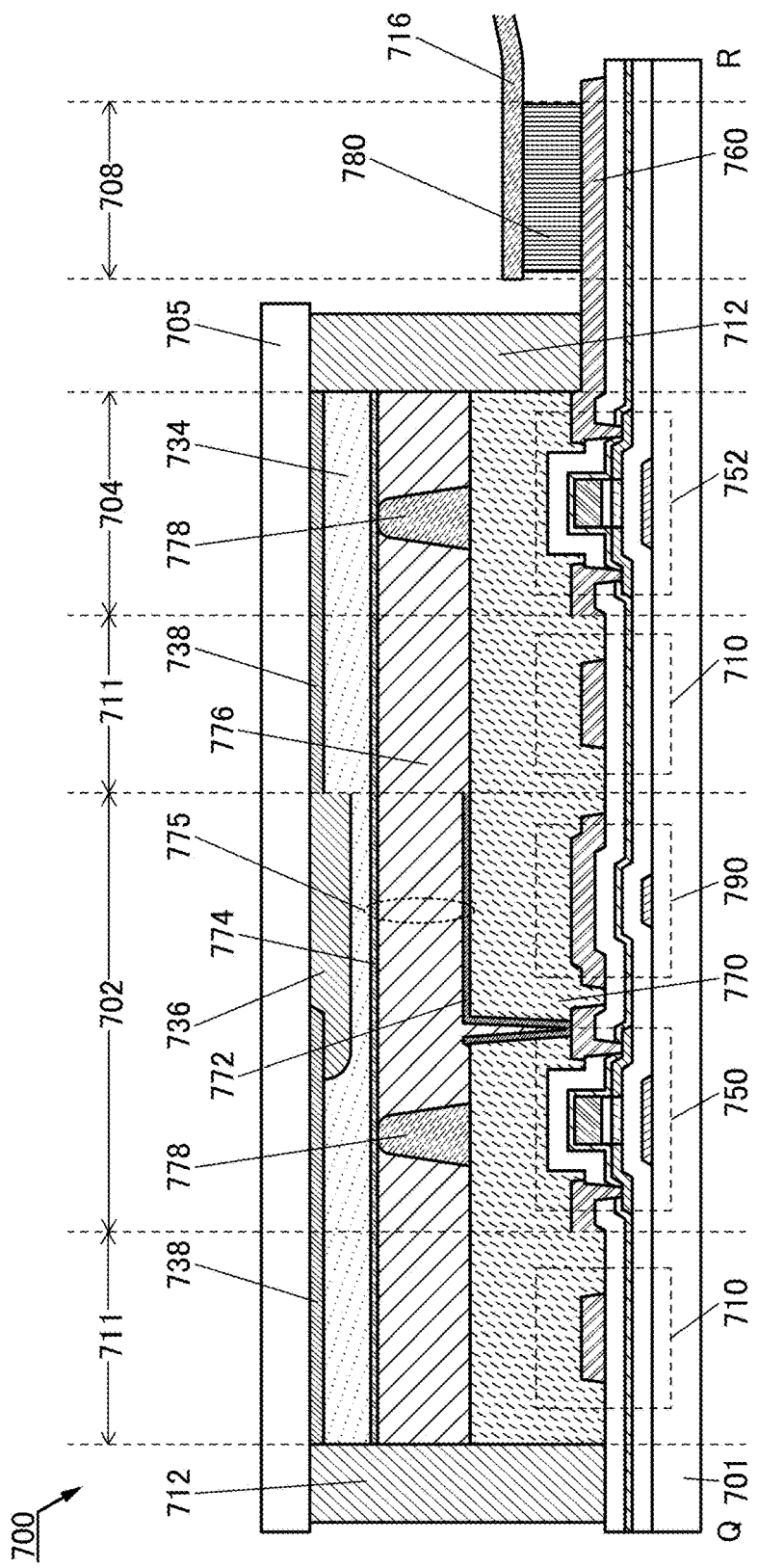
FIG. 15 is a cross-sectional view of one embodiment of a display device.
Figure 16:
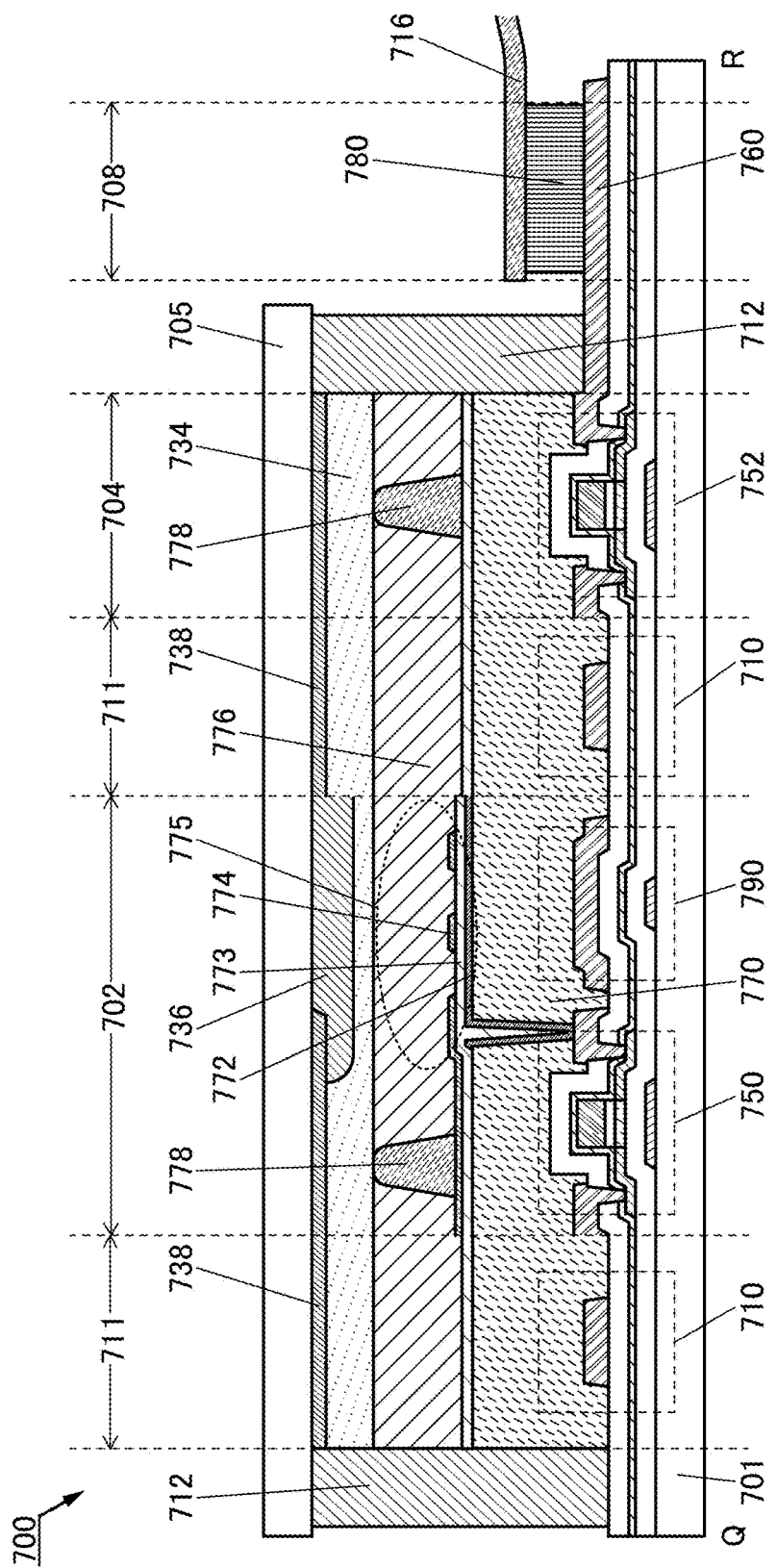
FIG. 16 is a cross-sectional view of one embodiment of a display device.
Figure 17:
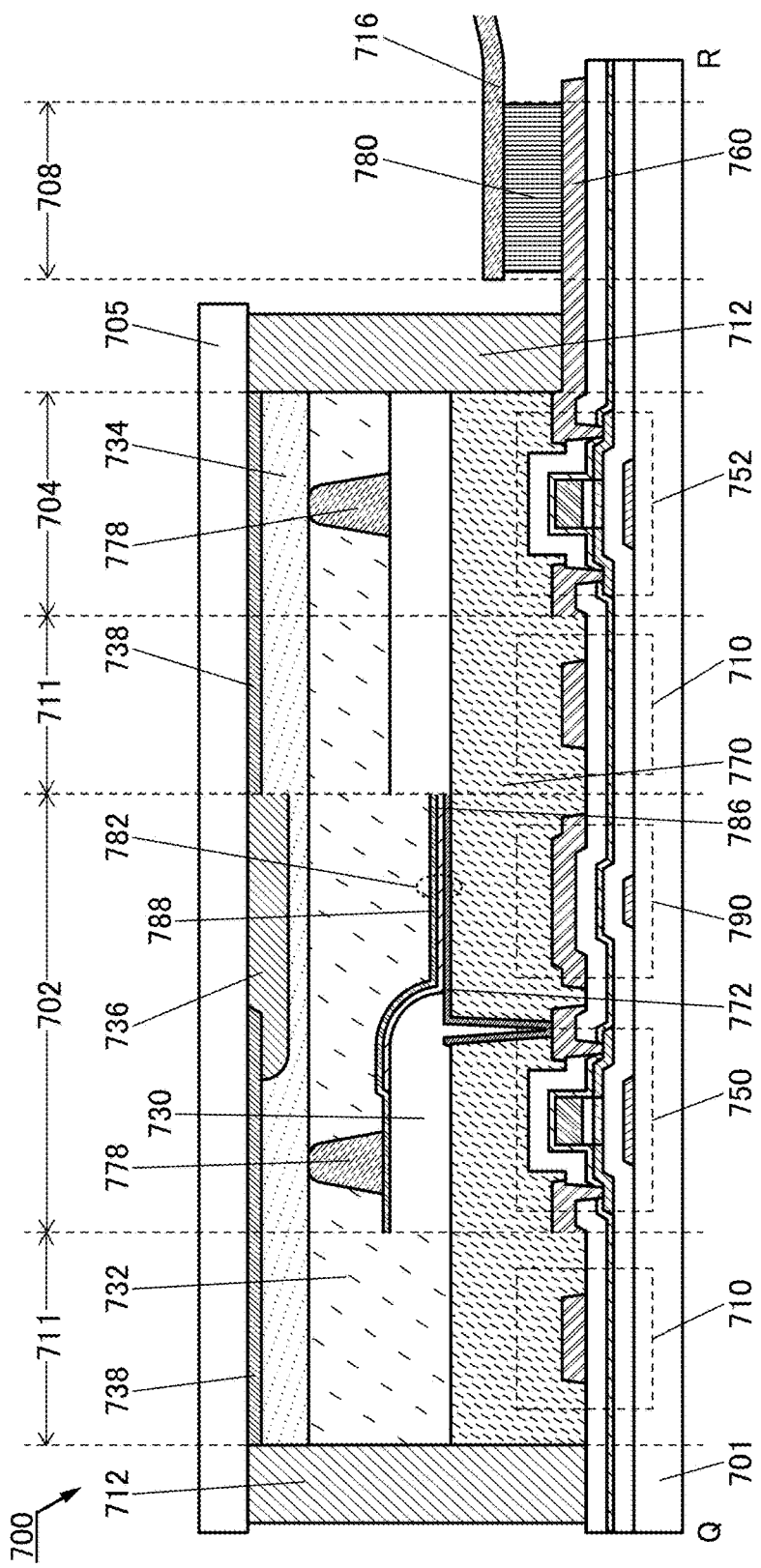
FIG. 17 is a cross-sectional view of one embodiment of a display device.

In this embodiment, a structure including a liquid crystal element as a display element and a structure including an EL element as a display element are described with reference to FIG. 15 to FIG. 17. FIG. 15 and FIG. 16 are cross-sectional views taken along dashed-dotted line Q-R in FIG. 14 and illustrate the structure including a liquid crystal element as a display element. FIG. 17 is a cross-sectional view taken along dashed-dotted line Q-R in FIG. 14 and illustrates the structure including an EL element as a display element.

Portions common to FIG. 15 to FIG. 17 are described first, and then, different portions are described.

<4-2. Portions Common to Display Devices>

Figure 19:
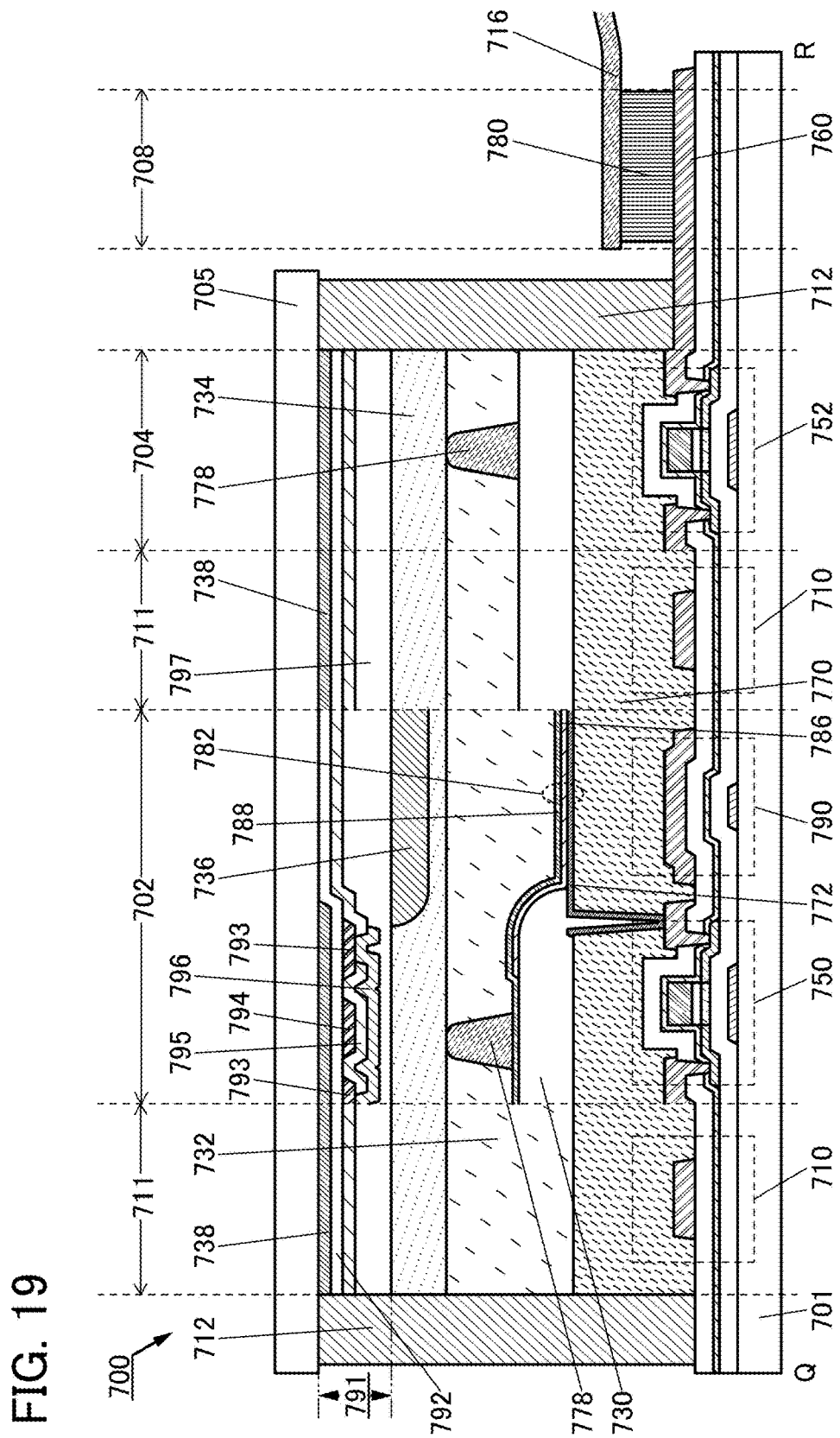
FIG. 19 is a cross-sectional view of one embodiment of a display device.

The display device 700 in FIG. 15 and FIG. 19 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 150 described above. Note that the transistor 750 and the transistor 752 may each have the structure of any of the other transistors described in the above embodiments.

The transistor used in this embodiment includes a oxide semiconductor film that is highly purified and in which formation of oxygen vacancies is inhibited. The transistor can have a low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as source and drain electrodes of the transistor 750. Between the lower electrode and the upper electrode, an insulating film formed through a step of forming an insulating film to be an insulating film functioning as a first gate insulating film of the transistor 750 and insulating films formed through a step of forming insulating films to be insulating films functioning as protective insulating films over the transistor 750 are provided. That is, the capacitor 790 has a stacked-layer structure in which an insulating film functioning as a dielectric film is positioned between the pair of electrodes.

In FIG. 15 to FIG. 17, a planarization insulating film 770 is provided over the transistor 750, the transistor 752, and the capacitor 790.

Although FIG. 15 to FIG. 17 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which the bottom-gate transistor is used in the pixel portion 702 and the top-gate transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<4-3. Structure Example of Display Device Using Liquid Crystal Element>

The display device 700 in FIG. 15 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 15 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as a source electrode or a drain electrode included in the transistor 750. The conductive film 772 is formed over the planarization insulating film 770 to function as a pixel electrode, i.e., one electrode of the display element.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light.

In the case where a conductive film that reflects visible light is used as the conductive film 772, the display device 700 is a reflective liquid crystal display device. In the case where a conductive film that transmits visible light is used as the conductive film 772, the display device 700 is a transmissive liquid crystal display device.

When a structure over the conductive film 772 is changed, a driving method of a liquid crystal element can vary. An example in that case is shown in FIG. 16. The display device 700 illustrated in FIG. 16 is an example of employing a transverse electric field mode (e.g., an FFS mode) as a driving mode of the liquid crystal element. In the structure illustrated in FIG. 16, an insulating film 773 is provided over the conductive film 772, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 15 and FIG. 16, the conductive film 772 and/or the conductive film 774 may be provided with an alignment film on a side in contact with the liquid crystal layer 776. Although not illustrated in FIG. 15 and FIG. 16, an optical member (optical substrate) and the like such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is a liquid crystal phase, which is generated just before transition from a cholesteric phase to an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<4-4. Display Device Including Light-Emitting Element>

The display device 700 illustrated in FIG. 17 includes the light-emitting element 782. The light-emitting element 782 includes a conductive film 772, an EL layer 786, and a conductive film 788. The display device 700 illustrated in FIG. 17 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 17, an insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 17, in which the coloring film 736 is provided. For example, a structure without the coloring film 736 may also be employed in the case where the EL layer 786 is formed by separate coloring.

<4-5. Structure Example of Display Device Provided With Input/Output Device>

An input/output device may be provided in the display device 700 illustrated in FIG. 16 and FIG. 17. As an example of the input/output device, a touch panel or the like can be given.

Figure 18:
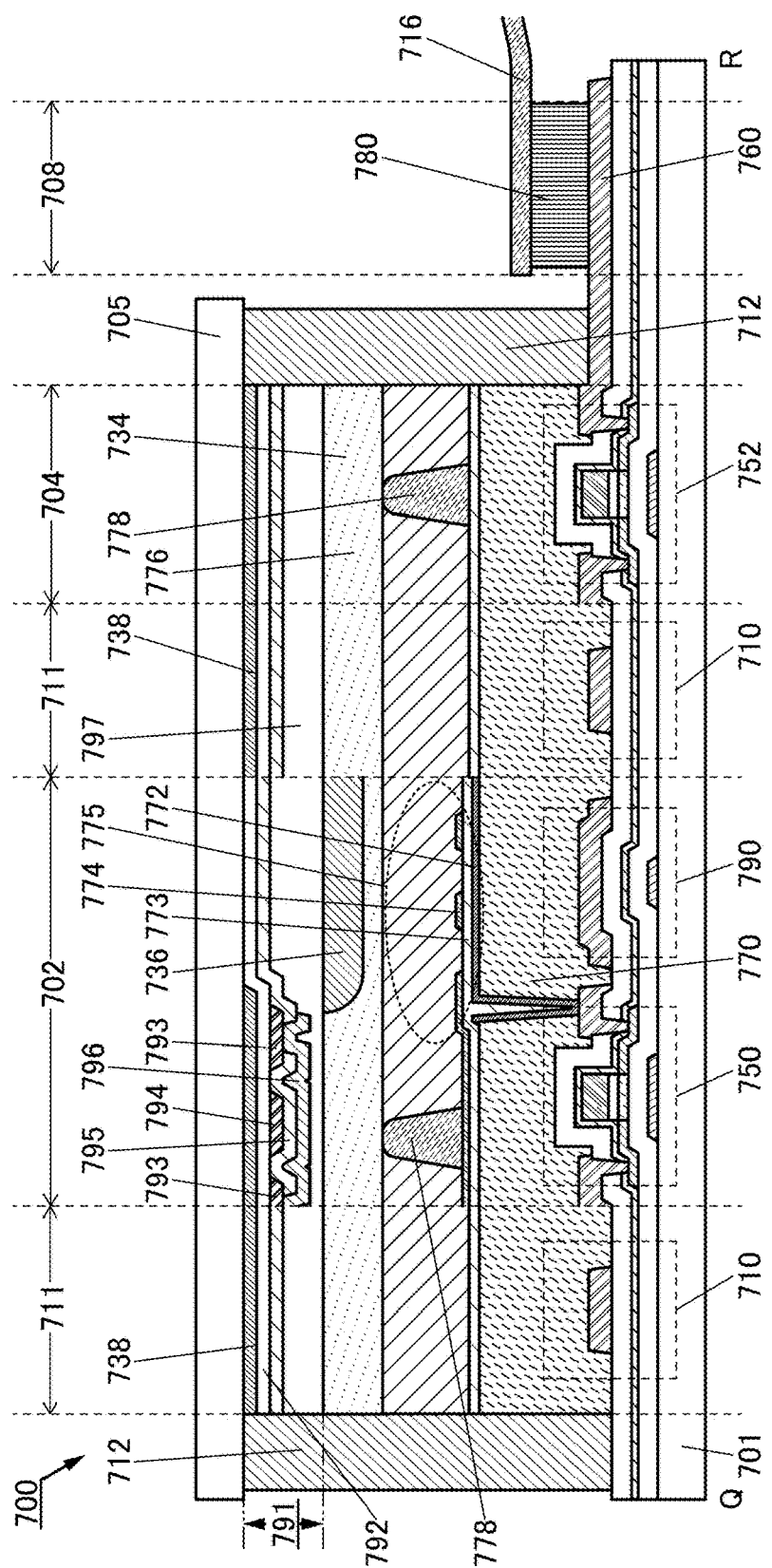
FIG. 18 is a cross-sectional view of one embodiment of a display device.

FIG. 18 illustrates a structure in which the display device 700 shown in FIG. 16 includes a touch panel 791. FIG. 19 illustrates a structure in which the display device 700 shown in FIG. 17 includes the touch panel 791.

FIG. 18 is a cross-sectional view of the structure in which the touch panel 791 is provided in the display device 700 illustrated in FIG. 16. FIG. 19 is a cross-sectional view of the structure in which the touch panel 791 is provided in the display device 700 illustrated in FIG. 17.

First, the touch panel 791 illustrated in FIG. 18 and FIG. 19 is described below.

The touch panel 791 illustrated in FIG. 18 and FIG. 19 is an in-cell touch panel provided between the substrate 705 and the coloring film 736. The touch panel 791 is formed on the substrate 705 side before the light-blocking film 738 and the coloring film 736 are formed.

The touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

A portion in which the electrode 793 intersects with the electrode 794 is illustrated in the upper portion of the transistor 750 illustrated in FIG. 18 and FIG. 19. Through openings in the insulating film 795, the electrode 796 is electrically connected to the two electrodes 793 between which the electrode 794 is positioned. Note that a structure in which a region where the electrode 796 is provided is provided in the pixel portion 702 is illustrated in FIG. 18 and FIG. 19 as an example; however, one embodiment of the present invention is not limited thereto. For example, the region where the electrode 796 is provided may be provided in the source driver circuit portion 704.

The electrodes 793 and 794 are provided in a region overlapping with the light-blocking film 738. As illustrated in FIG. 18, it is preferable that the electrode 793 do not overlap with the light-emitting element 782. As illustrated in FIG. 19, it is preferable that the electrode 793 do not overlap with the liquid crystal element 775. In other words, the electrode 793 has an opening in its region overlapping with the light-emitting element 782 and the liquid crystal element 775. That is, the electrode 793 has a mesh shape. With this structure, the electrode 793 does not block light emitted from the light-emitting element 782. Alternatively, the electrode 793 can have a structure which does not block light transmitted through the liquid crystal element 775. Thus, since luminance is hardly reduced even when the touch panel 791 is placed, a display device with high visibility and low power consumption can be achieved. Note that the electrode 794 can have a similar structure.

In addition, since the electrodes 793 and 794 do not overlap with the light-emitting element 782, the electrodes 793 and 794 can be formed using a metal material with low visible light transmittance. In the case where the electrode 793 and the electrode 794 do not overlap with the liquid crystal element 775, a metal material having low transmittance with respect to visible light can be used for the electrode 793 and the electrode 794.

Accordingly, the resistance of the electrodes 793 and 794 can be reduced as compared with an electrode using an oxide material with high visible light transmittance, so that the sensitivity of the touch panel can be increased.

For example, conductive nanowires may be used for the electrodes 793, 794, and 796. The nanowires may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of the electrodes 664, 665, and 667, the transmittance of visible light can be greater than or equal to 89% and the sheet resistance can be greater than or equal to 40 Ω/square and less than or equal to 100 Ω/square.

Although the structure of the in-cell touch panel is illustrated in FIG. 18 and FIG. 19, one embodiment of the present invention is not limited thereto. For example, a touch panel formed over the display device 700 (an on-cell touch panel), or a touch panel attached to the display device 700 (an out-cell touch panel) may be used.

In this manner, the display device of one embodiment of the present invention can be combined with various types of touch panels.

At least part of this embodiment can be implemented in combination with any of the other embodiments described in this specification as appropriate.

Embodiment 5

In this embodiment, a display device including a semiconductor device of one embodiment of the present invention is described with reference to FIGS. 20A to 20C.

<Circuit Configuration of Display Device>

A display device illustrated in FIG. 20A includes a region including pixels (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504*a*) and a circuit for supplying a signal (data signal) to drive a display element in a pixel (hereinafter, the circuit is referred to as a source driver 504*b*).

The gate driver 504*a* includes a shift register or the like. The gate driver 504*a* receives a signal for driving the shift register through the terminal portion 507 and outputs a signal. For example, the gate driver 504*a* receives a start pulse signal, a clock signal, or the like and outputs a pulse signal. The gate driver 504*a* has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GLm, and a data signal is input from the source driver 504b through the data line DL_n in accordance with the potential of the scan line GL_m.

Figure 20A:
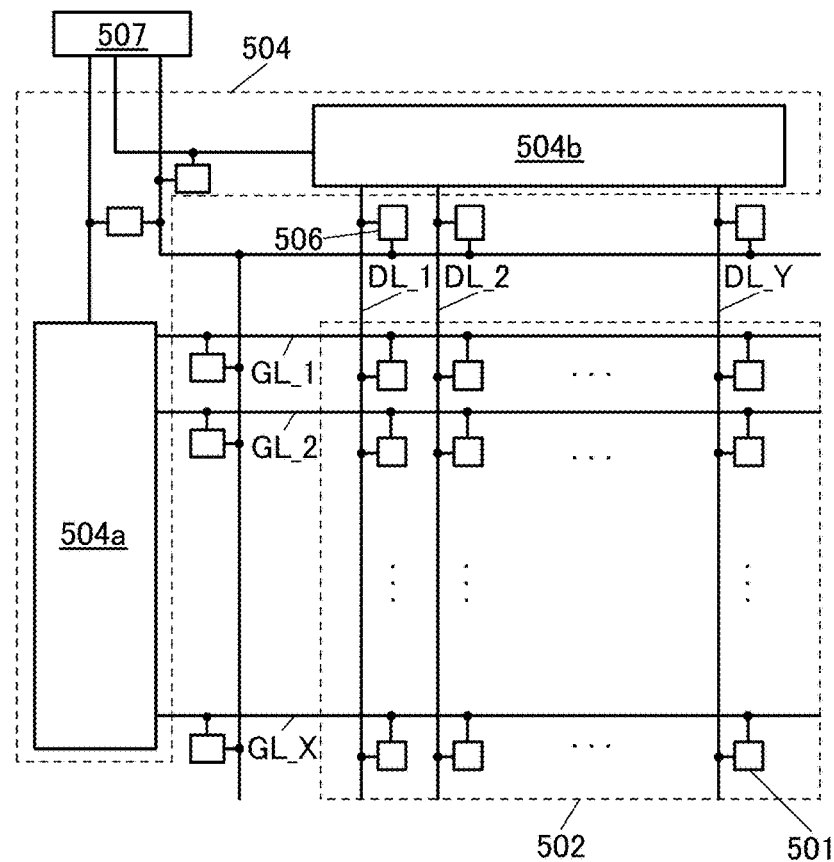
FIGS. 20A to 20C are a block diagram and circuit diagrams illustrating a display device.

The protection circuit 506 in FIG. 20A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 20A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 20A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single crystal semiconductor film or a polycrystalline semiconductor film) may be mounted.

Figure 20B:
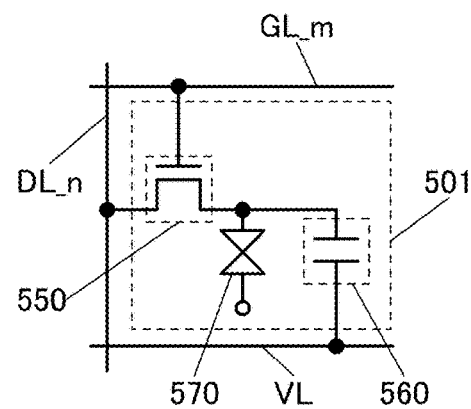

Each of the plurality of pixel circuits 501 in FIG. 20A can have the configuration illustrated in FIG. 20B, for example.

The pixel circuit 501 in FIG. 20B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 20B, the gate driver 504a in FIG. 20A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 20C:
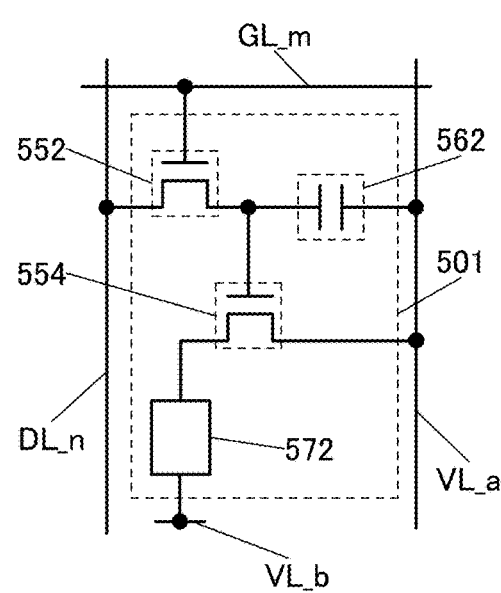

Alternatively, each of the plurality of pixel circuits 501 in FIG. 20A can have the configuration illustrated in FIG. 20C, for example.

The pixel circuit 501 in FIG. 20C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a data line DL_n, and a gate electrode of the transistor 552 is electrically connected to a scan line GL_m.

The transistor 552 is configured to be turned on or off to control whether a data signal is written.

One of a pair of electrodes of the capacitor 562 is electrically connected to a potential supply line VL_a, and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 20C, the gate driver 504a in FIG. 20A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments described in this specification as appropriate.

Embodiment 6

In this embodiment, a display module and electronic devices, each of which includes a semiconductor device of one embodiment of the present invention, are described with reference to FIG. 21, FIGS. 22A to 22E, and FIGS. 23A to 23G.

<6-1. Display Module>

Figure 21:
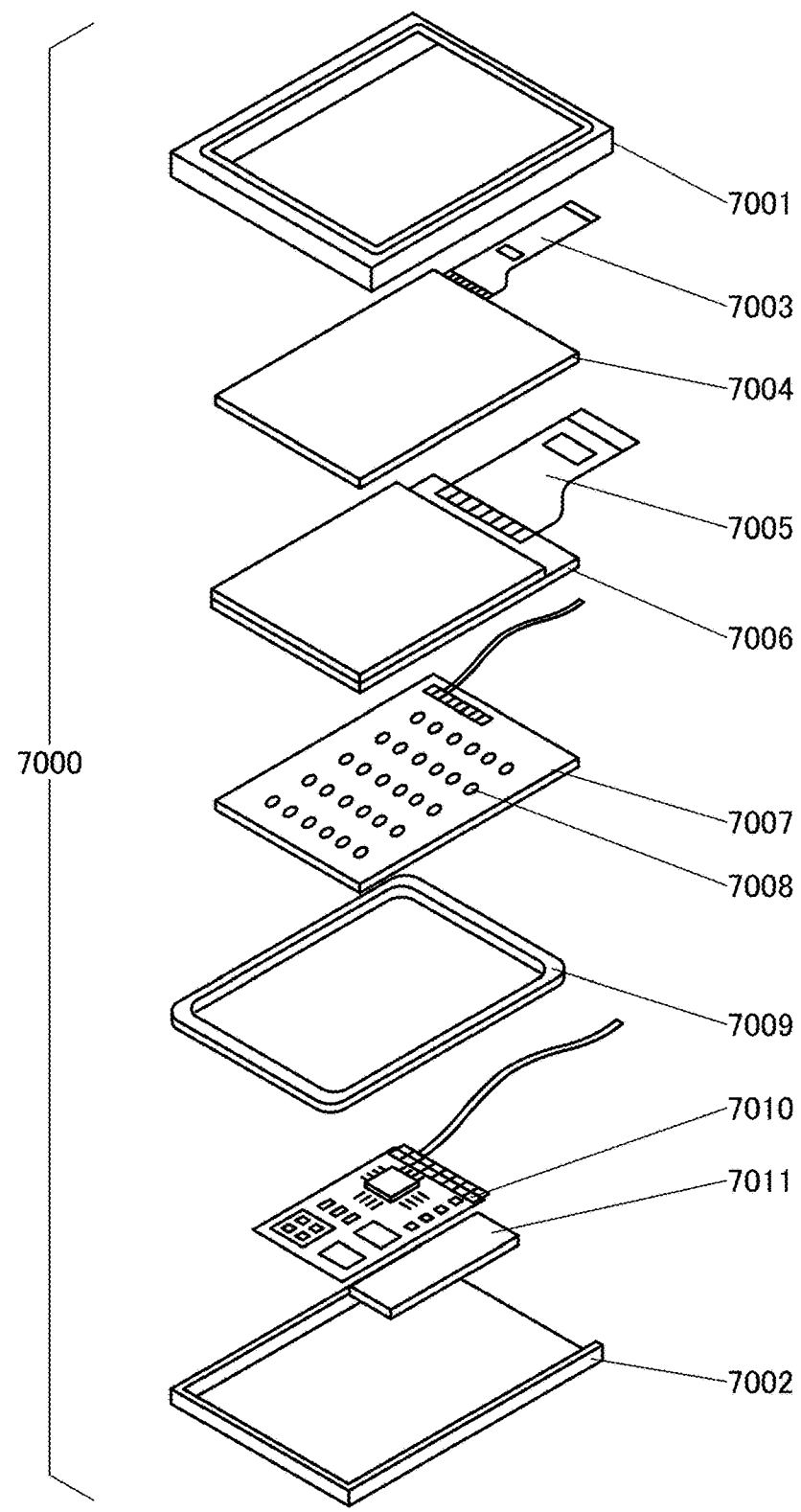
FIG. 21 illustrates a display module.

In a display module 7000 illustrated in FIG. 21, a touch panel 7004 connected to an FPC 7003, a display panel 7006 connected to an FPC 7005, a backlight 7007, a frame 7009, a printed-circuit board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 21, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed-circuit board 7010. The frame 7009 may also function as a radiator plate.

The printed-circuit board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<6-2. Electronic Device 1>

Next, FIGS. 22A to 22E illustrate examples of electronic devices.

Figure 22A:
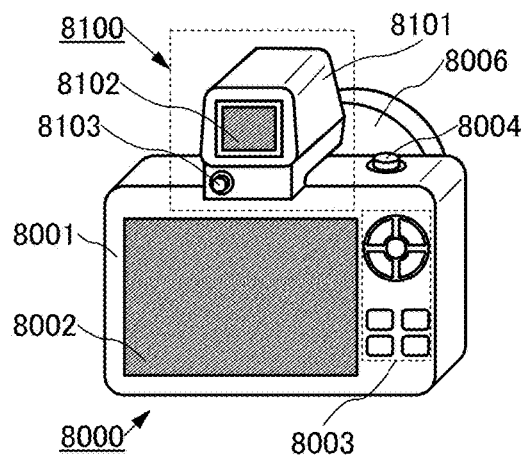
FIGS. 22A to 22E illustrate electronic devices.

FIG. 22A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 22A, the housing 8001 of the camera 8000 may include a finder having a display device.

Figure 22B:
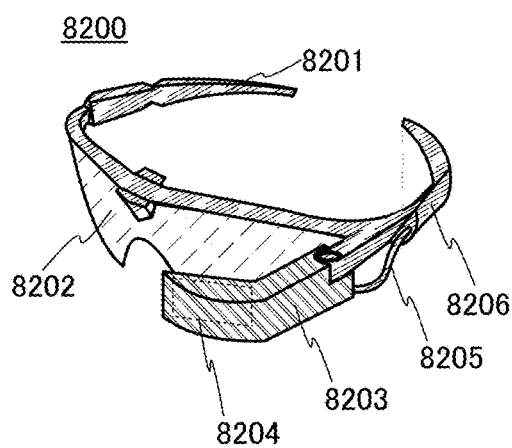

FIG. 22B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input unit.

The mounting portion 8201 may include a plurality of electrodes so as to be in contact with the user. The main body 8203 may be configured to sense current flowing through the electrodes with the movement of the user's eyeball to recognize the points the user looks at. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 22C:
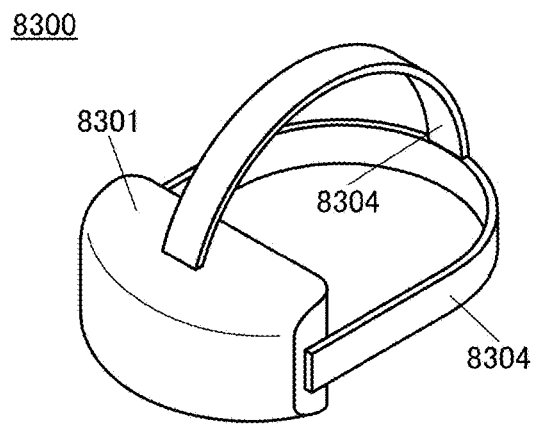
Figure 22D:
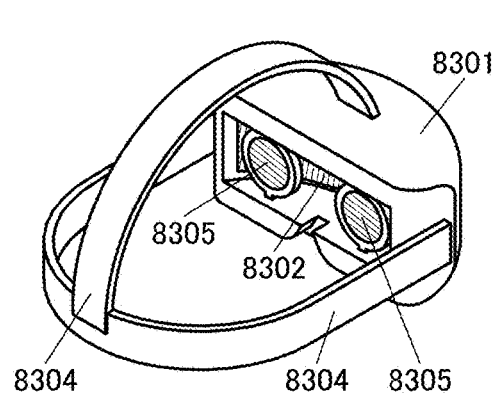
Figure 22E:
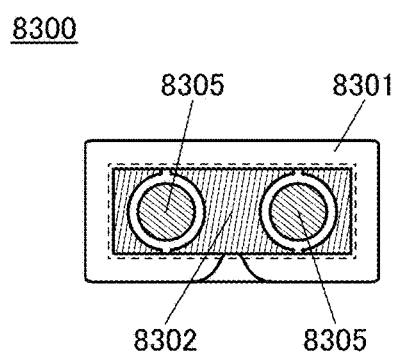

FIGS. 22C to 22E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 22E, the user does not perceive pixels, and thus a more realistic image can be displayed.

<6-3. Electronic Device 2>

Next, FIGS. 23A to 23G illustrate examples of electronic devices that are different from those illustrated in FIGS. 22A to 22E.

Electronic devices illustrated in FIGS. 23A to 23G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 23A to 23G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices in FIGS. 23A to 23G are not limited thereto, and the electronic devices can have a variety of functions. Although not illustrated in FIGS. 23A to 23G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 23A to 23G are described in detail below.

Figure 23A:
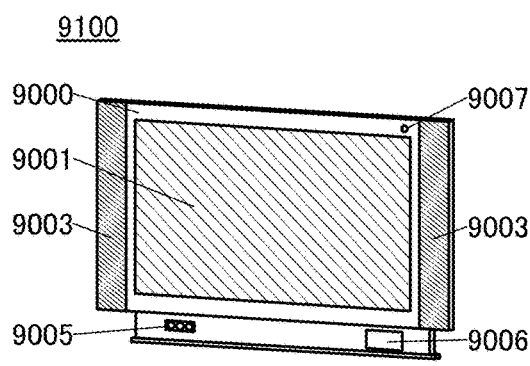
FIGS. 23A and 23G illustrate electronic devices.

FIG. 23A is a perspective view illustrating a television device 9100. The television device 9100 can include the display portion 9001 having a large screen size of, for example, 50 inches or more, or 100 inches or more.

Figure 23B:
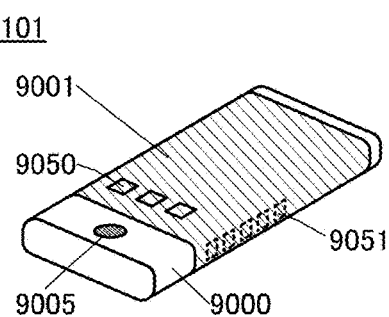

FIG. 23B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include the speaker 9003, the connection terminal 9006, the sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 23C:
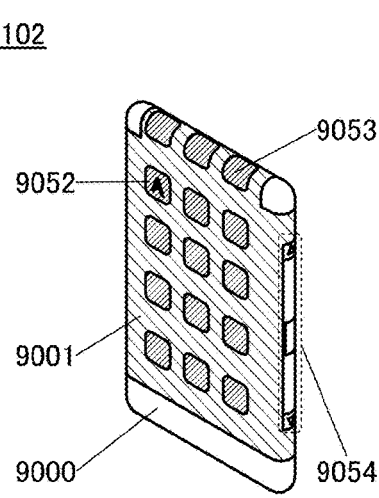

FIG. 23C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

Figure 23D:
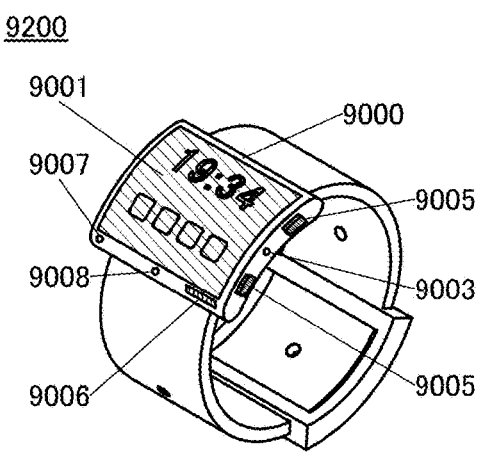

FIG. 23D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 23E:
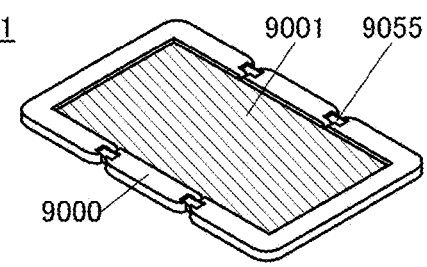
Figure 23F:
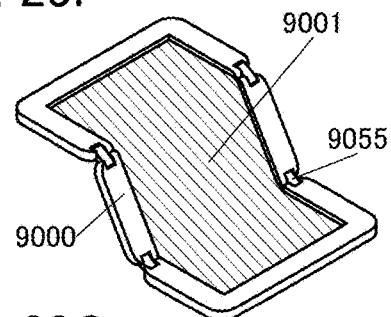
Figure 23G:
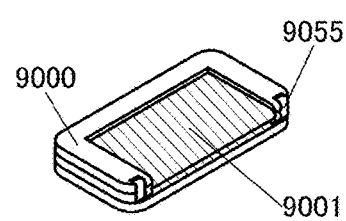

FIGS. 23E, 23F, and 23G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with any of the other embodiments described in this specification as appropriate.

Example 1

In this example, evaluation results of electrical characteristics of a transistor formed using the manufacturing method of a semiconductor device, which is one embodiment of the present invention, will be described.

The transistor has a structure similar to the transistor 150 in Embodiment 2.

[Fabrication of Sample]

In this example, a plurality of samples was fabricated in different conditions of heat treatment before deposition of a metal oxide film.

First, a 10-nm-thick titanium film and a 100-nm-thick copper film were formed over a glass substrate with a sputtering apparatus. This conductive films were processed by a photolithography method, whereby the conductive film serving as a first gate electrode was formed.

Then, four insulating films were stacked over the substrate and the conductive film. The insulating films were formed in succession in a vacuum with a plasma-enhanced chemical vapor deposition (PECVD) apparatus. As the insulating films, a 50-nm-thick silicon nitride film, a 300-nm-thick silicon nitride film, a 50-nm-thick silicon nitride film, and a 50-nm-thick silicon oxynitride film were stacked from the bottom.

Next, the substrate was transferred to a deposition apparatus in two conditions of standby time. The standby time until the substrate was transferred to the apparatus after the insulating films were formed was about five hours and about two weeks. During the standby, the substrate was stored in a state where the surface of the insulating film was exposed to the atmospheric atmosphere.

Next, by a method similar to that in Embodiment 1, the substrate was inserted into the heat treatment chamber with a pressure of about $1\times10^{-5}$ Pa and the insulating was subjected to heat treatment. Here, the process was performed under the following three conditions: 350° C. for 5 minutes, 350° C. for 60 minutes, and 450° C. for 5 minutes. In addition, a comparison sample in which an insulating film is not subjected to heat treatment was fabricated.

Then, a metal oxide film was formed over the insulating film and processed into an island shape, so that a semiconductor layer was formed.

The metal oxide film was formed by a sputtering method after the substrate was transferred to a deposition chamber. The metal oxide film was formed to have a thickness of about 100 nm using a metal oxide target containing indium, gallium, and zinc (In:Ga:Zn=4:2:4.1 [atomic ratio]) and flowing an argon gas and an oxygen gas without heating the substrate (at about 25° C.). The oxygen flow rate in the film formation was 10%.

Next, an insulating film was formed over the insulating film and the oxide semiconductor layer. As the insulating film, a 150-nm-thick silicon oxynitride film was formed with a PECVD apparatus.

Next, heat treatment was performed. Next, heat treatment was performed at 350° C. in a nitrogen gas atmosphere for one hour. Then, plasma treatment was performed in an oxygen-containing atmosphere.

An opening was formed in a desired region of the insulating film. The opening was formed by a dry etching method.

Then, a conductive film was formed over the insulating film and in the opening and the conductive film was processed into an island shape, whereby the conductive film serving as a first gate electrode was formed. In addition, the insulating film in contact with the bottom surface of the conductive film was processed in succession after the formation of the conductive film, whereby the insulating film was formed.

As the conductive film, a 10-nm-thick metal oxide film and a 90-nm-thick metal oxide film were stacked. The metal oxide films were formed by a sputtering method using a metal oxide target containing indium, gallium, and zinc (In:Ga:Zn=4:2:4.1 [atomic ratio]).

Next, plasma treatment was performed from above the metal oxide film, the insulating film, and the conductive film. The plasma treatment was performed with a PECVD apparatus in a mixed gas atmosphere containing an argon gas and a nitrogen gas.

Next, an insulating film was formed over the metal oxide film, the insulating film, and the conductive film. The insulating film was formed by stacking a 100-nm-thick silicon nitride film and a 300-nm-thick silicon oxynitride film with a PECVD apparatus.

Then, a mask was formed over the formed insulating film and an opening was formed in the insulating film with use of the mask.

A conductive film was formed to fill the opening and was processed into an island shape, whereby the conductive film serving as a source electrode and a drain electrode was formed. For the conductive films, a 50-nm-thick titanium film, a 400-nm-thick aluminum film, and a 50-nm-thick titanium film were formed in this order with a sputtering apparatus.

After that, an insulating film was formed over the insulating film and the conductive film. A 1.5-μm-thick acrylic-based photosensitive resin was used for the insulating film.

In such a manner, the sample was manufactured.

[Electrical Characteristics of Transistor]

Next, Id-Vg characteristics of transistors of the fabricated samples were measured. As conditions for measuring the Id-Vg characteristics of each transistor, a voltage applied to the conductive film serving as a first gate electrode of each transistor (hereinafter the voltage is also referred to as gate voltage (Vg)) and a voltage applied to the conductive film serving as the second gate electrode of each transistor (hereinafter the voltage is also referred to as back gate voltage (Vbg)) changed from −15 V to +20 V in increments of 0.25 V. A voltage applied to the conductive film serving as a source electrode (the voltage is also referred to as source voltage (Vs)) was 0 V (comm), and a voltage applied to the conductive film serving as a drain electrode (the voltage is also referred to as drain voltage (Vd)) was 0.1 V and 20 V. The number of measured transistors was 20 for each sample.

Figure 26:
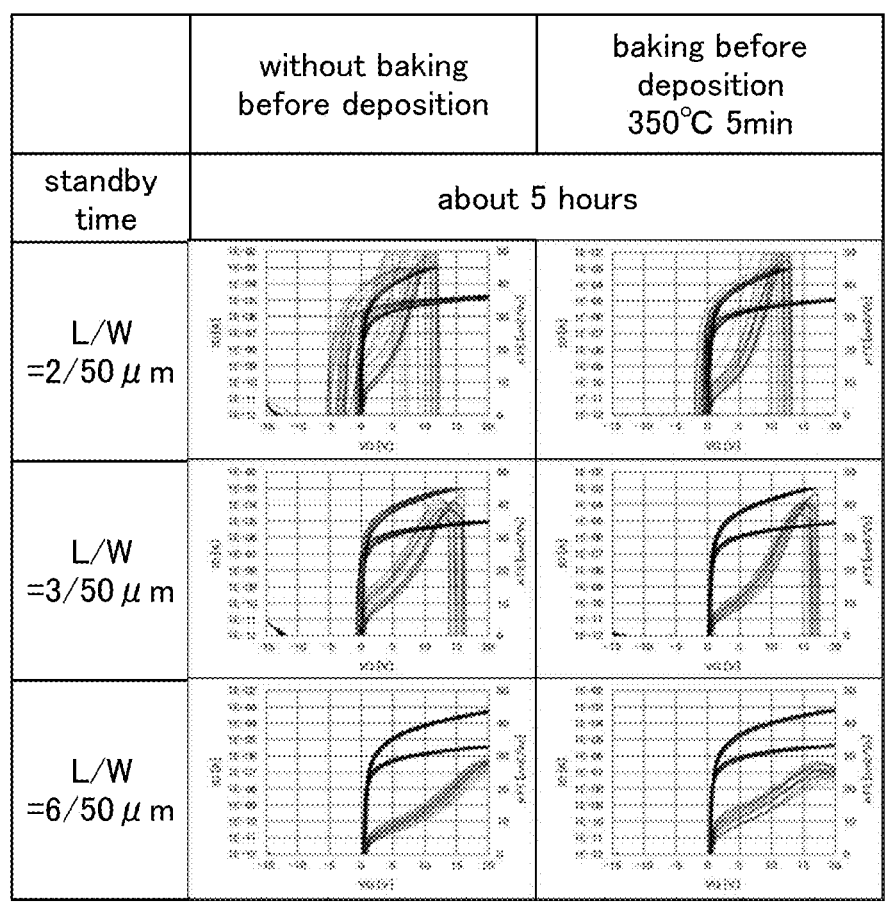
FIG. 26 shows Id-Vg characteristics of transistors.

FIG. 26 shows results when the standby time in heat treatment was about 5 hours. FIG. 26 shows Id-Vg characteristics of a sample without heat treatment ("baking before deposition") on the left and a sample subjected to heat treatment at 350° C. for 5 minutes on the right. The channel lengths L of the transistors are 2 μm, 3 μm, and 6 μm from the above. Note that the channel width W of each transistor is 50 μm.

In the Id-Vg characteristics of FIG. 26, the first vertical axis indicates Id (A), the second vertical axis indicates field-effect mobility (μFE (cm²/Vs)), and the horizontal axis indicates Vg (V). Note that the field-effect mobility was measured when Vd=20 V.

The results in FIG. 26 were obtained with the upper limit of Id in the measurement set to 1 mA. Thus, according to calculation, field-effect mobility is rapidly reduced in a range exceeding the upper limit of Id.

As shown in FIG. 26, the sample with heat treatment has less variation than the sample without heat treatment. The effect of reduction in variation is clearly obtained particularly under the conditions of the shortest channel length L (L/W=2/50 μm).

FIG. 27 shows results under the conditions where the standby time is about two weeks. In other words, FIG. 27 shows results of conditions in which the insulating film adsorbs more water and hydrogen than under the conditions in FIG. 26.

FIG. 27 shows the results of, from the left, a sample without heat treatment, a sample with heat treatment at 350° C. for 5 minutes, a sample with heat treatment at 350° C. for 1 hour, and a sample with heat treatment at 450° C. for 5 minutes.

As found from FIG. 27, variation in electrical characteristics of the sample without heat treatment was large, particularly under the conditions of the shortest channel length L (L/W=2/50 μm). However, variation in electrical characteristics of all the samples with heat treatment was reduced as compared to that of the sample without heat treatment.

Comparing the samples under the conditions of the shortest channel length L (L/W=2/50 μm), the sample that was subjected to heat treatment at the lowest temperature and for the shortest time (350° C., 5 minutes) had less variation than the others. This is probably because heat treatment at lower temperature and for shorter heating time reduced the amount of oxygen, that is, contained in the insulating film and can be supplied to the metal oxide film.

The above results show that transistors whose electrical characteristics are favorable and less vary and reliability is high can be fabricated by the manufacturing method of a semiconductor device according to one embodiment of the present invention.

Example 2

The relationship between heating treatment after the formation of the metal oxide film 108 and electrical characteristics of the transistor 150 described in the above embodiments was examined. Specifically, transistors were formed under 12 different combinations of four conditions of channel length L/channel width W ("L/W"): 1.5/50 um, 2/50 μm, 3/50 μm, and 6/50 μm, and three conditions of heat treatment: no heat treatment, 400° C., and 450° C. For each of the combinations, 20 transistors were formed to measure the Vg-Id characteristics and field effect mobilities (μFE). The backgate potential of the transistor 150 was equal to the gate potential in the measurement of electrical characteristics.

Figure 28:
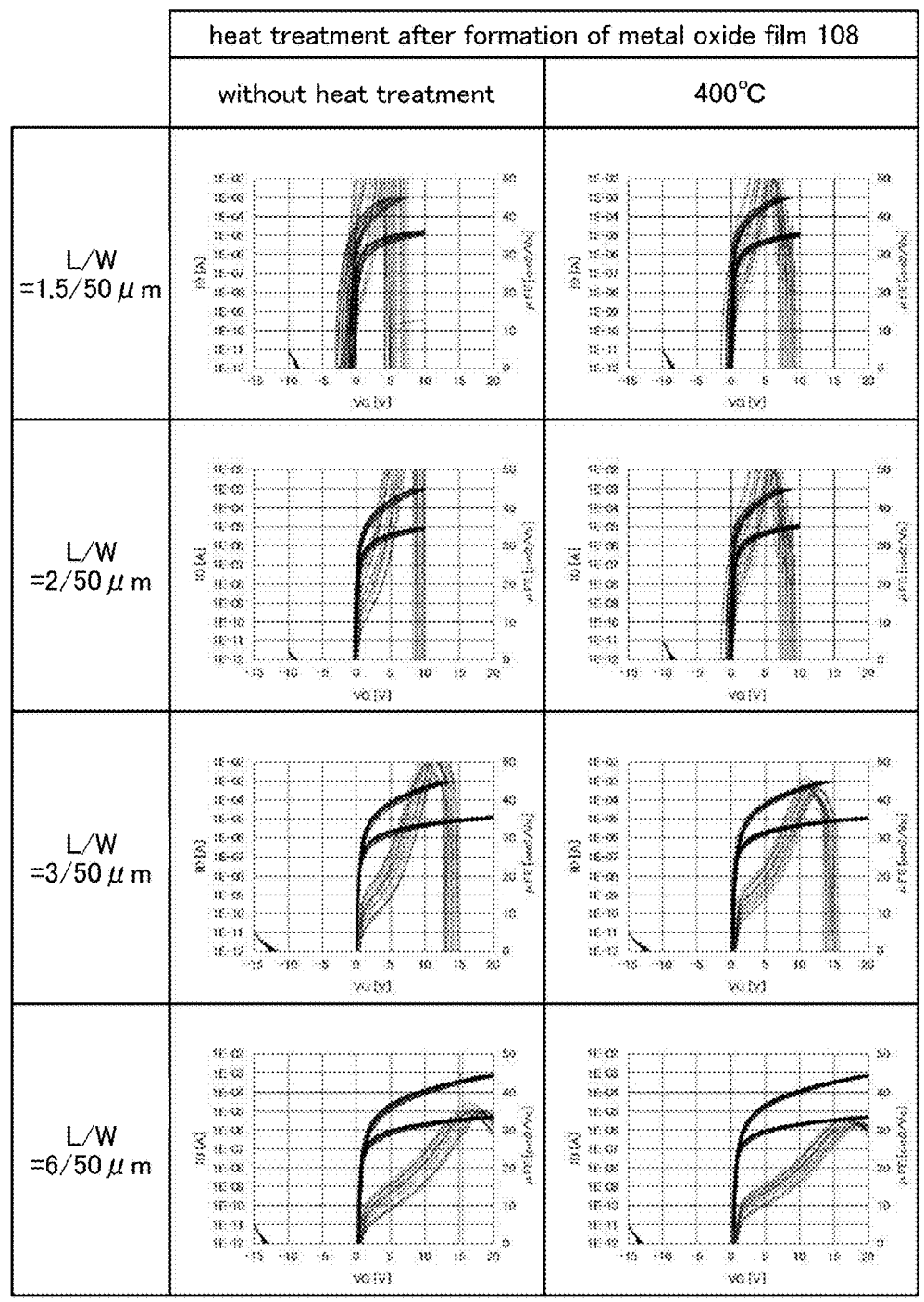
FIG. 28 shows Id-Vg characteristics of transistors.
Figure 29:
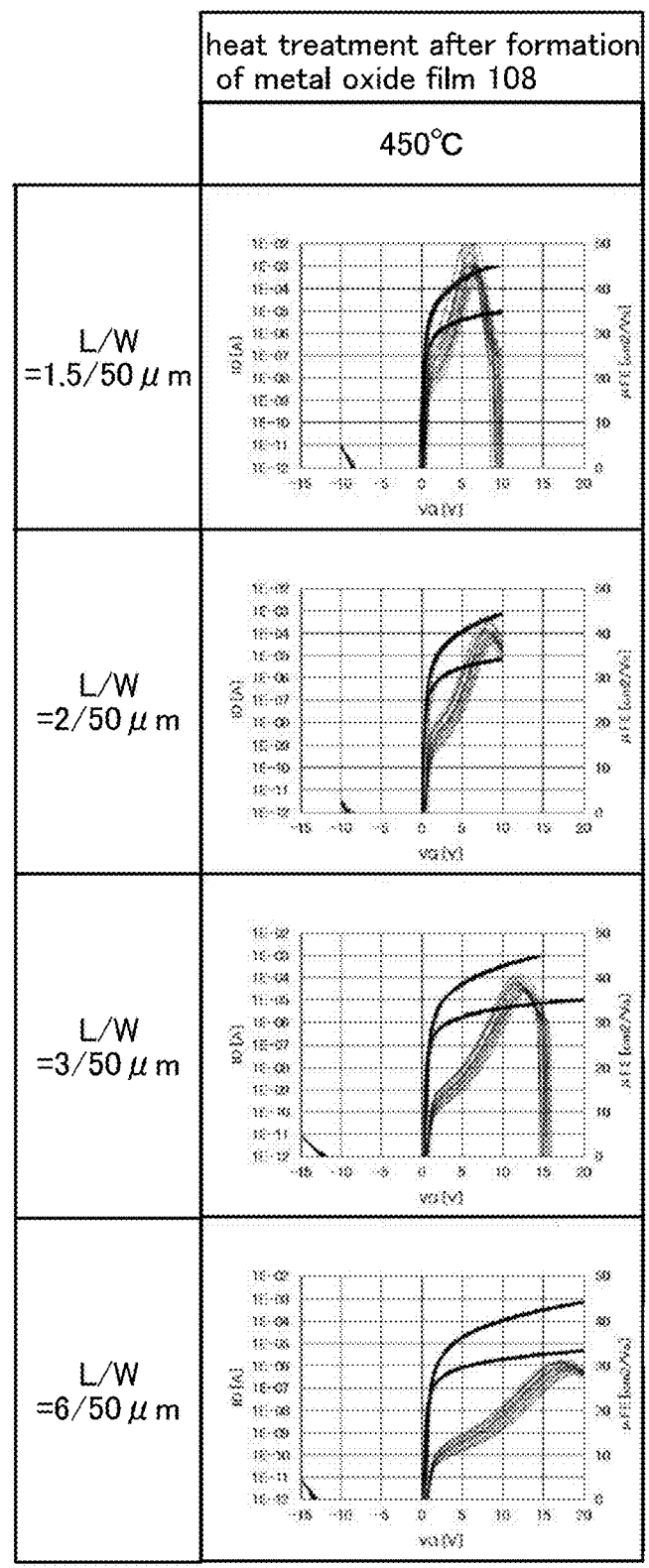
FIG. 29 shows Id-Vg characteristics of transistors.

FIG. 28 and FIG. 29 show the measurement results of the transistors. In each of the measurement results, the horizontal axis represents Vg, one of vertical axes represents the value of a current flowing through the drain (Id) on a logarithmic scale, and the other vertical axis represents μFE. FIG. 28 shows the measurement results of the combination of the four L/W conditions, no heat treatment, and heat treatment at 400° C. FIG. 29 shows the measurement results of the combination of the four L/W conditions and heat treatment at 450° C. Note that the Vg-Id characteristics were obtained when Vd were 0.1 V and 20 V, and μFE was obtained when Vd was 20 V.

It was found from FIG. 28 and FIG. 29 that when heat treatment was performed after the formation of the metal oxide film 108, variation in electrical characteristics particularly of the transistor having a short channel length L was reduced. In addition, the mobility was improved by heat treatment particularly when Vg was small.

Example 3

The relationship between deposition conditions of a metal oxide film and electrical characteristics of the transistor 150 described in the above embodiments was examined. Specifically, transistors were formed under 12 different combinations of three conditions of deposition pressure: 0.3 Pa, 0.6 Pa, and 0.8 Pa, and four conditions of deposition power: 0.5 kW, 1.5 kW, 2.5 kW, and 4.5 kW. For each of the combinations, 20 transistors were formed to measure the Vg-Id characteristics and field effect mobilities (μFE). The backgate potential of the transistor 150 was equal to the gate potential in the measurement of electrical characteristics.

Figure 30:
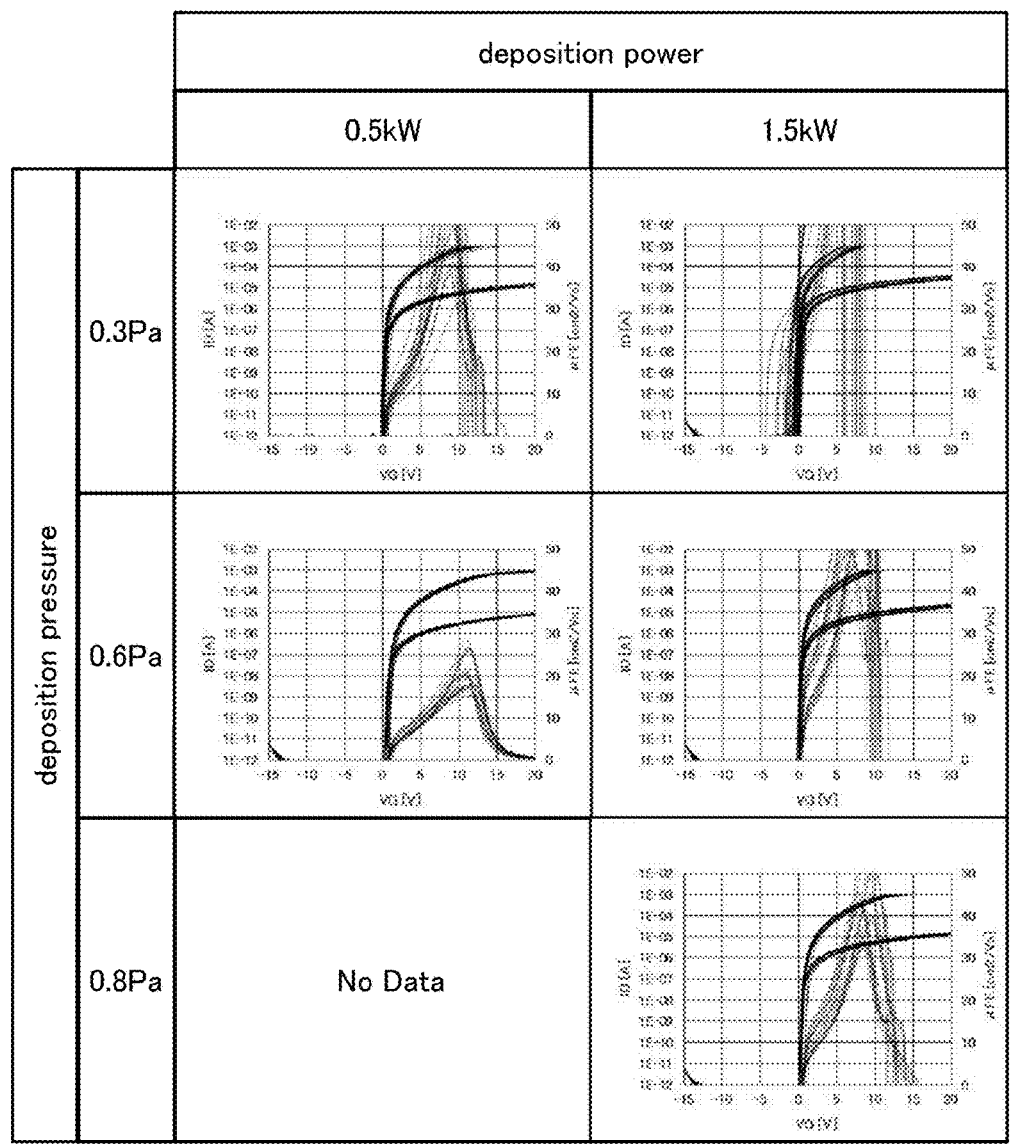
FIG. 30 shows Id-Vg characteristics of transistors.
Figure 31:
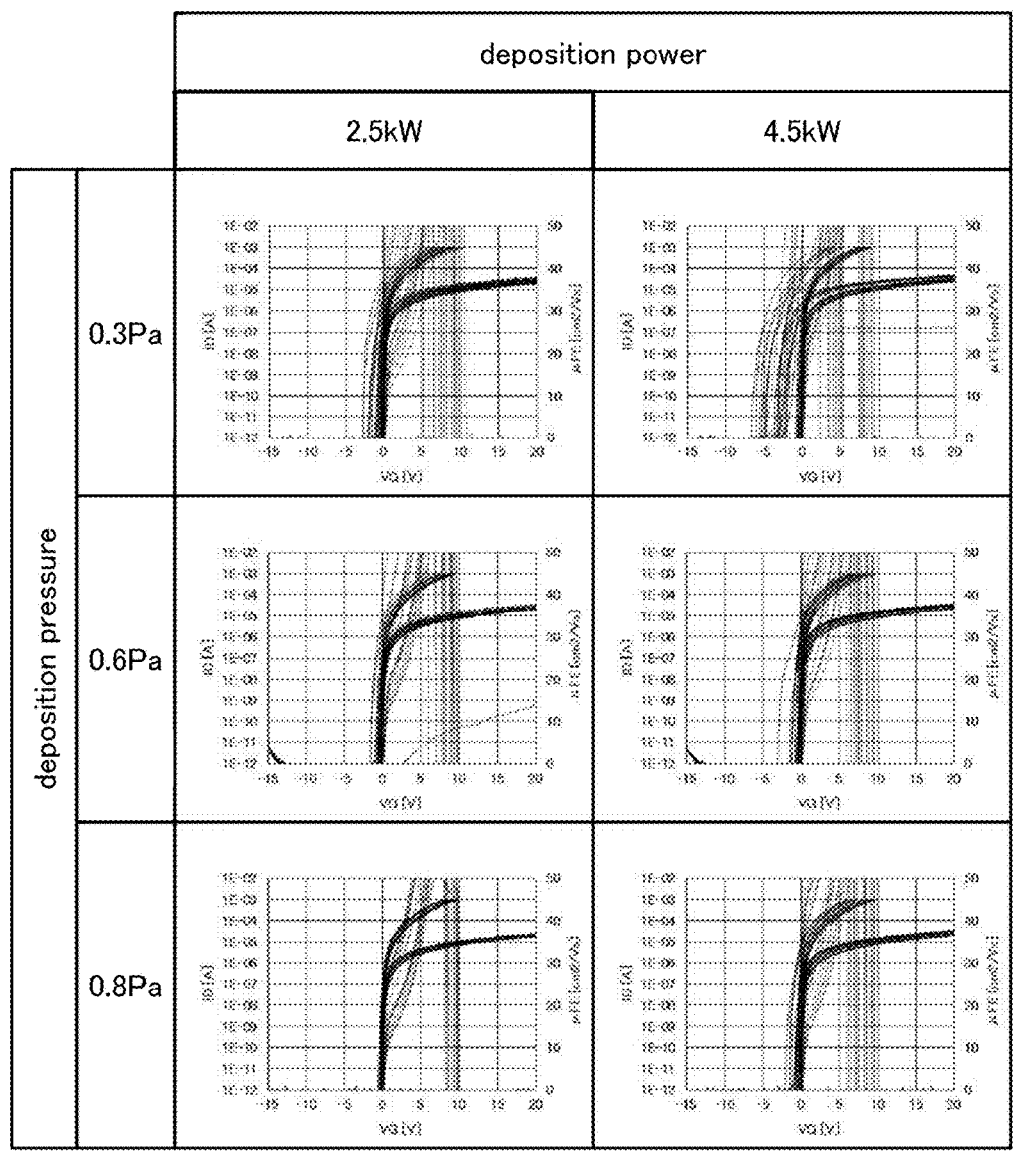
FIG. 31 shows Id-Vg characteristics of transistors.

FIG. 30 and FIG. 31 show the measurement results of the transistors. In each of the measurement results, the horizontal axis represents Vg, one of vertical axes represents the value of a current flowing through the drain (Id) on a logarithmic scale, and the other vertical axis represents μFE. FIG. 30 shows the measurement results of the combination of the three conditions of deposition pressure and the deposition power of 0.5 kW and 1.5 kW. Note that data was not obtained when the deposition pressure and power were 0.8 Pa and 0.5 kW, respectively. FIG. 31 shows the measurement results of the combination of the three conditions of deposition pressure and the deposition power of 2.5 kW and 4.5 kW. Note that the Vg-Id characteristics were obtained when Vd were 0.1 V and 20 V, and μFE was obtained when Vd was 20 V.

It is found from FIG. 30 and FIG. 31 that a significant reduction in μFE was shown when the deposition power was 0.5 kW. In addition, variation in electrical characteristics was reduced when the deposition pressure was high and the deposition power was small, while variation in electrical characteristics was increased when the deposition pressure was low and the deposition power was large.

Example 4

The relationship between formation conditions of the insulating film 110 serving as a second gate insulating film and electrical characteristics of the transistor 150 described in the above embodiments was examined. Specifically, transistors were formed under 9 different combinations of three conditions of channel length L/channel width W: 2/50 μm, 3/50 μm, and 6/50 μm, and three formation conditions of the insulating film 110: reference conditions, comparison conditions A, and comparison conditions B. For each of the combinations, 20 transistors were formed to measure the Vg-Id characteristics and field effect mobilities (μFE). The backgate potential of the transistor was equal to the gate potential in the measurement of electrical characteristics.

In the "reference conditions", the substrate temperature was 350° C., a silane gas at a flow rate of 20 sccm and a dinitrogen monoxide gas at a flow rate of 18000 sccm were supplied as source gases to a deposition chamber of a PECVD apparatus, the pressure in the deposition chamber was controlled to 200 Pa, and the deposition power was 100 W. Note that the deposition rate was 14.3 nm/min.

In the "comparison conditions A", the substrate temperature was 350° C., a silane gas at a flow rate of 100 sccm and a dinitrogen monoxide gas at a flow rate of 18000 sccm were supplied as source gases to a deposition chamber of a PECVD apparatus, the pressure in the deposition chamber was controlled to 200 Pa, and the deposition power was 300 W. Note that the deposition rate was 73.8 nm/min.

In the "comparison conditions B", the substrate temperature was 350° C., a silane gas at a flow rate of 100 sccm and a dinitrogen monoxide gas at a flow rate of 18000 sccm were supplied as source gases to a deposition chamber of a PECVD apparatus, the pressure in the deposition chamber was controlled to 200 Pa, and the deposition power was 500 W. Note that the deposition rate was 78.7 nm/min.

Figure 32:
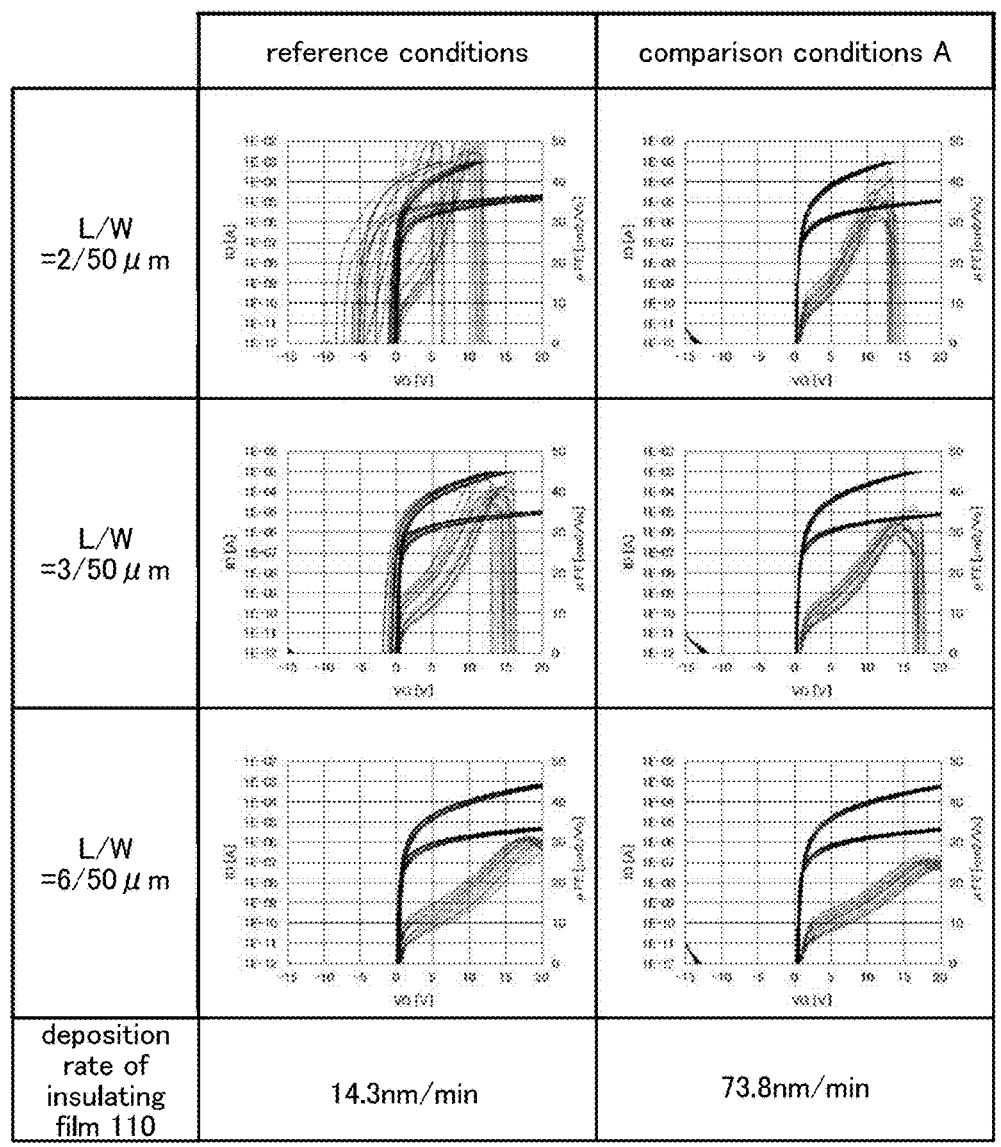
FIG. 32 shows Id-Vg characteristics of transistors.
Figure 33:
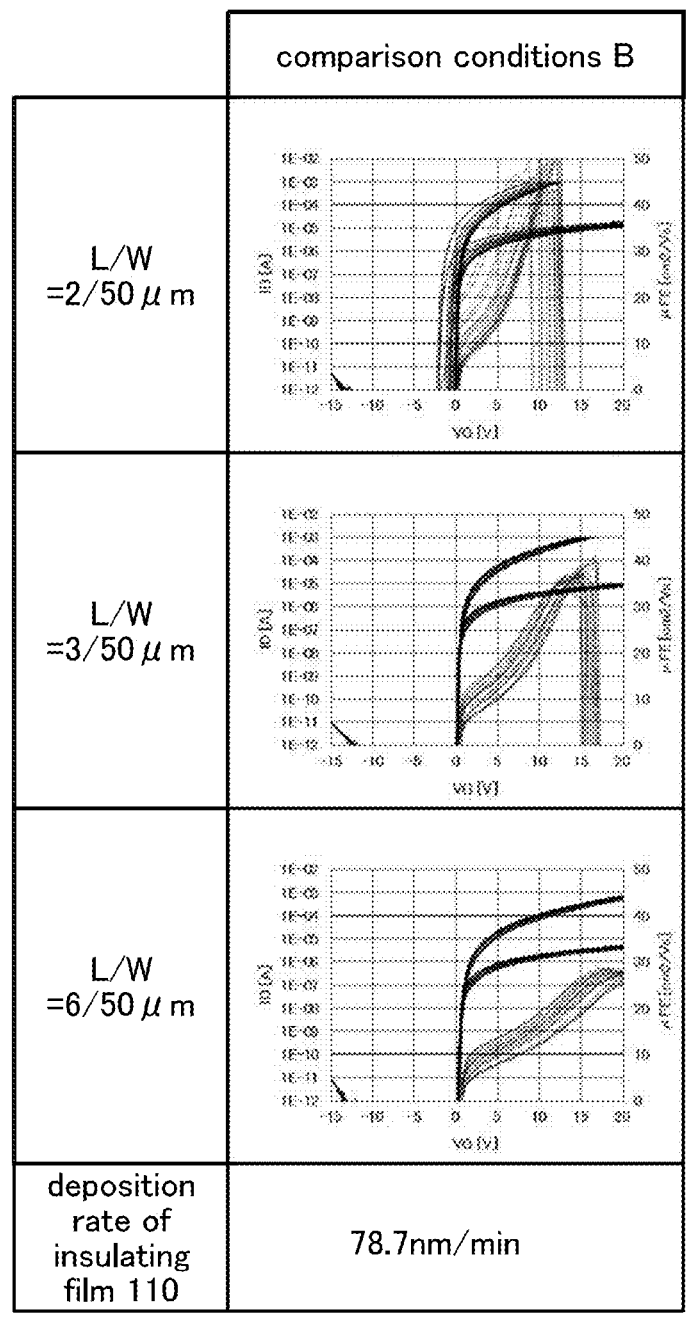
FIG. 33 shows Id-Vg characteristics of transistors.

FIG. 32 and FIG. 33 show the measurement results of the transistors. In each of the measurement results, the horizontal axis represents Vg, one of vertical axes represents the value of a current flowing through the drain (Id) on a logarithmic scale, and the other vertical axis represents μFE. FIG. 32 shows the measurement results of the combination of the three L/W conditions, the reference conditions, and the comparison conditions A. FIG. 33 shows the measurement results of the combination of the three L/W conditions and the comparison conditions B. Note that the Vg-Id characteristics were obtained when Vd were 0.1 V and 20 V, and μFE was obtained when Vd was 20 V.

It is found from FIG. 32 and FIG. 33 that variation in electrical characteristics particularly of transistors having a channel length L of 3 μm or more was reduced under the comparison conditions A and the comparison conditions B. In addition, all of the 20 transistors show normally-off characteristics in which Id is sharply increased after Vg exceeds 0 V. The electrical characteristics of the transistors in which the insulating films 110 were formed under the comparison conditions A and the comparison conditions B were better than those of the transistors in which the insulating films 110 were formed under the reference conditions. Furthermore, the deposition rates in the comparison conditions A and the comparison conditions B are higher than the deposition rate in the reference conditions. Thus, the transistors can be manufactured with improved productivity.

Example 5

In this example, the metal oxide film of one embodiment of the present invention was formed. The film density and in-plane distribution of energy gap of the metal oxide film were evaluated.

<Sample Fabrication>

A glass substrate with a size of 600 mm×720 mm was used. A metal oxide film with a thickness of about 100 nm was formed over the glass substrate by a sputtering method. The metal oxide film was formed under the conditions where a target with an atomic ratio of In:Ga:Zn:=1:1:1 was used, the substrate temperature was 170° C., oxygen and argon were used as a deposition gas, the proportion of oxygen to the total gas flow rate of oxygen and argon was 50%, the pressure was 0.6 Pa, and the power was 2.5 kW.

<Film Density Evaluation>

Figure 34:
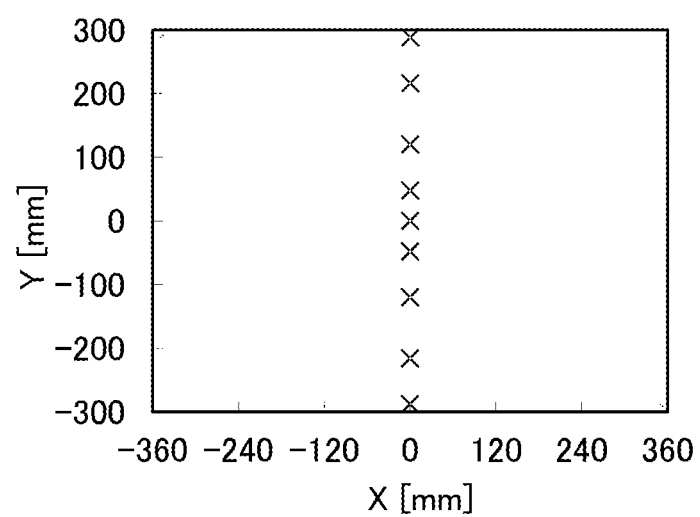
FIG. 34 shows measurement positions of film density.

The film density was obtained by XRR measurement. Measurement points are plotted in FIG. 34. Note that the X-axis and Y-axis in FIG. 34 respectively represent the long-axis direction and short-axis direction in the substrate plane.

Figure 35:
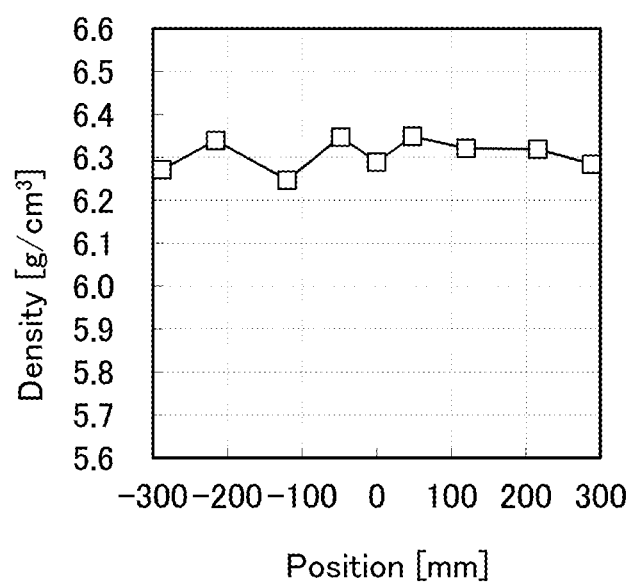
FIG. 35 shows measurement results of film density of a metal oxide film.

FIG. 35 shows the film density obtained by XRR. The horizontal axis represents the coordinate in the Y-axis direction, and the vertical axis represents the film density. The median value of the film density was 6.319 g/cm$^3$. The difference between the maximum and minimum value was 0.1020 g/cm$^3$, and the standard deviation was 0.0362 g/cm$^3$, which show small variation and favorable results.

<Evaluation of Energy Gap>

Figure 36:
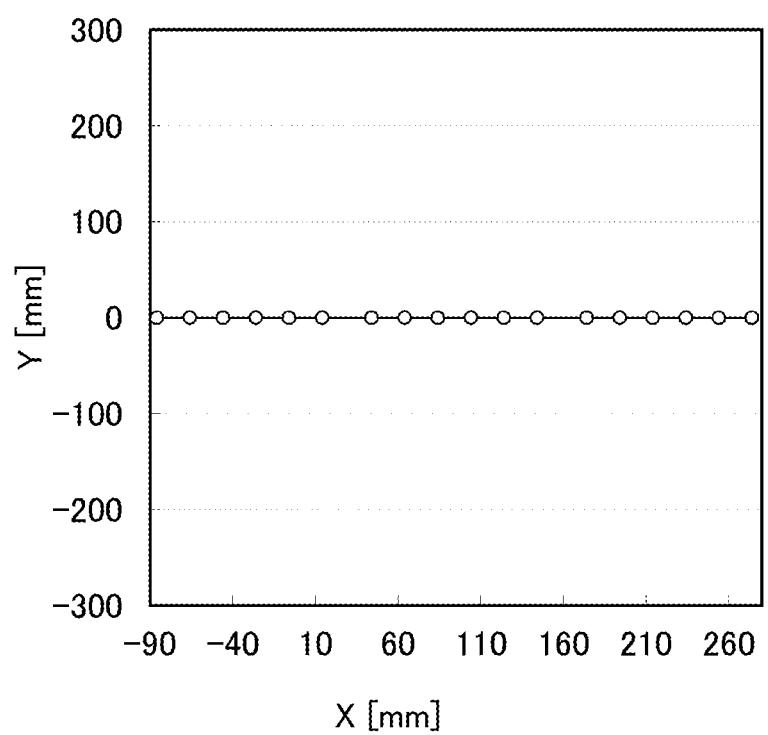
FIG. 36 shows measurement positions energy gap.

Next, the in-plane distribution of energy gap was evaluated. For the evaluation of energy gap, the absorption coefficient α was calculated by transmittance and absorption measurement, and energy gap was calculated from tauc plot assuming the indirect transition. The measurement points are plotted in FIG. 36.

Figure 37:
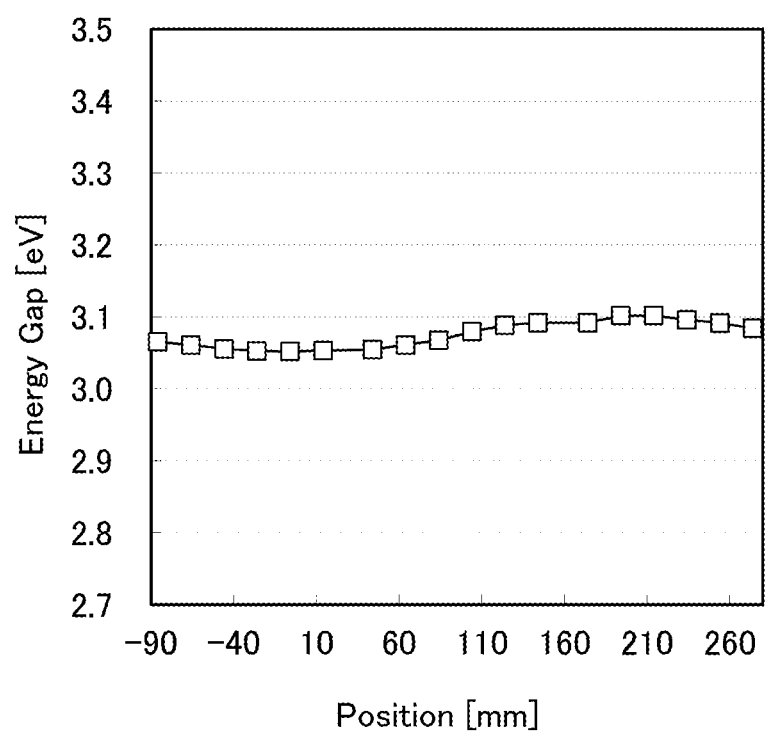
FIG. 37 shows measurement results of energy gap of a metal oxide film.

FIG. 37 shows the obtained energy gap. The median value of the energy gap was 3.07 eV. The difference between the maximum and minimum value was 0.050 eV, and the standard deviation was 0.019 eV, which show small variation and favorable results.

Example 6

Figure 38:
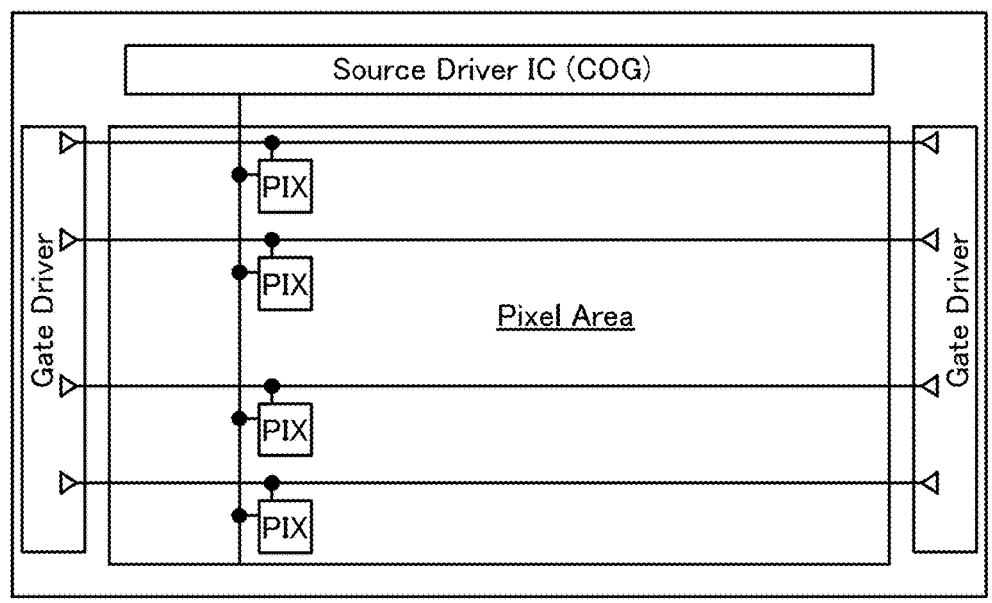
FIG. 38 shows a schematic view of a display device.

In this example, results of simulation for examining feasibility of a large-sized 8K OLED display using the transistor of one embodiment of the present invention are described.
[Examined Model]
FIG. 38 is a schematic view of an examined display device. Table 1 shows specifications of the examined display device. The display device has a 65-inch screen. In FIG. 38, the number of shift register stages in a gate driver is 4320, and one horizontal selection period is 1.92 us when the frame frequency is 120 Hz.

TABLE 1

| Screen Diagonal | 65 inches |
|---|---|
| Driving Method | Active Matrix |
| Number of effective pixels | 7680 × RGBW × 4320 |
| Pixel Pitch | 0.188 mm × 0.188 mm |
| Pixel Density | 135 ppi |
| Pixel Circuit | 2Tr + 1C./pixel |
| Frame rate | 120 Hz |
| Source Driver | IC |
| Gate Driver | Integrated |

Figure 39:
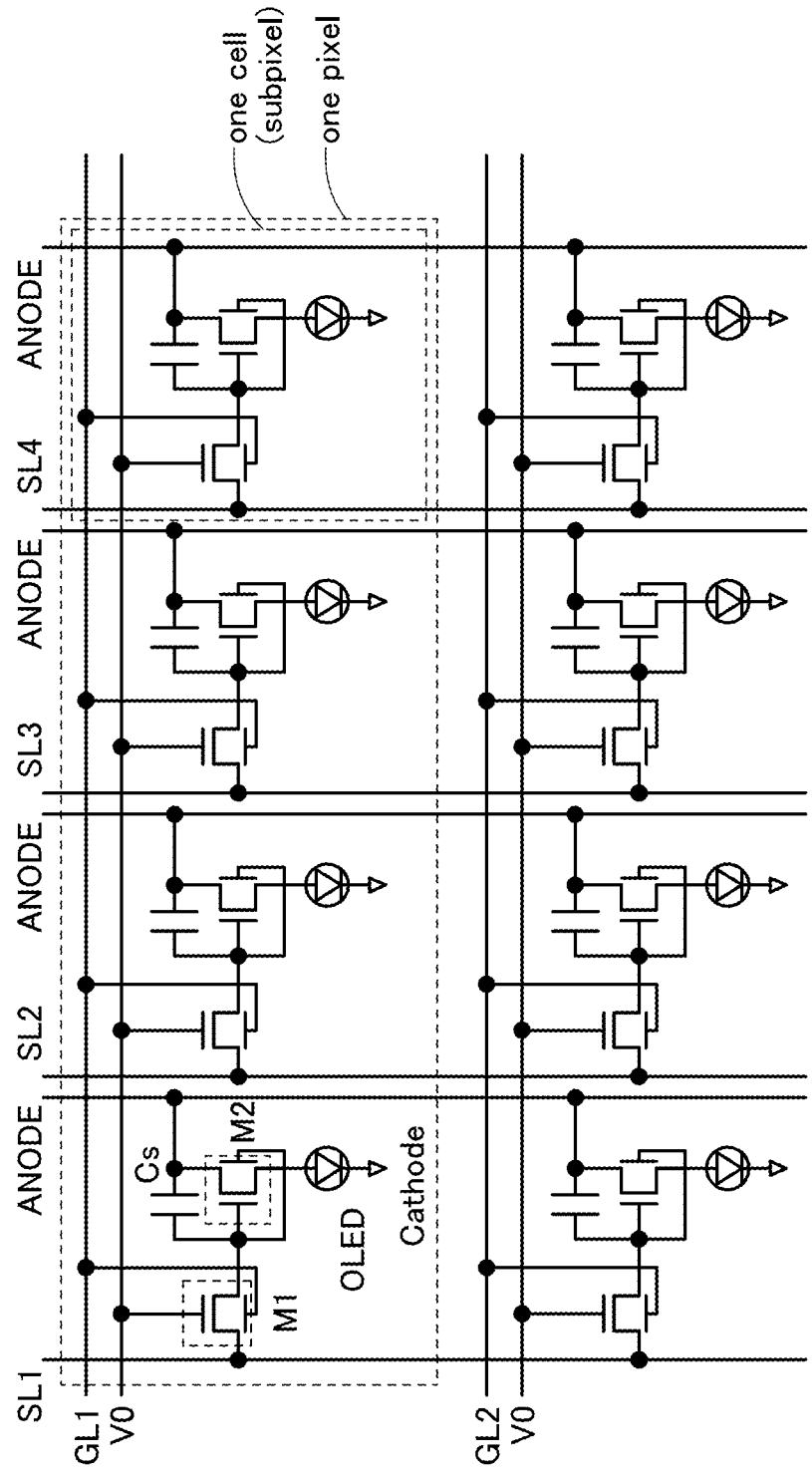
FIG. 39 is a circuit diagram of a pixel of a display device.

FIG. 39 is a circuit diagram of a pixel included in the examined display device. Each pixel has four subpixels of red (R), green (G), blue (B), and white (W). Each subpixel includes a transistor M1, a transistor M2, a capacitor Cs, and a light-emitting element OLED. The transistor M1 serves as a selection transistor. One gate of the transistor M1 is connected to a wiring to which a low potential V0 is supplied, and the other gate is connected to a gate line GL1. A transistor connected to the OLED includes a pair of gates connected to each other. The capacitor Cs is located between a gate of the transistor M2 and an ANODE line.

Figure 40A:
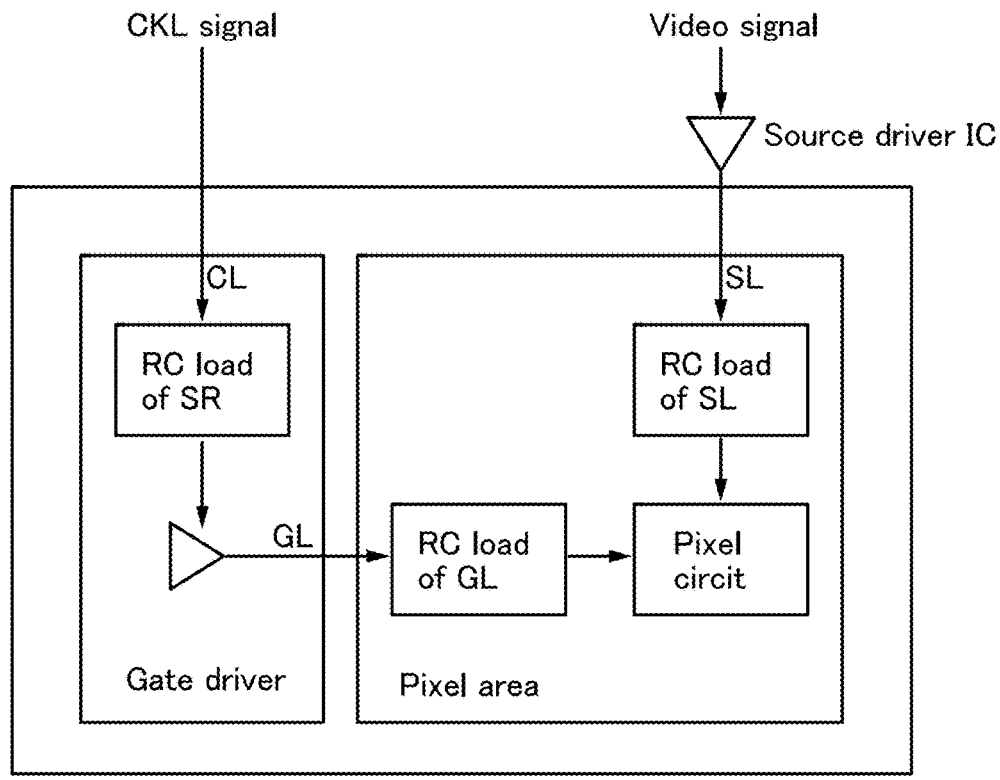
FIGS. 40A and 40B are a model diagram and a timing chart of a structure used for simulation.

FIG. 40A shows a block diagram of a configuration used for the simulation. Model parameters were extracted from transistors of a pixel circuit and a gate driver on the basis of the actual values of a CAC-OS transistor. A behavior model was used for a source driver IC. An RC load model was used for parasitic capacitances of the gate line and the source line in a pixel area and for a parasitic component of a CLK line in the gate driver. The parasitic capacitances and parasitic resistance were extracted by a boundary element method. The time required for writing video signals was simulated for the pixel that had the highest RC load in the pixel area.

Figure 40B:
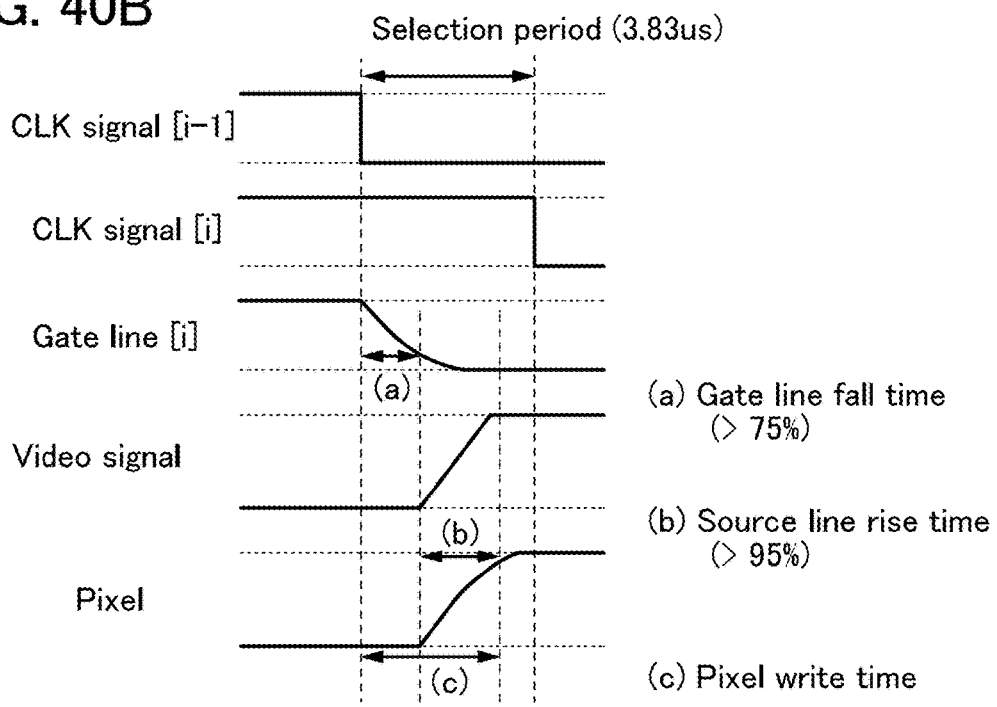

A timing chart for pixel writing is presented in FIG. 40B. A video signal is changed while a selection FET in a preceding row is off, thereby allowing the video signal to be written into the pixel. In other words, the total time between inputting a CLK signal to the gate driver and turning off the selection FET (the gate line fall time (a) in FIG. 40B) and the time required for the pixel potential to be equal to the changing video signal (the source line rise time (b) in FIG. 40B) corresponds to the time required for writing the video signal into the pixel ((c) in FIG. 40B). The time required for pixel writing was calculated from the total time of the gate line fall time where the amplitude falls to 75% of the target amplitude and the source line rise time where the voltage is raised to 95% of the target voltage. If the time required for pixel writing is shorter than the one horizontal selection period (1.92 μs, here), the display device operates correctly.

The calculation here was performed on two transistors with different structures. One is a transistor having a structure shown in FIG. 5 and other drawings (hereinafter referred to as TGSA type), and the other is a bottom-gate channel-etched transistor including a backgate (hereinafter referred to as CE type).
[Calculation Results]
First, the relationship between the transistor structure and parasitic capacitance is described. While the parasitic capacitance of the gate line was 326 pF in the CE type, it was reduced in the TGSA type, 284 pF. This means that the thickness of an insulating film between a source line and a gate line can be large in the TGSA type and thus the parasitic capacitance can be reduced.

Table 2 shows the calculation results of the gate line fall time and the source line rise time.

TABLE 2

| | CE type | TGSA type |
|---|---|---|
| Gate line fall time | 1.47 μs | 0.72 μs |
| Source line rize time | 1.13 μs | 1.09 μs |
| Total time | 2.60 μs | 1.81 μs |
| Operation judgment | Incorrect | Correct |

If the total time of the gate line fall time and the source line rise time is shorter than 1.92 μs, which is one horizontal selection period, the display device operates correctly. As shown in Table 2, the time required for pixel writing in the TGSA transistor was shorter than one horizontal selection period, and the display device operated correctly.

Figure 41:
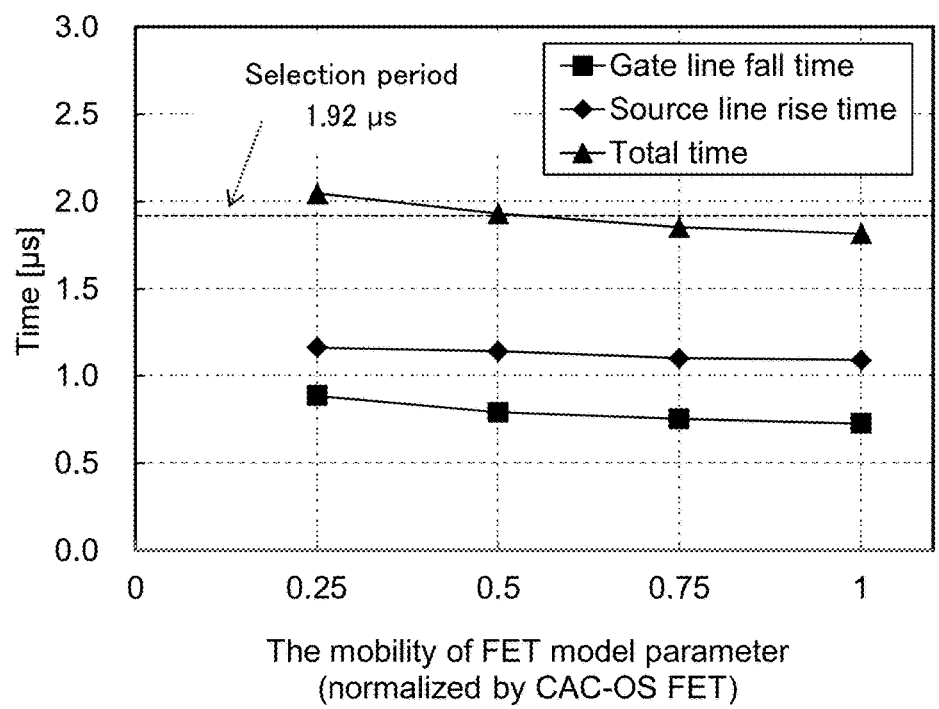
FIG. 41 shows simulation results of field-effect mobility and write time.

FIG. 41 shows calculation results of the relationship between the field effect mobility of a transistor and the time required for pixel writing. The vertical axis represents the time required for pixel writing. The horizontal axis represents the field effect mobility when the field effect mobility of the CAC-OS transistor is 1. As the field effect mobility decreases, the time required for pixel writing becomes longer. With the use of the CAC-OS transistor, the OLED display having a high resolution of 8K and a large size of 65 inch operated correctly at a high frame rate of 120 Hz.

This application is based on Japanese Patent Application serial No. 2016-152814 filed with Japan Patent Office on Aug. 3, 2016, Japanese Patent Application serial No. 2016-161213 filed with Japan Patent Office on Aug. 19, 2016, and Japanese Patent Application serial No. 2016-233419 filed with Japan Patent Office on Nov. 30, 2016, the entire contents of which are hereby incorporated by reference.

What is claimed is:
1. A manufacturing method of a semiconductor device comprising:
a first step of forming a first insulating film over a substrate;
a second step of transferring the substrate in an atmospheric atmosphere;
a third step of heating the first insulating film;
a fourth step of forming a metal oxide film over the first insulating film;
a fifth step of forming a second insulating film over the metal oxide film;
a sixth step of forming a metal oxide conductive film over and in contact with the second insulating film by sputtering method under an atmosphere containing oxygen gas; and
a seventh step of forming a gate electrode by etching the metal oxide conductive film, wherein oxygen is added to the second insulating film in the sixth step, and wherein the third step and the fourth step are successively performed in an atmosphere where water vapor partial pressure is lower than water vapor partial pressure in the atmospheric air.

2. The manufacturing method of a semiconductor device, according to claim 1, wherein the third step is performed at a temperature higher than or equal to 100° C. and lower than or equal to 500° C. and for a process time longer than or equal to 1 minute and shorter than or equal to 120 minutes.

3. The manufacturing method of a semiconductor device, according to claim 1, wherein the third step is performed with a pressure greater than or equal to $1\times10^{-7}$ Pa and less than or equal to $1\times10^{-3}$ Pa.

4. The manufacturing method of a semiconductor device, according to claim 1, wherein the metal oxide film is formed by a sputtering method.

5. The manufacturing method of a semiconductor device, according to claim 1, wherein a formation temperature of the metal oxide film is higher than or equal to room temperature and lower than or equal to 200° C.

6. The manufacturing method of a semiconductor device, according to claim 1, wherein a formation temperature of the metal oxide film is a temperature that is not increased by intentional heating.

7. The manufacturing method of a semiconductor device, according to claim 1, wherein the metal oxide film is formed using an In-M-Zn oxide target, and wherein the M is any one of Ga, Al, Y, and Sn.

8. The manufacturing method of a semiconductor device, according to claim 7, wherein an atomic ratio of the In, the M, and the Zn is 4:2:4.1 or a neighborhood of 4:2:4.1.

9. The manufacturing method of a semiconductor device, according to claim 7, wherein an atomic ratio of the In, the M, and the Zn is 5:1:7 or a neighborhood of 5:1:7.

10. A manufacturing method of a semiconductor device comprising:

a first step of forming a first insulating film over a substrate;

a second step of transferring the substrate in an atmospheric atmosphere;

a third step of heating the first insulating film;

a fourth step of forming a metal oxide film over the first insulating film;

a fifth step of forming a second insulating film over the metal oxide film;

a sixth step of forming a metal oxide conductive film over and in contact with the second insulating film by sputtering method under an atmosphere containing oxygen gas; and a seventh step of forming a gate electrode by etching the metal oxide conductive film; and an eighth step of forming a third insulating film over the metal oxide film, the second insulating film and the gate electrode, wherein oxygen is added to the second insulating film in the sixth step, wherein the third insulating film is in contact with part of the metal oxide film, wherein the third insulating film contains nitrogen and hydrogen and in contact with part of the metal oxide film, and wherein the third step and the fourth step are successively performed in an atmosphere where water vapor partial pressure is lower than water vapor partial pressure in the atmospheric air.

11. The manufacturing method of a semiconductor device, according to claim 10, wherein an electrode is formed over the substrate before the first step, and wherein the gate electrode overlaps with the electrode.

12. The manufacturing method of a semiconductor device, according to claim 10, further comprising:

a ninth step of forming a source electrode and a drain electrode which are electrically connected to the metal oxide film over the third insulating film.

13. The manufacturing method of a semiconductor device, according to claim 10, wherein the third step is performed at a temperature higher than or equal to 100° C. and lower than or equal to 500° C. and for a process time longer than or equal to 1 minute and shorter than or equal to 120 minutes.

14. The manufacturing method of a semiconductor device, according to claim 10, wherein the third step is performed with a pressure greater than or equal to $1\times10^{-7}$ Pa and less than or equal to $1\times10^{-3}$ Pa.

15. The manufacturing method of a semiconductor device, according to claim 10, wherein the metal oxide film is formed by a sputtering method.

16. The manufacturing method of a semiconductor device, according to claim 10, wherein a formation temperature of the metal oxide film is higher than or equal to room temperature and lower than or equal to 200° C.

17. The manufacturing method of a semiconductor device, according to claim 10, wherein a formation temperature of the metal oxide film is a temperature that is not increased by intentional heating.

18. The manufacturing method of a semiconductor device, according to claim 10, wherein the metal oxide film is formed using an In-M-Zn oxide target, and wherein the M is any one of Ga, Al, Y, and Sn.

19. The manufacturing method of a semiconductor device, according to claim 18, wherein an atomic ratio of the In, the M, and the Zn is 4:2:4.1 or a neighborhood of 4:2:4.1.

20. The manufacturing method of a semiconductor device, according to claim 18, wherein an atomic ratio of the In, the M, and the Zn is 5:1:7 or a neighborhood of 5:1:7.

* * * * *